United States Patent [19]
Edel

[11] Patent Number: 6,160,697
[45] Date of Patent: Dec. 12, 2000

[54] METHOD AND APPARATUS FOR MAGNETIZING AND DEMAGNETIZING CURRENT TRANSFORMERS AND MAGNETIC BODIES

[76] Inventor: Thomas G. Edel, 9232 N. Tyler Ave., Portland, Oreg. 97203-2356

[21] Appl. No.: 09/541,403

[22] Filed: Mar. 31, 2000

Related U.S. Application Data

[63] Continuation-in-part of application No. 09/257,221, Feb. 25, 1999, abandoned.

[51] Int. Cl.[7] .................................................. H01H 47/00
[52] U.S. Cl. ......................... 361/143; 361/146; 361/149; 361/267
[58] Field of Search .................................... 361/143, 146, 361/149, 267, 268, 93.5, 93.6; 323/355–358

[56] References Cited

U.S. PATENT DOCUMENTS

| | | |
|---|---|---|
| Re. 28,851 | 6/1976 | Milkovic . |
| 3,701,008 | 10/1972 | Kusters et al. ............................ 324/726 |
| 3,772,617 | 11/1973 | Ciesielka .................................... 333/18 |
| 3,859,573 | 1/1975 | Siems et al. .............................. 361/149 |
| 3,943,435 | 3/1976 | DeJarnette ................................ 323/359 |
| 4,007,414 | 2/1977 | Shima et al. .............................. 323/357 |
| 4,176,386 | 11/1979 | Chow . |
| 4,384,313 | 5/1983 | Steingroever et al. . |
| 4,471,403 | 9/1984 | Dress et al. . |
| 4,969,081 | 11/1990 | Shekhawat et al. . |
| 5,032,947 | 7/1991 | Li et al. .................................... 361/143 |
| 5,598,315 | 1/1997 | Phillips . |
| 5,896,027 | 4/1999 | So et al. .................................. 323/357 |
| 6,028,422 | 2/2000 | Preusse . |

Primary Examiner—Michael J. Sherry

[57] ABSTRACT

A method and apparatus for establishing and maintaining a preferred induction level in a magnetic body. A varying voltage is applied to a conductive winding (61) that magnetically interacts with a magnetic body (60). The voltage is controlled during a first phase in such a way that the magnetic induction level of the magnetic body is changed from an unknown induction level to a known induction level. During a second phase, the induced voltage across the winding is controlled so that the induction level is changed from the known induction level to the preferred induction level. An optional third phase may be utilized, during which the average value of induced voltage is kept near zero in order to keep the induction level near the preferred induction level. The invention is especially applicable to ordinary current transformers, which may be demagnetized automatically while remaining in service. Once demagnetized, ordinary current transformers are able to accurately sense non-symmetrical currents, including d-c currents and a-c currents that have d-c components. A demagnetizing mode, during which the current transformer is demagnetized, and a current-sensing mode, during which current transformer secondary current is sensed, are usually utilized sequentially. For a-c power system applications, a current transformer demagnetizing circuit may include an adjustable impedance with a suitable control circuit. A controllable electric energy source may also be used as part of a current transformer demagnetizing circuit, in which case an ordinary current transformer may used to sense d-c current as well as a-c current, and the preferred embodiment has the advantage of being able to reduce the burden of the entire secondary circuit to near zero ohms for increased current-sensing accuracy.

62 Claims, 23 Drawing Sheets

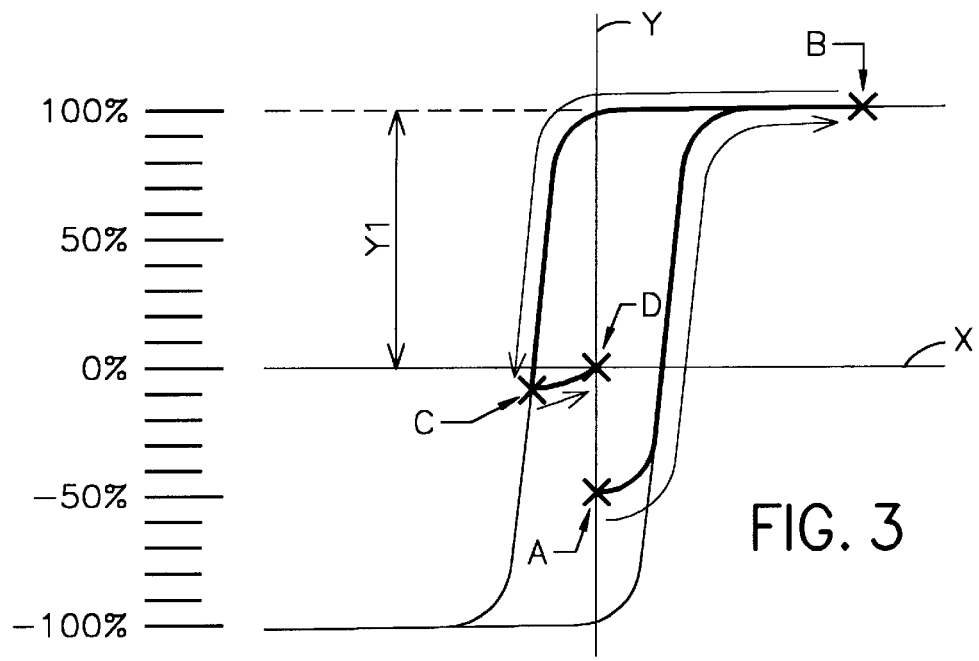
FIG. 3
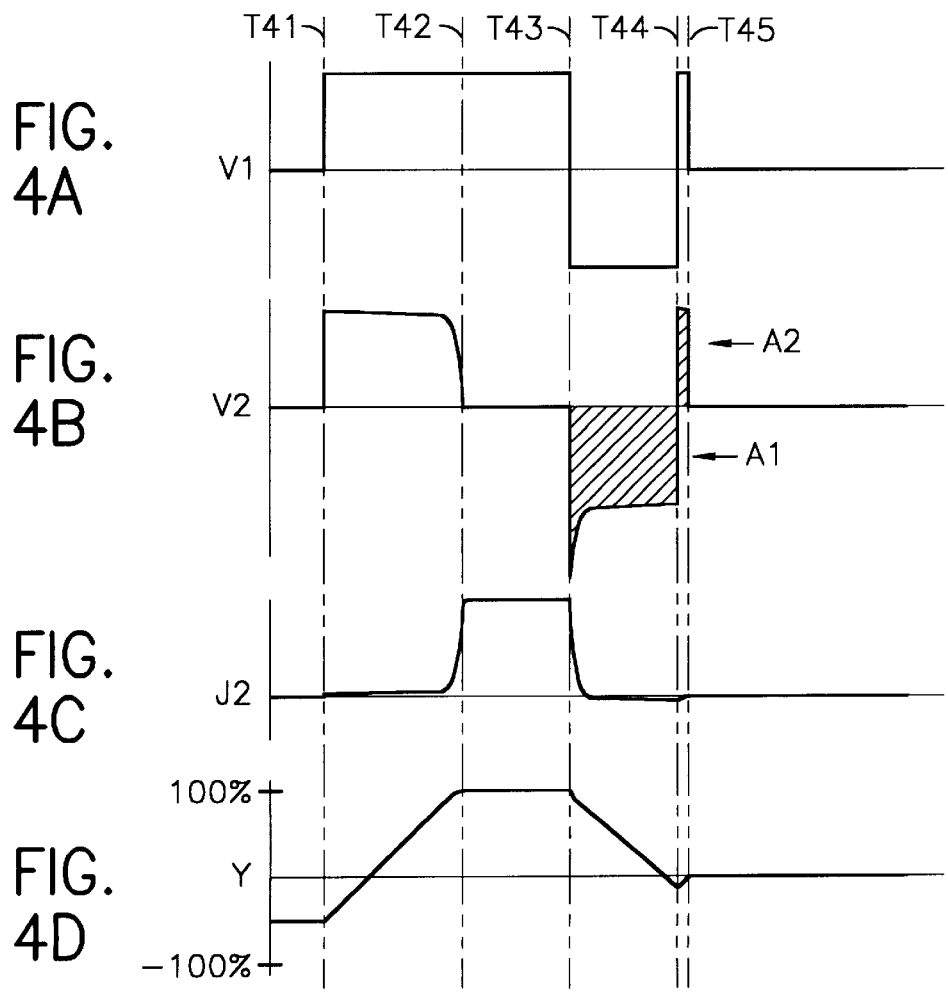
FIG. 4A
FIG. 4B
FIG. 4C
FIG. 4D

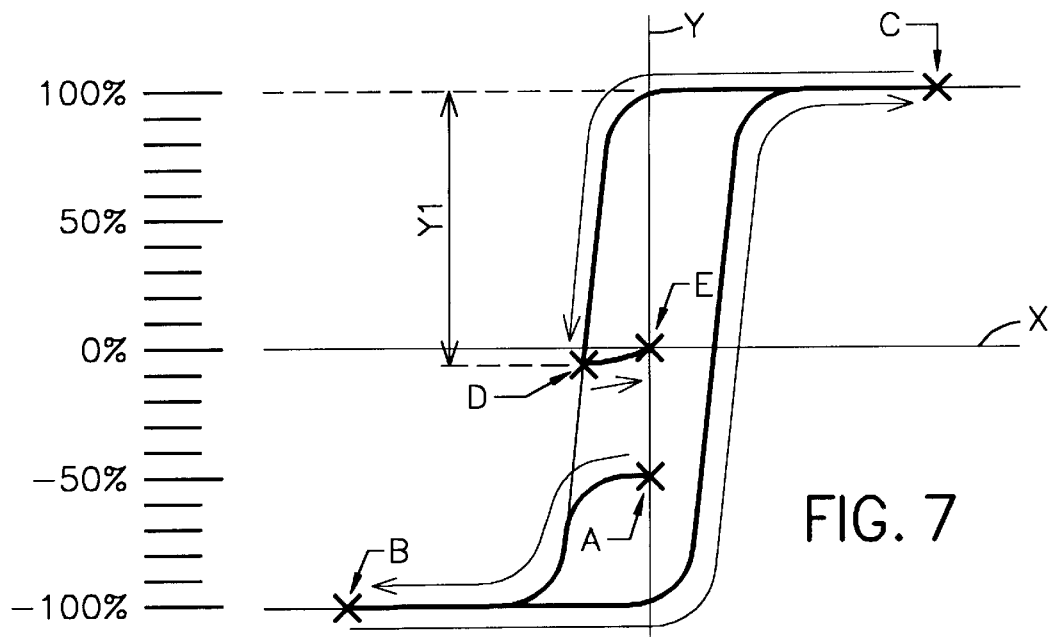
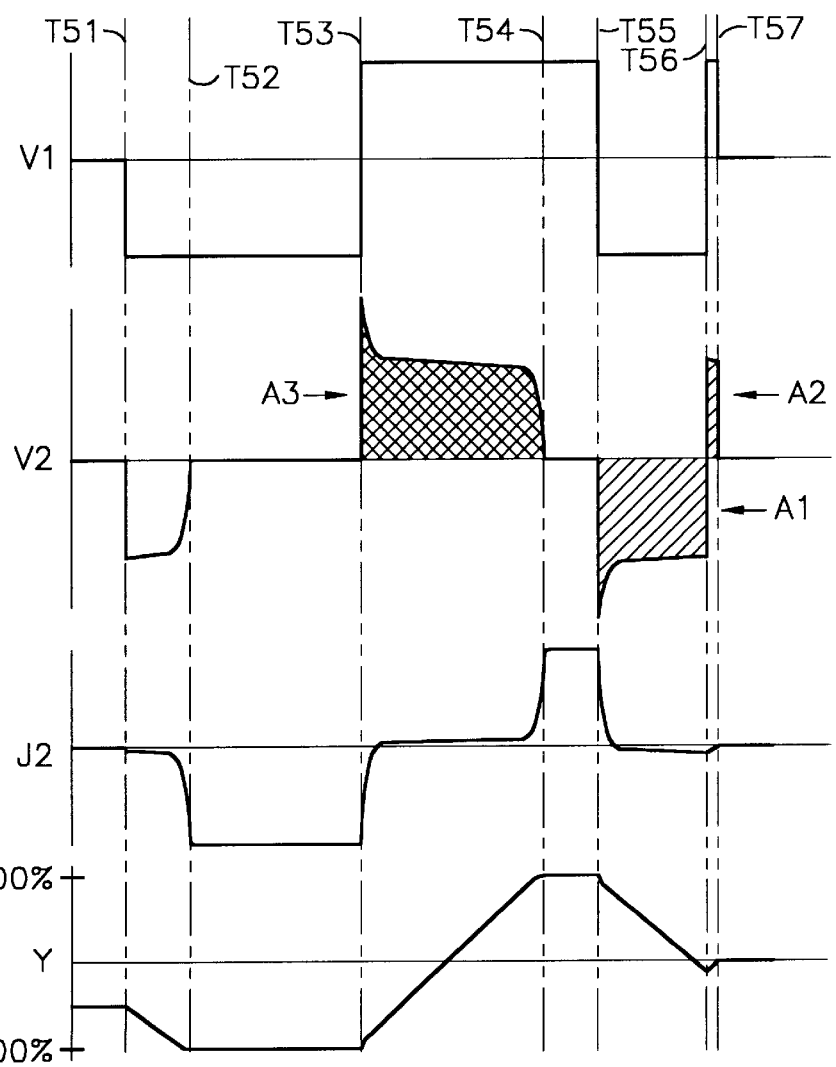

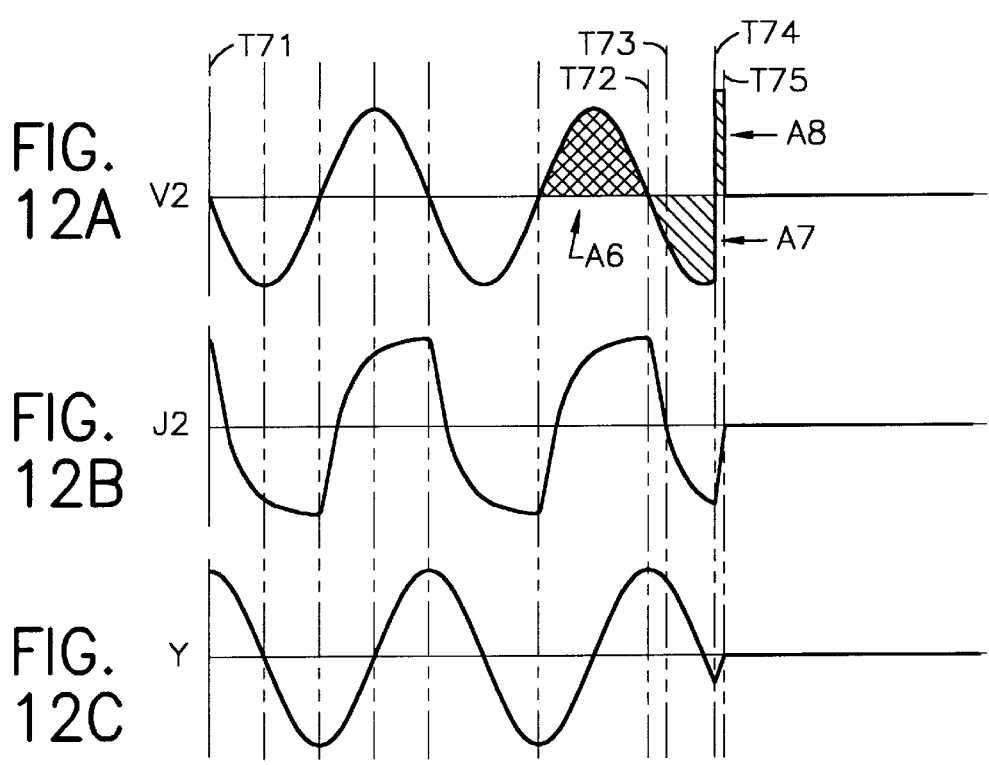
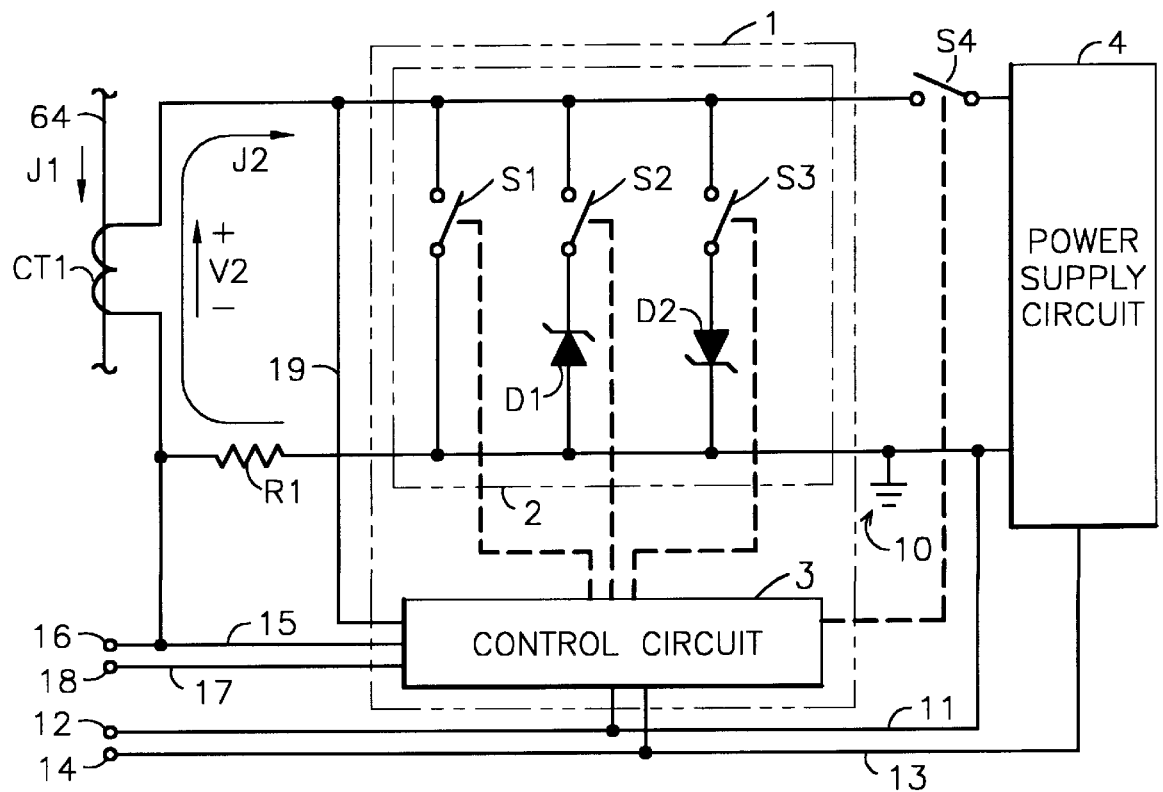

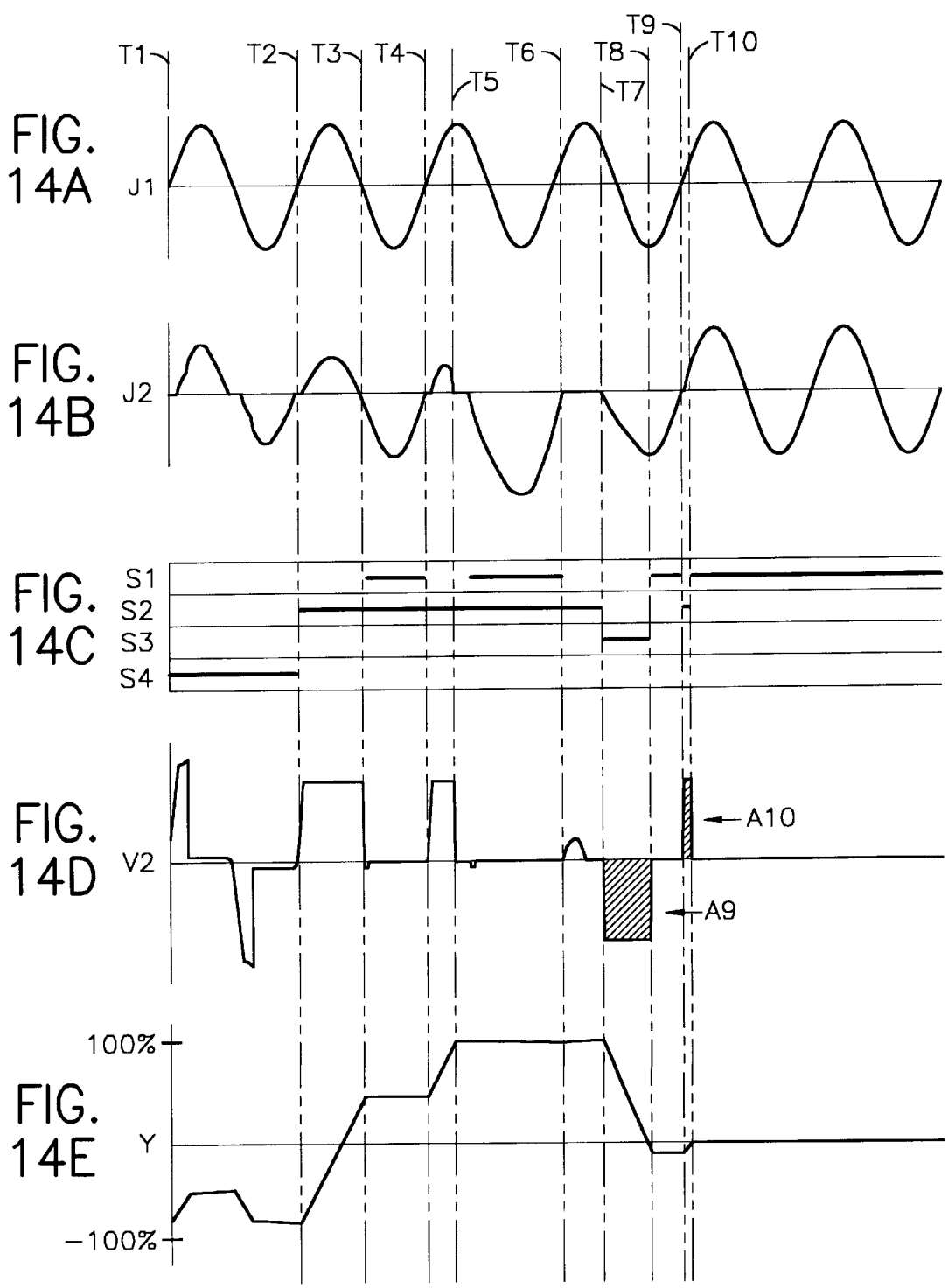

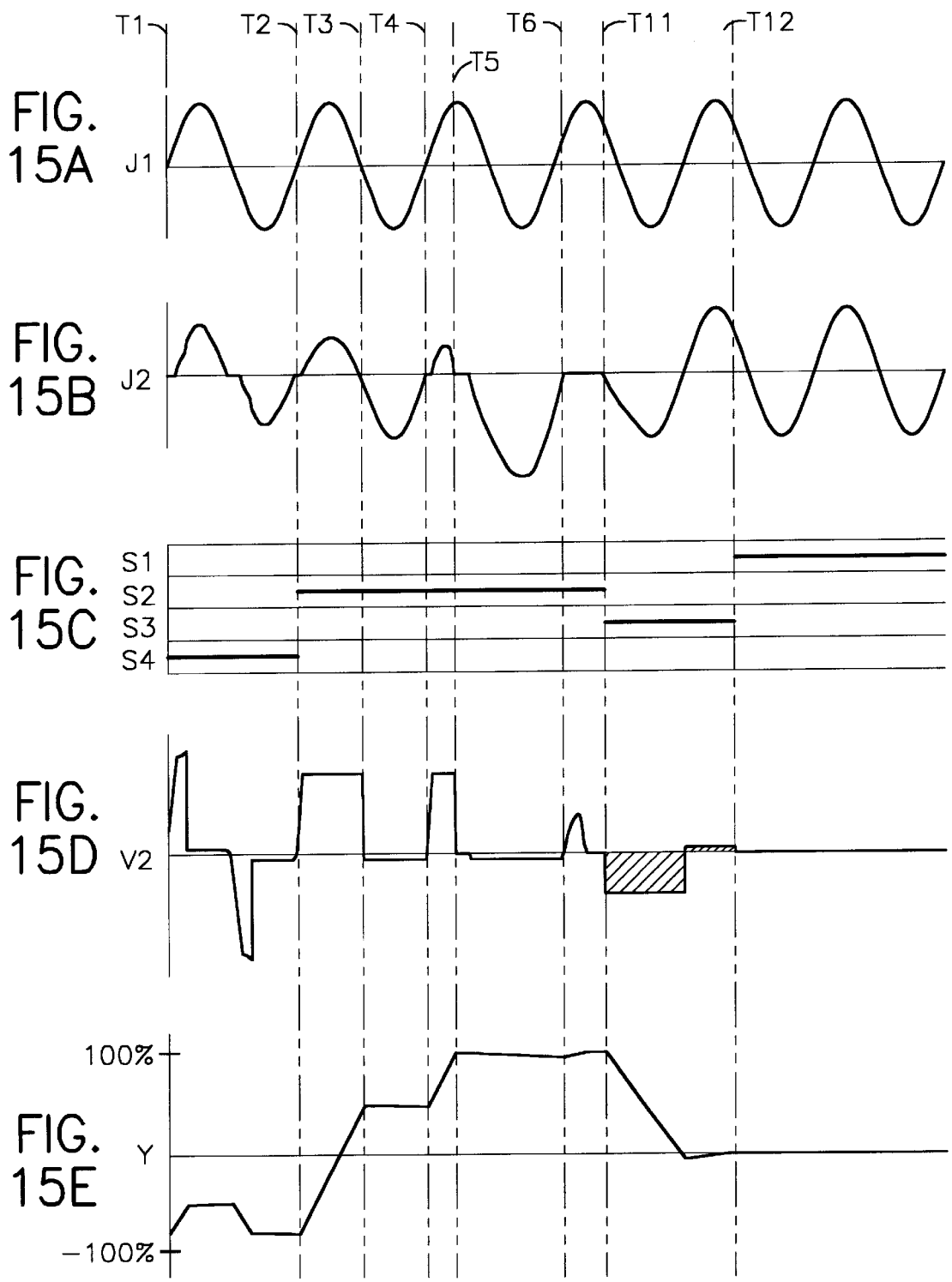

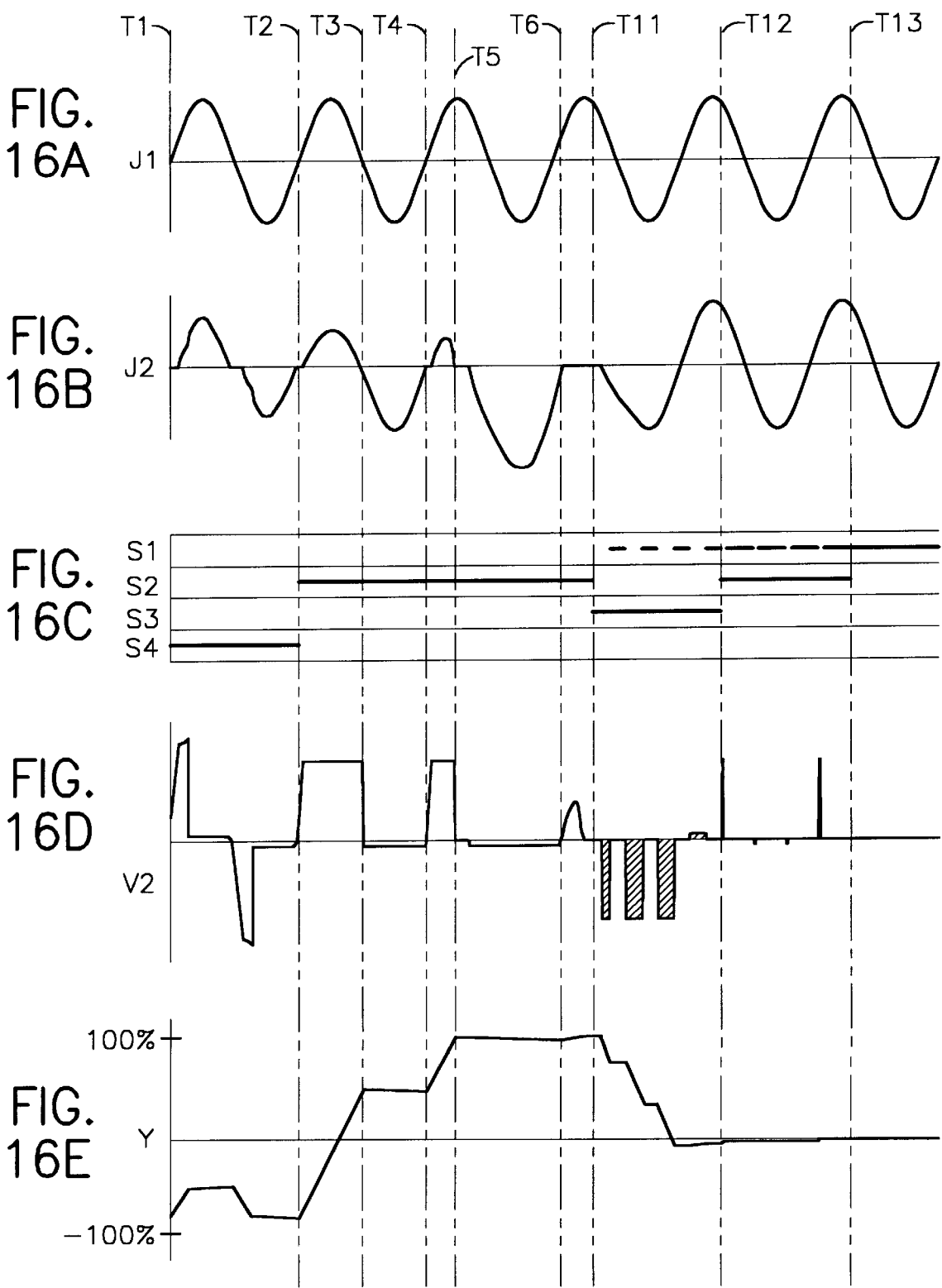

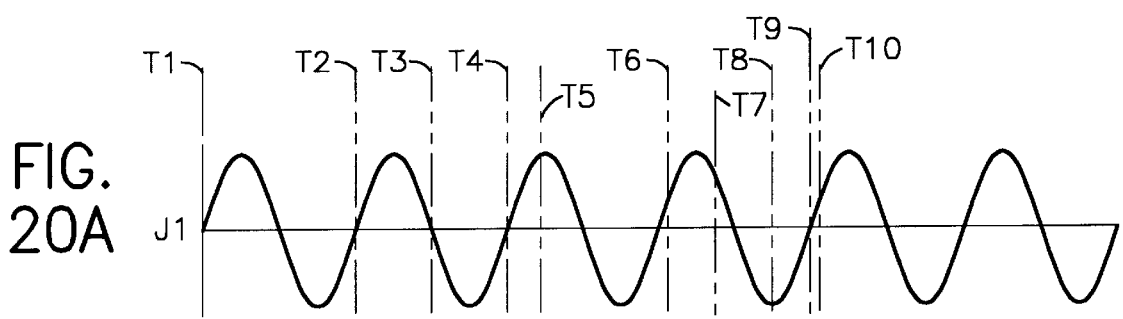
FIG. 20A J1
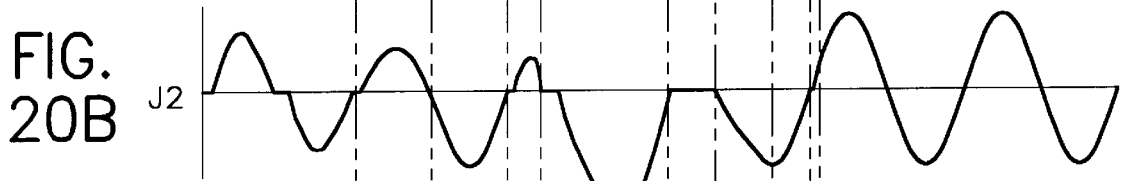
FIG. 20B J2
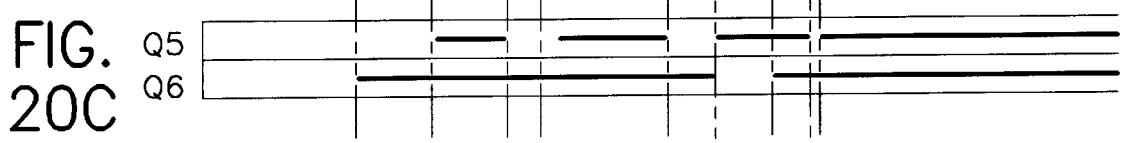
FIG. 20C Q5 Q6
FIG. 20D V2

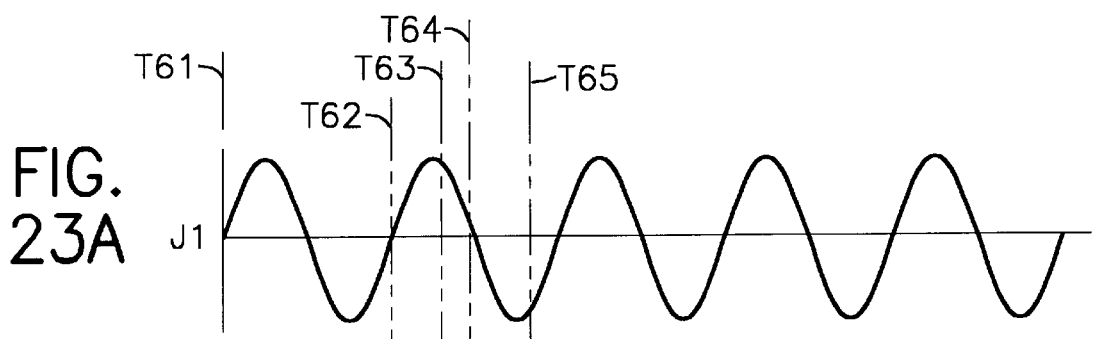
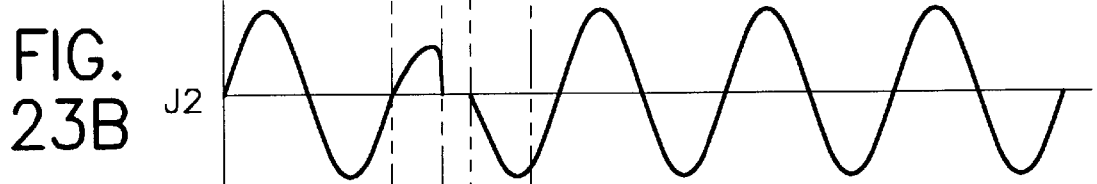
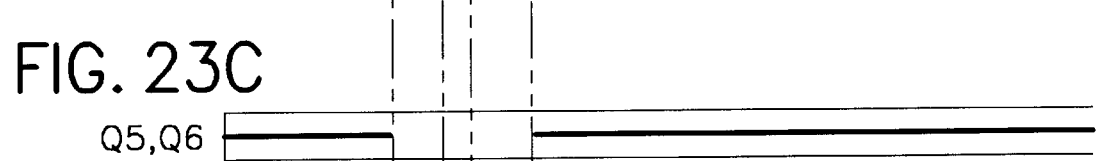
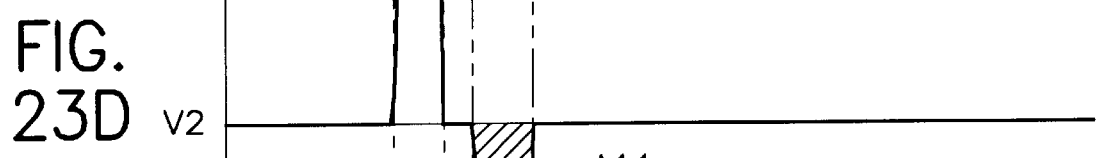
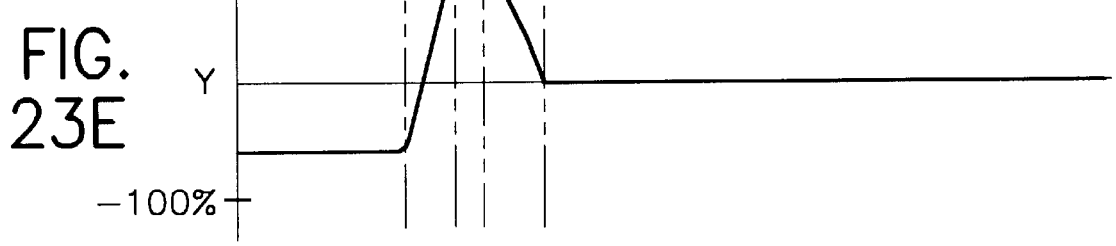

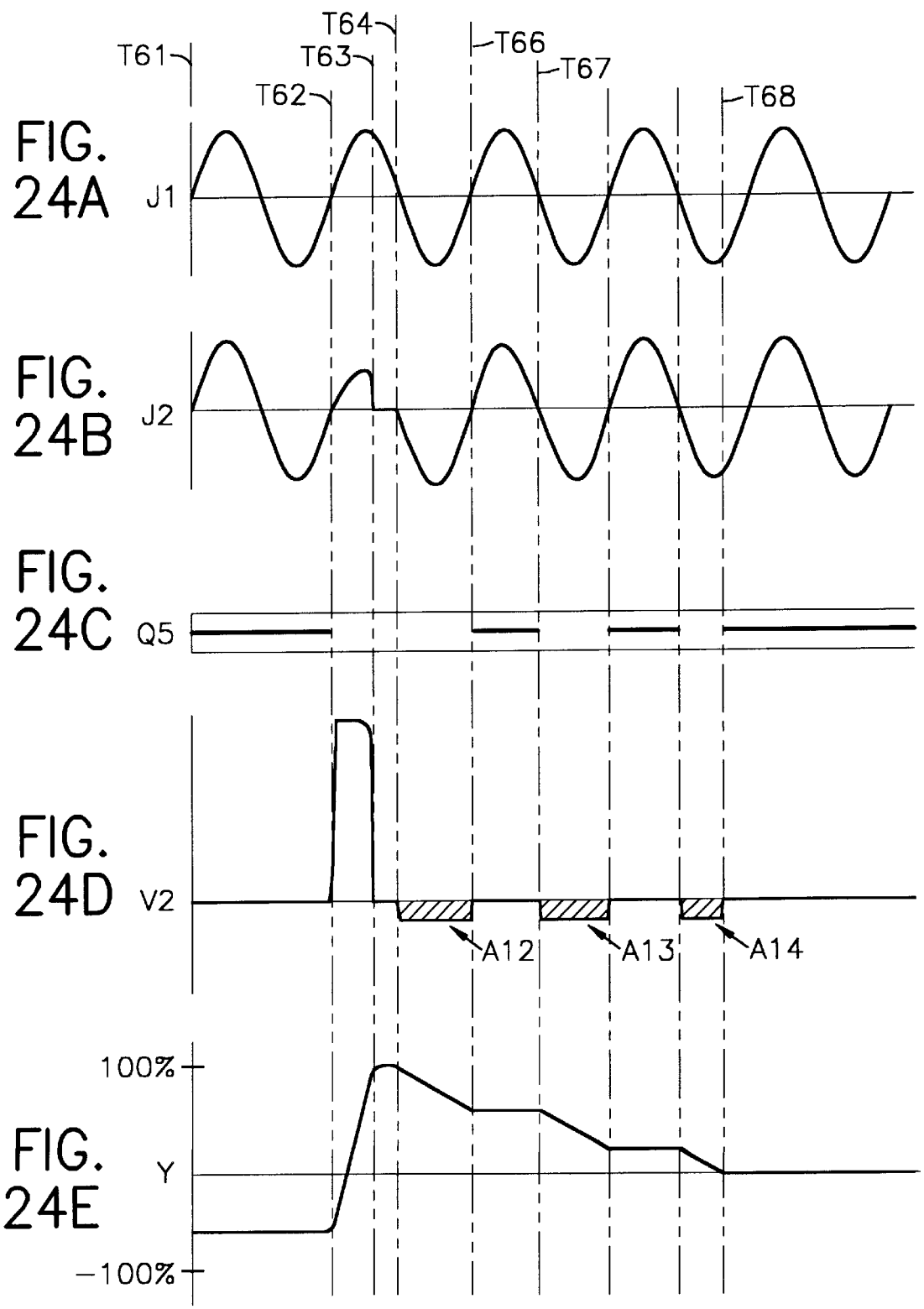

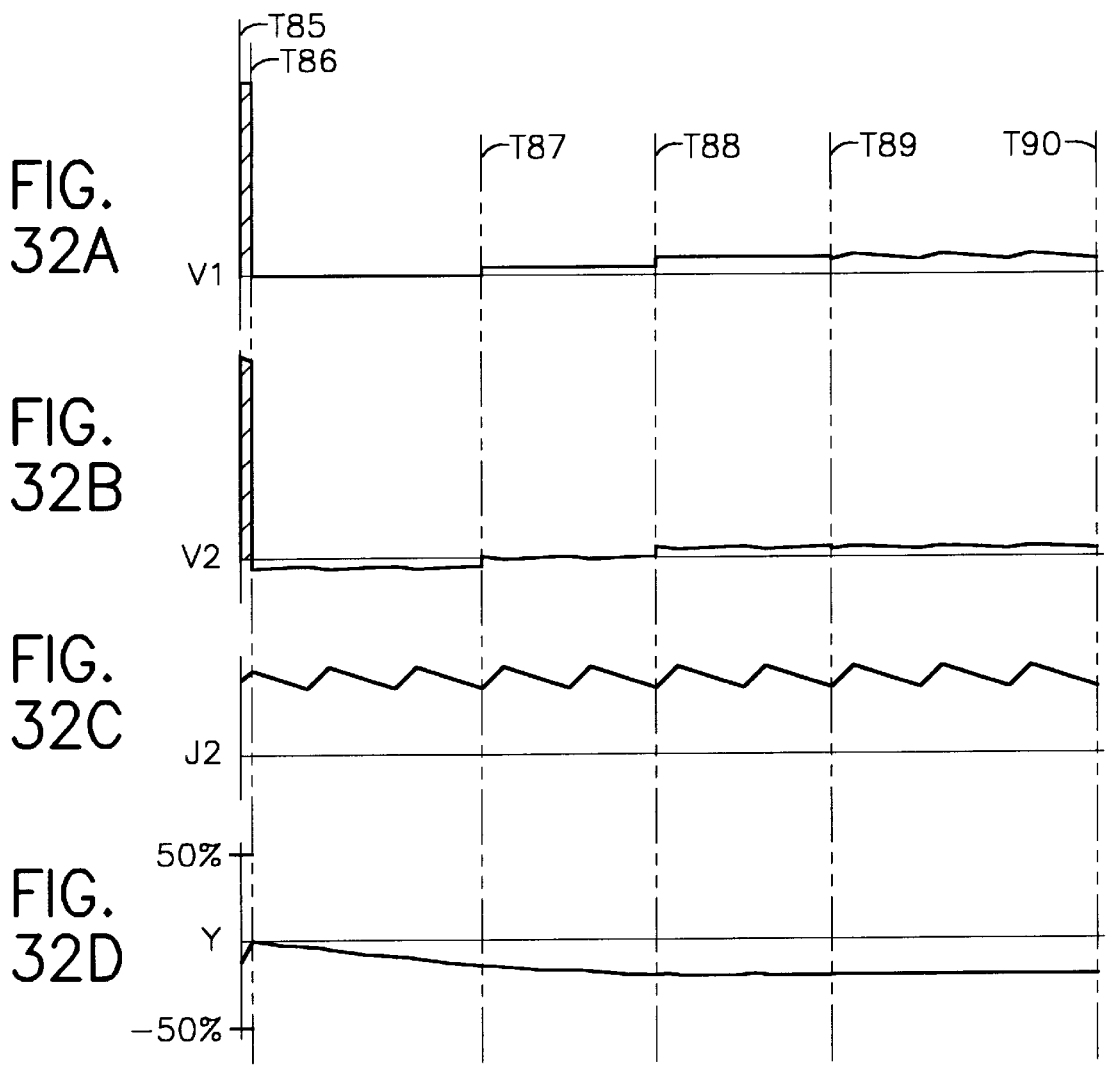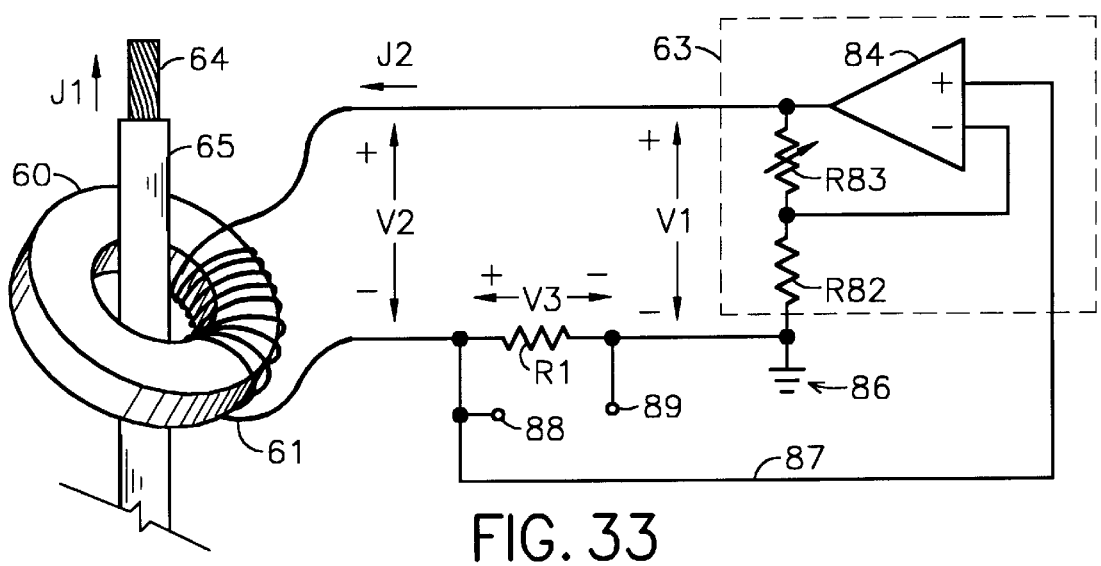

METHOD AND APPARATUS FOR MAGNETIZING AND DEMAGNETIZING CURRENT TRANSFORMERS AND MAGNETIC BODIES

CROSS-REFERENCE TO RELATED APPLICATIONS

This is a continuation-in-part of application Ser. No. 09/257,221, filed Feb. 25, 1999, now abandoned.

This invention is also related to the Self-Powered Current Monitor disclosed in U.S. Pat. No. 6,018,700 to Thomas G. Edel, published Jan. 25, 2000. More particularly, this invention may be incorporated into the Self-Powered Current Monitor, but this invention is not limited to that particular application.

BACKGROUND OF THE INVENTION

This invention relates to the art of magnetizing and demagnetizing magnetic bodies, including the art of demagnetizing current transformer cores utilized to monitor electric current. The invention is particularly suitable for demagnetizing a current transformer while the current transformer remains in service. It will be appreciated, however, that the invention has broader applications and can be advantageously employed in other environments and applications.

Throughout this disclosure, the term "magnetic body" is used in a general sense to refer to a mass of magnetic material. The term "magnetic material" refers to material that has a relative permeability significantly greater than a value of one. The term "magnetic core" or simply "core" is intended to refer to a magnetic body that is in a particular spatial relationship to one or more current-carrying conductors. The term "induction level" is intended to be synonymous with magnetic flux density, and corresponds to how strongly the magnetic body is magnetized.

The concept of "demagnetizing" a magnetized body has been around almost as long as the concept of magnetism itself. Most prior-art demagnetizing methods (that effectively reduce the induction level of a magnetic body to near zero) utilize a declining alternating magnetic field. The alternating magnetic field is usually produced by some form of conductive winding conducting a declining alternating current. Many different embodiments of this method are well established in the prior art.

The present invention is especially directed to how current transformers may be demagnetized while remaining in service, as the prior art does not address this problem very well.

Most current monitoring systems for a-c (alternating-current) electric power systems utilize current transformers to provide input currents that are isolated from the electric power system conductors. A primary winding of a current transformer is connected in series with a current-carrying conductor while a secondary winding is magnetically coupled to the primary winding by a suitable magnetic core. A current is induced in the secondary winding that is proportional to the primary current. The secondary current is isolated from the primary current and is smaller than the primary current by the turns ratio of the primary and secondary windings. The primary winding frequently consists of only one turn, which is often just the current-carrying conductor installed through an opening in the middle of the current transformer magnetic core. The secondary winding usually consists of multiple turns wrapped around the magnetic core.

The accuracy of a current transformer is usually related to the coercive force of the magnetic core material (less is better), the cross sectional area of the magnetic core (bigger is better), the effective magnetic length of the magnetic core (shorter is better), any air gap in the magnetic core (less or none is better), and the "squareness" of the magnetic core material hysteresis curve (squarer is usually preferred if not operating near saturation, otherwise non-square characteristics may be preferred). In the case of high-quality current transformers with very little air gap (usually tape-wound construction, not split-core construction), acceptable accuracy is often achieved as long as operation near saturation is avoided. Split-core current transformer cores generally have hysteresis curves that are less square than standard current transformer cores due to the small air gaps inherent in the design of split-core current transformers.

In order for the secondary current generated by a current transformer to be an accurate representation of the primary current, the impedance of the circuit connected to the secondary winding must be kept low so that current can flow freely. The impedance of the secondary circuit is often called the "burden." In order for a current transformer to drive a secondary current through a non-zero burden, a voltage must be induced in the secondary winding. The induced voltage is proportional to secondary current and proportional to the burden, in accordance with Ohm's law. The induced voltage is induced in the secondary winding by a changing induction level in the magnetic core. As long as the burden is relatively low, and currents are symmetrical, the secondary current is approximately proportional to the primary current. It is well known that burdens of relatively high impedance adversely affect the accuracy of the secondary current.

The accuracy of the secondary current may also be adversely affected by either of the following:

(a) A primary current that is not symmetrical. "Symmetrical" is intended to mean that the waveform has positive and negative half-cycles with the same waveform and magnitude. An alternating current that has a d-c (direct-current) component is a common example of a primary current that is not symmetrical. Also, transient a-c fault currents are often not symmetrical. D-c currents are, by definition, not symmetrical.

(b) A burden that is not a linear impedance. Nonlinear burdens are common in applications that derive power from the secondary current.

In either of these cases, the current transformer core may become magnetized. This magnetization may cause significant error in the secondary current. This error may include distortion of the secondary current, including the loss of any d-c component that is present in the primary current.

To overcome these problems relating to current transformer magnetization, some current-sensing systems utilize "Hall-effect" principles to sense core magnetization and keep the core demagnetized while generating a signal that is proportional to the primary current. Hall-effect current-sensing systems can usually monitor a-c and d-c currents with reasonable accuracy, but their accuracy generally deteriorates with time. The magnetic cores of many Hall-effect current-sensing systems may also require periodic demagnetizing to maintain accuracy. Hall-effect current-sensing systems also require separate sources of control power and are generally more expensive than current-sensing systems that use ordinary current transformers.

Some prior art "demagnetizing" methods or current transformer "reset" circuits actually provide only movement away from one end of the hysteresis curve saturation level, with little regard as to whether or not the current transformer actually ends up at an induction level near zero. One of the main objects of the present invention is to provide a demagnetizing means that truly leaves the magnetic core at an induction level near zero, for best possible accuracy and operation.

Some patents that relate to demagnetizing of magnetic bodies and current transformer magnetizing problems will be briefly discussed.

Reissued U.S. Pat. No. Re. 28,851 to Milkovic (reissued 1976) discloses a "Current Transformer with Active Load Termination." This current-sensing configuration utilizes an operational amplifier to produce an output voltage from an input current with almost no burden being imposed on the current source by the current-sensing load. The use of an active load is similar to some embodiments of the present invention.

U.S. Pat. No. 4,384,313 to Steingroever, et al (1983) discloses a "Process for Demagnetizing Components by Alternating Magnetic Fields of Varying Intensity." This patent is an example of prior art methods that utilize a decaying alternating field to demagnetize a magnetic body. This patent claims an improved way to generate a decaying alternating field.

U.S. Pat. No. 4,471,403 to Dress, et al, (1984) discloses a "Biasing and Fast Degaussing Circuit for Magnetic Materials." This patent is another example of prior art methods that utilize a decaying alternating field to demagnetize a magnetic body. This patent claims a circuit configuration that quickly demagnetizes a magnetic core immediately upon completion of a d-c biasing current. The d-c biasing current provides magnetization of the core for various applications.

U.S. Pat. No. 4,176,386 to Chow (1979) discloses an "Overcurrent Relay" that is said to simultaneously derive power from an input current and derive an accurate information signal from the same input current. The input circuit is said to provide a "constant impedance" burden on the current transformer to minimize distortion of the input current. The "constant impedance" helps to avoid current transformer magnetization problems.

U.S. Pat. No. 4,969,081 to Shekhawat, et al. (1990) discloses an "Inverter switch current sensor with shoot-through current limiting." The current-sensing circuit includes current transformer windings "connected with the flyback diodes to demagnetize or reset the current transformer core." The concept of "resetting" the current transformer core is similar to the present invention. However, the resetting means disclosed in U.S. Pat. No. 4,969,081 is dependent on connections and current signals that are unique to inverter applications, and the final induction level of the magnetic core after reset does not appear to be well defined.

U.S. Pat. No. 5,598,315 to Phillips (1997) discloses a "Self-Power Tripping Relay with Balanced Power Supply Current and Measurement Current." This power supply and sensing arrangement is intended primarily for three-phase circuit breaker tripping circuits. Half of each current cycle is used to charge the power supply, while the other half-cycle is used to sense input current. This patent is an improvement over previous similar patents as the voltage developed during each half-cycle has been balanced better to improve overall operation. The balanced voltages help to minimize magnetization problems with the current transformers. However, current-sensing accuracy is adversely affected by high secondary burden on the current transformers. Error correction curves are presented that show the difference between actual current and sensed current.

U.S. Pat. No. 6,028,422 to Preusse (2000) discloses a "Current Transformer" configuration that is said to not be adversely affected by d-c components. Per the abstract: "A semiconductor component that opens during a suitable time span within every cycle and is in turn closed is provided in the secondary circuit. During this time span the secondary circuit is in a no load condition. As a result thereof, the build-up of the core magnetization generated by the dc components is collapsed and thus the transformer core cannot be driven into saturation, so that an over-dimensioning of the transformer cores is unnecessary." The "no load condition" mentioned is clarified in the specification to be an open-circuit secondary (infinite burden). Though not discussed in the following way within the patent, this open circuit secondary appears to generate significant voltage that appears to drive the current transformer to a state near saturation at the opposite end of the hysteresis curve. It should be noted that, unless two magnetic cores and windings are utilized, this invention senses current only every-other half-cycle (since there is no current to sense during the time periods that the secondary is in a "no load" condition), and in this respect it is somewhat similar to U.S. Pat. No. 5,598,315 (discussed above). This invention seems to fall into the category of demagnetizing methods that push the induction level away from saturation at one end of the hysteresis curve toward saturation at the other end of the hysteresis curve without defining the resulting induction level clearly.

The above patents illustrate some prior art related to the present invention. However, none of them fulfill the objects of the invention described herein.

BRIEF SUMMARY OF THE INVENTION

In accordance with the present invention, a varying voltage is applied to a conductive winding that magnetically interacts with a magnetic body. The "varying voltage" is controlled in such a way that the magnetic induction level of the magnetic body is changed from an unknown induction level to a known induction level and then to a preferred induction level.

The varying voltage may be generated directly by a controllable electric energy source, or the varying voltage may be generated indirectly, such as by current transformer secondary current flowing through an adjustable impedance. The key elements are a magnetic body, a conductive winding that magnetically interacts with the magnetic body, and a means of producing voltages and currents with the appropriate waveforms, magnitudes and durations.

The invention is most readily applied to magnetic bodies that are configured to have a relatively uniform magnetic path.

A conductive winding that is utilized in the demagnetizing process may be a permanent winding that is also used for other purposes, or it may be a dedicated winding (permanent or temporary) provided solely for the purpose of magnetizing or demagnetizing the magnetic body.

The invention is based primarily on two principles of electromagnetism:
(1) the relationship of magnetomotive force to flux density as defined by hysteresis curves of magnetic bodies, and
(2) Faraday's Law applied to magnetic bodies.
The first principle is used during a first phase to change the induction level of a magnetic body to a known induction level, while the second principle is used during a second phase to change the induction level from the known induction level to a preferred induction level. The second principle may also be utilized during a third phase to keep a magnetic body in a demagnetized state and reduce the burden of a current transformer secondary circuit.

The invention is especially applicable to ordinary current transformers, which may be demagnetized automatically while remaining in service. Once demagnetized, ordinary current transformers are able to accurately sense non-symmetrical currents, including d-c currents and a-c currents that have d-c components.

When utilized with an a-c power system, current transformers may be demagnetized while in service by utilizing an adjustable impedance connected in series with current transformer secondary current. The adjustable impedance causes an induced voltage across the secondary winding of the current transformer. By sequentially adjusting the adjustable impedance, the induced voltage is caused to vary in such a way that the magnetic core of the current transformer is demagnetized.

The invention has been developed primarily to provide an improved way of demagnetizing magnetic bodies, so much of the description is directed in that way. However, it should be clear that the invention may also be used to magnetize a magnetic body to a preferred induction level, and it is not the intent of this disclosure to limit the invention to demagnetizing applications.

Accordingly, some objects and advantages of the present invention are:

(a) To provide a way to demagnetizing current transformers while in service, thereby improving the accuracy of current transformers.
(b) To provide a way to utilize ordinary current transformers to measure d-c current.
(c) To provide a way to maintain a current transformer in a demagnetized state once the current transformer has been demagnetized.
(d) To provide a way to increase current transformer accuracy by reducing the burden of a current transformer secondary circuit to near zero ohms.
(e) To provide a quick and accurate way to demagnetize a magnetic body, utilizing a conductive winding and a controllable electric energy source.
(f) To provide a quick and accurate way to magnetize a magnetic body to a preferred induction level, utilizing a conductive winding and a controllable electric energy source.
(g) To provide a quick and accurate way to demagnetize a magnetic body, utilizing a primary winding conducting an alternating current and a secondary winding connected to an adjustable impedance.
(h) To provide a quick and accurate way to magnetize a magnetic body to a preferred induction level, utilizing a primary winding conducting an alternating current and a secondary winding connected to an adjustable impedance.

Further objects and advantages will become apparent from a consideration of the drawings and ensuing description.

BRIEF DESCRIPTION OF THE DRAWINGS

FIG. 3 shows a hysteresis curve sequence that may be used to quickly change the induction level of a magnetic body from an unknown induction level to an induction level near zero.

FIGS. 4A to 4D show one method of controlling voltages and currents to demagnetize a magnetic body utilizing the hysteresis curve sequence shown in FIG. 3. The waveforms shown are applicable to the configurations shown in FIGS. 1 and 2 (with voltage device 63 in FIG. 1 being an active voltage source, and conductor 64 omitted or disconnected).

FIG. 7 shows a hysteresis curve sequence that may be used to automatically determine demagnetizing parameters and quickly demagnetize a magnetic body.

FIGS. 8A to 8D show one method of controlling voltages and currents to automatically determine demagnetizing parameters and demagnetize a magnetic body utilizing the hysteresis curve sequence shown in FIG. 7. The waveforms shown are applicable to the configurations shown in FIGS. 1 and 2 (with voltage device 63 in FIG. 1 being an active voltage source, and conductor 64 omitted or disconnected).

FIGS. 12A to 12C show one way that an alternating voltage and current may be utilized to implement the hysteresis curve sequence of FIG. 10 using the controllable electric energy source shown in FIG. 11.

FIGS. 13 through 24 and FIGS. 27 through 29 all illustrate how adjustable impedances may be utilized in a current transformer secondary circuit to demagnetize a current transformer.

FIG. 13 shows a functional schematic to illustrate how an adjustable impedance 2 may be used to demagnetize a current transformer while in service. An optional power supply circuit 4 is shown that can derive power from the current transformer secondary current to provide power for self-powered applications.

FIGS. 14A to 14E show typical operating waveforms and control signals associated with preferred operation of the functional schematic shown in FIG. 13.

FIGS. 15A to 15E show waveforms and control signals for an alternate method of operation for the functional schematic shown in FIG. 13. This method of operation does not require any feedback signal to the control circuit.

FIGS. 16A to 16E show waveforms and control signals for another alternate method of operation for the functional schematic shown in FIG. 13. This method of operation also does not require any feedback signal to the control circuit.

FIG. 17 shows one embodiment of a current transformer demagnetizing circuit incorporated as part of a self-powered current monitor. This configuration is able to demagnetize multiple current transformers with only one additional control signal required for each additional transformer. However, this configuration is best suited for demagnetizing only one current transformer at a time.

FIGS. 18A to 18E show typical operating waveforms and control signals associated with the embodiment shown in FIG. 17.

FIG. 19 shows an alternate embodiment of a current transformer demagnetizing circuit. This configuration is suitable for demagnetizing multiple current transformers at once. The optional power supply circuit shown may be deleted, in which case the circuit shown is a relatively simple embodiment for applications that do not derive power from the current transformer secondary current (similar to FIG. 21).

FIGS. 20A to 20D show typical operating waveforms and control signals associated with the embodiment shown in FIG. 19.

FIG. 21 shows an embodiment of a current transformer demagnetizing circuit similar to FIG. 19, but without provision for self-powered applications, and with only one control conductor 43. Also, an additional zener diode D17 and resistor R17 have been added to the adjustable impedance to demonstrate how the characteristics of the adjustable impedance may be customized to match hysteresis curve properties.

FIG. 22 shows an embodiment of a current transformer demagnetizing circuit similar to FIG. 21, but utilizing only one MOSFET transistor for the adjustable impedance. This is intended to show a very simple and inexpensive way to implement a current transformer demagnetizing circuit.

FIGS. 23A to 23E show typical operating waveforms and control signals associated with the embodiment shown in FIG. 21.

FIGS. 24A to 24E show typical operating waveforms and control signals associated with the embodiment shown in FIG. 22.

FIGS. 27A to 27E show typical operating waveforms and control signals associated with the functional schematic shown in FIG. 13 utilizing the demagnetizing sequence shown in FIG. 26.

FIG. 28 shows an alternate embodiment of a current transformer demagnetizing circuit in which one side of the current transformer is grounded. This embodiment satisfies the requirement of some safety codes that current transformers be grounded. Optional power supply components are included for self-powered applications.

FIG. 29 shows an alternate embodiment of a current transformer demagnetizing circuit in which one side of the current transformer is grounded, similar to FIG. 28. However, FIG. 29 includes additional components to reduce the amount of heat generated by the voltage-limiting function of the power supply.

FIGS. 32A to 32D illustrate four different ways that the configurations shown in FIG. 1 or 31 may be operated during a current-sensing mode after a demagnetizing sequence is completed. Conceptually, FIGS. 32B, 32C and 32D may be thought of as a continuation in time of FIGS. 30A, 30C and 30D respectfully, with enlarged vertical scales.

FIG. 33 illustrates a variation of the configuration shown in FIG. 31 that may be used to virtually eliminate the burden of a current transformer secondary circuit.

Figure 1:
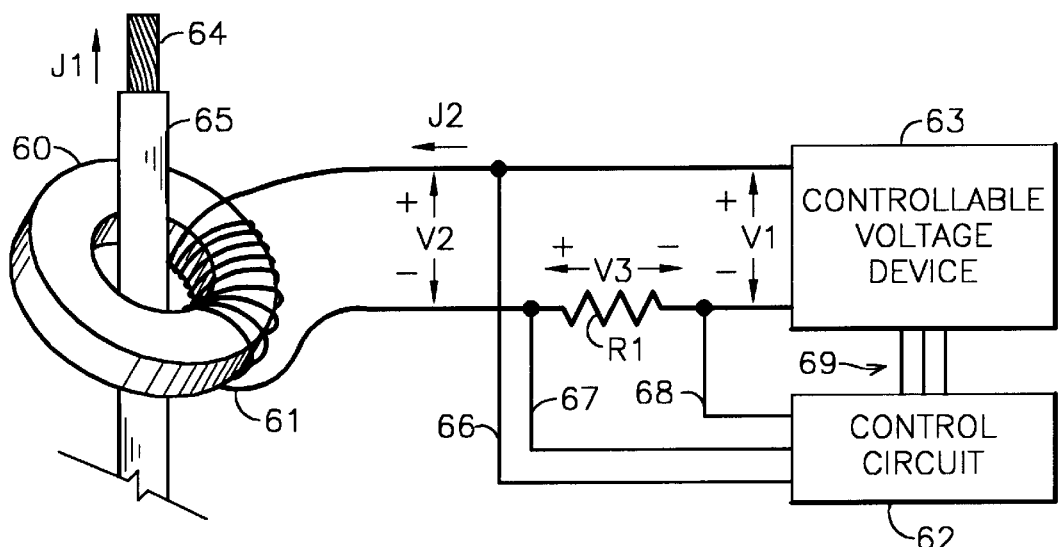
FIG. 1 illustrates the general concept by showing a magnetic body 60, a winding 61 wrapped around magnetic body 60, and a controllable voltage device 63 with a suitable control circuit 62. Magnetic body 60 and winding 61 are shown in a typical current transformer configuration with the magnetic core around an electric power system conductor 64. Controllable voltage device 63 may be an active electrical energy source or an adjustable impedance.

Items that are common to more than one figure are identified by the same reference characters. Sequence point identifiers A, B, C, D, E, F, and G (used in FIGS. 3, 5, 7, 9, 10, 25 and 26) are intended to indicate sequential progress, rather than a functional state. Point A indicates the first point of a sequence, point B indicates the second point of a sequence, etc.

DETAILED DESCRIPTION OF THE INVENTION

Theory

The invention is based primarily on two principles of electromagnetism, herein referred to as the "first principle" and "second principle." These two principles may be stated briefly as follows:

(1) the relationship of magnetomotive force to flux density as defined by hysteresis curves of magnetic bodies, and
(2) Faraday's Law applied to magnetic bodies.

The "first principle," the relationship of magnetomotive force (amp-turns) to flux density, is used by the invention to establish a known induction level in a magnetic body. Hysteresis curves are commonly used to show the relationship of magnetic flux density (the y axis, also referred to as "induction level") to magnetic field intensity (the x axis) for a particular magnetic material. For a reasonably uniform magnetic core that interacts with a conductive winding with N turns, the magnetic field intensity within the magnetic core is fairly uniform and is proportional to the magnetomotive force (current magnitude times the number of winding turns). Since the number of winding turns is usually constant, the x-axis of the hysteresis curve may be scaled to be proportional to the magnitude of current in the winding. With this understanding, a hysteresis curve may be utilized directly to find the level of induction associated with a particular current magnitude. Alternatively, the same hysteresis curve could be used to find the magnitude of current (in a winding) that is necessary to drive the magnetic corn to a specific induction level, and the minimum amount of current required to drive the magnetic body into saturation.

The "second principle," Faraday's Law applied to magnetic bodies, basically defines how a magnetic flux changing with time is associated with an electromotive force. In simple form, Faraday's Law is often stated as:

$$emf = -d\Phi/dt \qquad \text{(equation no. 1)}$$

where "emf" is the electromotive force (voltage caused by a changing magnetic flux) associated with a defined closed path, and $-d\Phi/dt$ is the time rate of change of magnetic flux ($\Phi$) within the closed path. The minus sign is usually included to show that the emf tends to generate a current that reduces the change in flux in accordance with Lenz's law. However, the minus sign will be dropped for the remainder of this description so that a positive change in flux will be associated with a positive induced voltage. A constant of proportionality may be required, depending on the system of units used.

As used herein, the term "induced voltage" is intended to refer to voltages generated by a changing flux in accordance with Faraday's Law.

When applied to windings positioned around a magnetic body, Faraday's Law may be modified to yield (with the minus sign dropped):

$$\int Vdt = N\Delta\Phi \qquad \text{(equation no. 2)}$$

where V is the induced voltage (time-varying or constant) across the winding, N is the number of winding turns, and $\Delta\Phi$ is the change in flux. The equation indicates how the integral of induced voltage over time relates to the change in flux. (Resistive voltage drop caused by current flowing in the winding is not accounted for). Now, with the assumption (and limitation) that flux density within a magnetic body is reasonably uniform, then flux density "B" and magnetic body cross-sectional area "A" are related to flux $\Phi$ by the simple equation:

$$\Phi = AB \qquad \text{(equation no. 3)}$$

Combining this equation with equation no. 2 yields:

$$\int Vdt = NA\Delta B \qquad \text{(equation no. 4)}$$

which shows how a change in flux density is related to induced voltage over time. The left side of equation no. 2 or no. 4 will be referred to herein as a "volt-time integral."

The "volt-time integral" of the second principle leads to the concept that a particular "volt-time value" is associated with the change of induction level in a magnetic body from one induction level to another induction level. For example, the volt-time integral of voltage induced in a winding by a change of induction level from saturation to zero will always have the same value regardless of how many steps are involved or how long it takes. Likewise, a change between any other two levels of induction will also be associated with a volt-time value that is not dependent on the sequence used to cause the change. For the sake of this description, let "Q" designate the "volt-time value" associated with the volt-time integral calculated for a change in induction level from a first induction level $B_1$ to a second induction level $B_2$. Equation no. 4 may then be written as:

$$Q = \int Vdt = NA(B_2 - B_1) \qquad \text{(equation no. 5)}$$

The units of this "volt-time value" will usually be volt-seconds, though other units are possible, of course.

Of particular interest is the volt-time value associated with a change in induction level from a "known" induction level to an induction level near zero, as this is key to using the second principle to demagnetize a magnetic body. If the induction level is known, a volt-time value associated with a change to zero may be calculated. Alternatively, if a volt-time value associated with a change to zero is known, the actual induction level may be calculated. More specifically, let "$Q_0$" designate a volt-time value associated with a change from an induction level $B_1$ to an induction level of zero. Then the relationship between volt-time value $Q_0$ and induction level $B_1$ may be expressed mathematically as:

$$Q_0 = -NAB_1 \qquad \text{(equation no. 6)}$$

or $$B_1 = -Q_0/(NA) \qquad \text{(equation no. 7)}$$

As in previous equations, "N" is the number of winding turns, and "A" is the cross-sectional area of the magnetic body. As with previous equations, a constant of proportionality may be required, depending on the system of units used.

If a volt-time value $Q_0$ is determined for a particular induction level, and if the cross-sectional area and number of winding turns are known, equation no. 7 may be used to determine the actual induction level in customary units. However, in many demagnetizing applications, it is often sufficient to merely quantify $Q_0$ in a general sense in order to facilitate a transition to an induction level of zero. For example, the induction level may be "known" only in a very general sense by knowing something about $Q_0$, such as knowing the time period associated with a repeatable voltage that causes a transition between two opposite induction levels (the specific volt-time value of the voltage wave not being necessary for operation). This situation is illustrated by FIGS. 8B and 12A and the description of those figures.

The magnitude of the volt-time value associated with a change of induction level from saturation to zero is normally constant for a particular magnetic body and winding combination. This constant value will be a positive number (the polarity of saturation is not included) designated "$Q_c$" and will be referred to herein as a magnetic body's "volt-time constant." This value may be calculated based on magnetic body and winding parameters, or may be determined by trial and adjustment. Alternatively, the "volt-time constant" may be determined automatically as described below.

In addition to utilizing Faraday's Law to change between two induction levels as described above, Faraday's Law also may be utilized to avoid changes in induction level once a preferred induction level is established. Equation no. 1 shows that there can be no change in flux without a nonzero electromotive force occurring that is associated with the change in flux. This logically leads to the concept that there can be no change in the induction level of a magnetic body without an induced voltage. Therefore, if the induced voltage can be made to be very close to zero, then the induction level can change only very slowly. This concept can be utilized to maintain a preferred induction level in a magnetic body once a preferred induction level is established.

Also, considering equation no. 4, if the average value of induced voltage over a particular time period is zero, the final induction level must be the same as the beginning induction level. Similar to the concept described in the previous paragraph, this concept can also be utilized to maintain a preferred induction level in a magnetic body once a preferred induction level is established.

Summarizing to this point: In order to understand the invention, it is important to understand how the first and second principles relate to movement around a hysteresis curve associated with a magnetic body. Per the second principle, vertical movement (a change of induction level) is associated with induced voltage and time. A fixed change in induction level corresponds to a fixed volt-time value. If multiple windings are present, each winding will have an induced voltage in accordance with the second principle. Horizontal movement is associated with a change in current magnitude. If multiple windings are present, horizontal position is dependent on the net mmf caused by all currents in all windings. All movement is restricted by the hysteresis curve properties of the magnetic body. Since hysteresis curve properties do not allow movement exactly horizontal or exactly vertical, an induced voltage is always associated with a change in current (or net mmf), and a change in current (or net mmf) is always associated with an induced voltage. (Even when dealing with saturation and "square" hysteresis curves the saturation part of the curve is not perfectly flat).

Clarifications

The description will now turn to some necessary clarifications.

As used herein, the phrase "known induction level" is intended to be synonymous with "determinate induction level." Both phrases are used in a broad sense of having some kind of data that quantifies the state of magnetic flux density (induction level) in any way that can be used to implement the "second principle" (Faraday's Law applied to magnetic bodies) to move the induction level to a preferred induction level. For example, the induction level is considered to be "known" (or "determinate") if the approximate volt-time value (equation no. 5) that is associated with a change of induction level to zero is known. In the case of repeatable voltages being utilized, the induction level is also considered to be "known" if the time period required to change the induction level to near zero is known.

Throughout this disclosure it will often be said that a "voltage" or "varying voltage" (or similar terminology including "voltage") is applied to a conductive winding to implement either the first or second principle. However, though the "second principle" is primarily dependent on induced voltage and time, it should be understood that operation utilizing the "first principle" is primarily dependent on current magnitude rather than voltage. In many cases the "voltage" referred to causes changes in current, and it is the current that is more directly involved in making the first principle work. It could equally be said that "current" is caused to flow in a conductive winding to implement either principle. The point is that a voltage cannot be applied without affecting the level of current associated with it and vice versa, so that someone claiming to do the same thing using "current" instead of "voltage" is merely using semantics to their advantage. The equivalency of current-sources and voltage-sources in accordance with the well-known Thevenin and Norton theorems of basic electrical theory should be kept in mind.

As used herein, the term "varying voltage" is intended to refer in general to a voltage that may vary over time or that may be relatively constant. While relatively constant voltages are utilized at times in the preferred embodiments, it should be understood that non-constant voltages could also be used, and the term "varying voltage" is intended to include both possibilities. Also, the term "waveform" is intended to mean the geometrical shape of a quantity when displayed as a function of time.

Although some of the preferred embodiments of the invention utilize a controllable active "voltage source" to produce "varying voltages" (these voltages then affect current magnitudes), some other embodiments may utilize a controllable active "current source" instead. In more general terms, a controllable "electric energy source" may be utilized, meaning an active source that is either a current source or a voltage source (or having the ability to act as both). However, from a practical point of view, since most prior-art electrical energy sources are configured as voltage sources, and since the preferred embodiments all utilize controllable voltages for operation, the term "voltage source" will be more commonly used herein. The use of "voltage sources" in the preferred embodiments is not intended to restrict the invention from being embodied with other types of electric energy sources.

When utilizing an active voltage source, the output should be current-limited to an appropriate value to ensure safe current levels during brief time periods that the magnetic bodies may be saturated.

In many applications the voltage drop associated with current flowing through winding resistance is small compared to the induced voltage across the winding. In many cases this resistive voltage drop may be ignored with suitable results. For simplicity of illustration, most of the description herein assumes that the winding resistance is small enough to be ignored. Winding voltage "V2" shown in many figures is intended to be the induced voltage, with related descriptions assuming negligible winding resistance. For added operational accuracy, the effect of voltage drop due to current flowing in a winding may be taken into account by subtracting resistive voltage from measured winding voltage to obtain induced voltage. Strictly speaking, the voltage used in equations 2, 4, 5, 8 and 9 is the induced voltage (equations 8 and 9 are below). For greater simplicity and accuracy in measuring induced voltage, a winding dedicated to measuring induced voltage may be utilized (the varying voltages and currents utilized to actually cause changes in induction level must be applied to a different winding). The current in such a dedicated winding should be kept very small to avoid the inaccuracies associated with resistive voltage drop.

Preferred Sequences

The description will now turn to explaining the preferred sequences utilized by the invention.

As stated earlier, the present invention applies a varying voltage to a conductive winding to establish a preferred induction level in a magnetic body. Improvements over prior art include, but are not limited to, the following:

(a) the waveforms, magnitudes, and time durations used for this "varying voltage," and
(b) how this "varying voltage" can be generated utilizing an adjustable impedance in the secondary circuit of a current transformer.

Speaking now regarding the waveforms, magnitudes, and time durations used for the varying voltage, the preferred embodiment utilizes two sequential phases to establish a preferred induction level in a magnetic body. For purposes of this description these two phases will be called the "first phase" and the "second phase." The first phase primarily utilizes the "first principle" (the hysteresis-curve relationship of magnetomotive force to flux density) to establish a known induction level. The "second phase" utilizes the "second principle" (Faraday's Law applied to magnetic bodies) to change the induction level to a preferred induction level. Each of these two phases may involve several steps or just a single step, depending on the preferred operation for a particular application.

For current transformer applications, an additional third phase is applicable, also called a "current-sensing" phase (or current-sensing mode), during which secondary current is proportional to primary current. Current monitoring apparatus may monitor secondary current during this third phase to accurately determine the characteristics of primary current. The invention includes methods to maintain a current transformer core in a demagnetized state during the third phase, so that demagnetizing sequences (utilizing the first and second phases) will not be required as often as would otherwise be the case.

Establishing a known induction level during the first phase (utilizing the "first principle") may be done in several ways. Three of these ways are:
(a) Provide a current of sufficient magnitude to drive the magnetic body to saturation, in which case the induction level is known to be the saturation induction level of the magnetic body.
(b) Provide a current that is not sufficient to saturate the magnetic material, and utilize known hysteresis-curve characteristics to determine the induction level of the magnetic body.
(c) Provide a current that alternates between positive and negative values and determine a "volt-time value" from the resulting voltage waveform. (This method is discussed in more detail below). This "volt-time value" may be combined with known geometries of the magnetic body and winding to determine the actual peak induction level (per equation no. 7 above), or it may be utilized directly by the second phase to reduce the induction level to zero. In the case that the current is sufficiently large to drive the magnetic body to saturation, the "volt-time value" determined in this way has the same magnitude as the "volt-time constant" previously defined. The first phase ends (and the second phase begins) with the induction level at a peak induction magnitude.

These three methods will be referred to herein as "first-phase method a," "first-phase method b" and "first-phase method c."

"First-phase method c" (applying an alternating current and determining a volt-time value) has the advantage of not requiring advance knowledge about the properties of the magnetic body.

After a known induction level is reached by the first phase, the second phase starts, changing the known induction level to the preferred induction level (utilizing the second principle). This also may also be done in several ways. However, all of these ways are constrained by the second principle to provide a voltage for a period of time such that the volt-time integral corresponds to the volt-time value necessary to change the induction level from the known induction level to the preferred induction level. There are at least three ways to do this:
(a) Provide voltage all of one polarity for a time period such that the volt-time integral approximately equals the volt-time value.
(b) Provide a first voltage and a second voltage of opposite polarities; the first voltage having such magnitude, duration and polarity so as to cause the induction level of the magnetic body to transition to and pass the preferred induction level; the second voltage having such magnitude, duration and polarity so as to cause the induction level of the magnetic body to transition to the preferred induction level.
(c) Provide a voltage made up of several sequential voltage pulses of varying form, magnitude, duration, and polarity; the integral of this voltage over the second-phase time period being approximately equal to the volt-time value.

These three methods will be referred to herein as "second-phase method a," "second-phase method b" and "second-phase method c."

"Second-phase method b" is an improvement over "second-phase method a" because the second voltage (with opposite polarity as the first voltage) can improve accuracy by eliminating a small d-c offset current that may be present after the first voltage. After a first voltage (of method a or b), there is a small current flowing that has a magnitude roughly corresponding the coercive force of the magnetic body. This small current may have a small adverse effect on the magnetic state of the magnetic core at the end of the demagnetizing sequence. The second voltage used in method b is intended to eliminate this "coercive force error."

"Second-phase method c" is intended to cover all possibilities, not covered by methods "a" and "b."

It should be noted that the volt-time value utilized by the second phase is the not the same as the volt-time value calculated by "first phase method c" unless the preferred final induction level is zero.

"First-phase method c" will now be described in more detail.

The "volt-time constant" for a particular magnetic body and winding may be automatically determined by first providing a current (or by providing a voltage that causes current to flow) that drives the magnetic body to saturation at one end of its hysteresis curve, and then transitioning to a current of opposite polarity that drives the magnetic body to saturation at the other end of its hysteresis curve. The induced voltage associated with the transition from the first saturation level to the second saturation level is integrated over the time period of the transition. The calculated result is then divided by two to obtain the "volt-time constant" (if the result is negative, the minus sign is dropped). For exceptional accuracy the effect of resistive voltage drop due to current flowing in the winding should be taken into account, the induced voltage being calculated as the voltage across the winding minus the resistive voltage drop of current flowing through the winding. However, the effect of resistive voltage drop) may often be neglected with suitable results. Alternatively, a separate winding used just for measuring induced voltage may be utilized, with current in this second winding kept near zero to avoid the effects of resistive voltage drop.

A simplified method may be used to determine the volt-time constant. As before, a current (or a voltage that causes current to flow) is first applied that drives the magnetic body to saturation at one end of its hysteresis curve. Then, during the transition to a current with opposite polarity, the voltage is held relatively constant. Then it is necessary only to determine the length of time required to go from the first saturation level to the opposite saturation level. The "volt-time constant" is then one half of the transition time period multiplied by the voltage applied. The onset of saturation may be determined by sensing a sudden change in current or voltage. This method is easily implemented by using a current-limited voltage source to provide the necessary currents and voltages. This method is described more fully in the description of FIGS. 7 and 8.

An automatic sequence to determine the volt-time constant can be included at the beginning of a demagnetizing sequence. For permanently-installed equipment the automatic sequence can be done once or periodically as an automatic calibration sequence.

A similar automatic method may be utilized to determine a volt-time value and associated known induction level regardless of whether current magnitudes are adequate to drive a magnetic body to saturation. To do this, an alternating current may be provided (or an alternating voltage that causes an alternating current to flow), with positive and negative peak current magnitudes that are approximately equal. This alternating current is associated with an alternating induced voltage across the winding. The alternating current and alternating induced voltage are related by the properties of the magnetic core and winding. The alternating current causes the flux in the magnetic body to change direction once every cycle. The peak induction levels occur at the beginning and end of each positive and negative half-cycle of the alternating induced voltage. The magnitude of the peak induction level in the magnetic body may be determined by determining the volt-time integral of a positive or negative half-cycle of the alternating induced voltage. The result is a volt-time value associated with a change between the two opposite peak induction levels. By dividing this value by two, a volt-time value is obtained that corresponds to a change in induction level from an induction level of zero to the ending peak induction level. Adding a minus sign will change the result to the proper polarity for use by the second phase in returning the induction level to zero. Mathematically, this is merely using equation no. 5, with the integral being taken over an entire single positive or negative half-cycle, and with the understanding that the beginning and ending induction levels are equal and opposite:

$$Q = \int V dt = NA(B_2 - B_1) \quad \text{(equation no. 8)}$$

Since $B_1$ is equal to $-B_2$, and since for the situation described $Q_0 = -\frac{1}{2}Q$, equation no. 8 may be reduced to:

$$Q_0 = -\frac{1}{2}\int V dt = -NAB_2 \quad \text{(equation no. 9)}$$

With the clarification again that the integral of equation no. 9 is taken over an entire positive or negative half-cycle of induced voltage, equation no. 9 shows how the peak induction level ($B_2$) caused by a steady-state alternating current is related to the associated alternating induced voltage. This relationship may be used as part of a first phase to establish a "known" induction level.

Equation no. 9 is also applicable to the second phase, showing that the volt-time value used by the second phase should equal half of the volt-time integral of a half-cycle of alternating induced voltage. Stated another way, it shows that the induction level may be reduced to near zero by allowing the alternating induced voltage, to continue approximately half way into the next half-cycle.

In order to use "first-phase method c" with good accuracy, two conditions should be met. First, the peak magnitudes of the alternating current should be sufficiently large so that the flux in the magnetic body is caused to change direction once each cycle. This is another way of saying that the current must be sufficiently large to overcome the coercive force of the magnetic body so as to cause an alternating flux. Second, the positive and negative current peaks should cause opposite peak induction levels that are approximately equal (though of opposite direction). If positive and negative current peaks both have sufficient magnitude to drive the magnetic body to saturation, then the peak current magnitudes may be different. However, if positive and negative current peaks are not adequate to drive the magnetic body to saturation, then it is necessary that the magnitude of the positive and negative current peaks be approximately equal so that opposite peak induction levels are approximately equal.

If peak current levels are not sufficient to drive the magnetic body to saturation, it is helpful to cycle the current between opposite peak magnitudes once to eliminate the effect of any initial magnetization (before cycling the current between opposite current peaks to determine the volt-time integral of a transition between peak induction levels). In the case of a sinusoidal alternating voltage source being utilized to drive the required alternating current, with voltage magnitude and frequency such that the magnetic body is not driven to saturation at each end of its hysteresis curve, numerous cycles may be required after the voltage is applied to allow transient d-c current to decay so that opposite peak current magnitudes are approximately equal.

"First-phase method c" is described more in the later description of FIGS. 7, 8A to 8D, 10, 11, and 12A to 12C.

For current transformer applications, a third phase (a current-sensing phase) is applicable. Once a current transformer is demagnetized, the induced voltage of the secondary winding should be kept as small as practical for best accuracy and to help keep the current transformer from becoming magnetized again. To better understand third-phase operation, it should be kept in mind that induced voltage in a, current transformer secondary winding is always associated with a changing induction level in the magnetic core. If the induced voltage is zero, there will be no change in induction level. Alternatively, if the average value of induced voltage over a particular time period is zero, the final induction level will be the same as the beginning induction level. FIGS. 30 to 33 illustrate the principles involved and some methods to maintain a current transformer at an induction level near zero. Of course, similar methods may be utilized to maintain a preferred induction level other than zero.

Briefly summarizing to this point, the invention utilizes a first phase that changes the induction level of a magnetic body from an unknown level to a "known" (or "determinate") induction level. The "known" induction level may be determined by applying a current of known peak magnitude and using the first principle (the hysteresis-curve relationship of magnetomotive force to flux density), or by utilizing an alternating current and voltage to determine a volt-time value associated with peak induction level (utilizing both first and second principles). During a second phase the "second principle" (Faraday's Law applied to magnetic bodies) is then used to change the induction level from the known induction level to a preferred induction level. The first principle depends mostly on current magnitudes, while the second principle depends mostly on induced voltage and time. For current transformer applications, induced voltage during a third phase should be kept small for best accuracy, and the average value of induced voltage should be near zero to avoid remagnetizing the current transformer.

Current Transformer Considerations

The discussion will now turn to some issues related to current transformers.

Current monitoring devices that incorporate the invention and use standard current transformers will usually utilize two modes of operation sequentially:

(1) A first mode (also called a "demagnetizing mode"), during which the current transformer is demagnetized (utilizing the first and second phases discussed previously).

(2) A second mode (also called a "current-sensing mode"), during which current transformer secondary current is proportional to primary current (this is the same as the "third phase" previously mentioned).

Once demagnetized, the current transformer may become magnetized again due to the same problems that magnetized it in the first place. For this reason, preferred operation continually sequences between the demagnetizing mode and the current-sensing mode.

The term "current-sensing" is used herein in a broad sense to refer not only to means of deriving information about a current, but also to refer to more direct uses, such as means of actuating a control mechanism based on current characteristics (such as a calibrated solenoid-type actuator that may be part of a protective relay).

The invention is best suited for applications that sense current periodically, with some time between sensing periods available for use with the demagnetizing mode.

In a-c power system applications that derive power from the current transformer secondary current, three modes of operation may function sequentially (rather than just two modes as previously discussed):

(1) A power supply charging mode, during which the current transformer may become magnetized.
(2) A demagnetizing mode, during which the current transformer is demagnetized.
(3) A current-sensing mode, during which current transformer secondary current is sensed.

In some applications it may be advantageous for the current-sensing mode to remain active during the other modes, even though current-sensing accuracy is not as good during the other modes.

The invention primarily relates to the demagnetizing mode, and this mode will now be discussed as it relates to current transformers in service.

In implementing the "first principle" (the hysteresis-curve relationship of magnetomotive force to flux density) with a current transformer that is in service, it should be kept in mind that the magnetomotive force (mmf) applied to the magnetic core is the sum of the mmf of the primary current and the secondary current. These two mmf's are usually of opposite polarity and largely cancel each other during normal current transformer operation. These two mmf's do not normally cancel each other uring the demagnetizing mode utilized with the present invention. (For example, when utilizing an adjustable impedance, the "first phase" forces the secondary current to zero so that the magnetomotive force of the entire primary current is available to force the magnetic core into saturation).

The magnetic field magnitudes required to saturate magnetic materials utilized for current transformers can vary widely from about 0.05 amp-turn per centimeter to about 100 amp-turns per centimeter (depending on the material used). To clarify typical levels of primary current required to reach saturation, assume a core made of good magnetic material (with a relatively square hysteresis loop) that is saturated at 0.2 amp-turns per centimeter, with an average core circumference of 15 centimeters, and a one-turn primary. In this case, the peak primary current required for saturation is only 0.2×15=3 amps peak, or about 2 amps RMS. It should be noted, that this simple calculation does not take into account core construction details, and that the actual hysteresis curve of the actual core should usually be considered (not just the hysteresis curve of the magnetic material that the core is made of).

When used with a-c power systems, the demagnetizing mode may utilize an adjustable impedance, connected to the current transformer secondary winding and in series with current transformer secondary current. A suitable control circuit sets the adjustable impedance to control the induced voltage of the secondary winding. This secondary winding voltage influences the magnetic induction level of the current transformer core in accordance with the "first principle" and "second principle" previously discussed. The induced voltage of the secondary winding is a function of the secondary current and the impedance of the secondary circuit in accordance with Ohm's law.

It should be noted that, when utilizing an adjustable impedance, voltages of a particular polarity are only practical every other half-cycle, so voltages of a particular magnitude and polarity that should last longer than one half-cycle (as may be required in order to implement the "first principle" or "second principle") will need to be split between successive half-cycles with the same polarity. Alternatively, the voltage magnitude may be increased to the point that the particular demagnetizing step is possible during a single half-cycle.

It should also be noted that when using an adjustable impedance (in a secondary winding circuit) that when core saturation is reached the secondary current drops quickly to zero (since the magnetic core of the current transformer can no longer generate induced voltage to maintain a current flowing). This is just the opposite of the case with an active voltage source, in which case current levels suddenly increase as saturation is reached (since the magnetic core can no longer generate a induced voltage to oppose current flow).

The adjustable impedance may have linear or nonlinear characteristics. The preferred embodiment of the adjustable impedance utilizes zener diodes to yield strongly nonlinear characteristics. These strongly nonlinear characteristics facilitate operation by providing relatively constant secondary winding voltage levels that are largely independent of secondary current magnitudes.

A controllable electric energy source may also be utilized to demagnetize a current transformer, in which case a standard current transformer may be used to sense d-c current (with or without an a-c component). The secondary current flowing after a demagnetizing cycle will be an accurate reproduction of the d-c primary current for a limited time period following each demagnetization cycle. The duration of this time period is dependent on current transformer parameters and the magnitude of the burden during the current-sensing cycle.

Current Transformer Sequences

The discussion will now turn to how the varying voltage sequences (discussed previously in general) are implemented with an adjustable impedance in the secondary circuit of a current transformer to demagnetize the current transformer core.

In the following discussion, the direction of current flow during alternate half-cycles will be referred to as "direction one" and "direction two" rather than as "positive" and "negative," since the actual polarity of current flow is not significant to the general discussion. Voltage polarities will be indicated in a similar manner.

During the "first phase" (method a or b) the adjustable impedance is set to cause relatively high voltage with polarity one for current flowing in direction one. If the first phase lasts for more than a half-cycle of current flowing in direction one, then the adjustable impedance is set to cause relatively low voltage for current flowing in direction two. The high voltage associated with current flowing in direction one causes the magnetic core to become magnetized to a known induction level, preferably at or near saturation. Assuming that the primary current is adequate to drive the current transformer to saturation, the induction level is known to be the saturation induction level.

During the "second phase" (method a or b) the adjustable impedance is initially set to cause a relatively high first voltage with polarity two for current flowing in direction two, with voltage magnitude and duration such that the induction level is reduced to near zero, thereby demagnetizing the magnetic core of the current transformer.

In accordance with "second phase method b," a second voltage may then be generated by setting the adjustable impedance to cause a relatively high voltage with polarity one for current flowing in direction one, with the time period and magnitude such that error associated with the coercive force of the magnetic core material is minimized.

Once the demagnetizing mode is completed, the current-sensing mode usually begins, and the adjustable impedance is minimized (or otherwise disabled), and transformer secondary current is allowed to flow freely through a sensing resistor or other current-sensing means.

The first phase will typically last one or more half-cycles of the alternating current waveform, with the actual voltage and duration correlating to that required to ensure that the current transformer core is magnetized to a known induction level. The preferred voltage and preferred duration will vary depending on the construction of the specific current transformer that is being used.

Current transformers with magnetic core properties that include a relatively square hysteresis curve and low coercive force are preferred so that low primary currents will cause the magnetic core to saturate during the first phase. This provides an easy way of determining the induction level at the end of the first phase.

If, however, the primary current is not adequate to drive the current transformer into saturation, the induction level attained by the first phase may be calculated based on peak primary current and known characteristics of the magnetic core (in accordance with the "first principle"). In the case that peak primary current and/or magnetic core characteristics are not accurately known, some demagnetizing inaccuracy may occur to the degree that estimated parameters are in error. A good estimate of peak primary current may derived from a recent sensing of the secondary current (after a previous demagnetizing cycle), or it may be estimated by sensing secondary current prior to or during the demagnetizing mode (with some error possible due to the current transformer possibly being magnetized during current-sensing). Alternatively, a "volt-time value" may be determined by cycling between opposite sides of the hysteresis curve (as previously discussed for "first-phase method c"). As long as the peak magnitudes of successive primary current half-cycles are approximately equal (disregarding polarity) suitable results should be obtainable.

The first voltage of the second phase (method a or b) will usually last less than a half-cycle, though current transformers with a large number of secondary winding turns and/or large core cross-sectional areas may require more time. In order to reduce the induction level to near zero, the voltage magnitude and time period of the first voltage should be controlled such that the integral of the voltage magnitude over the time period is that which is necessary to reduce the induction level to near zero (in accordance with the second principle). As previously discussed, the required value of this integral is primarily a function of the magnetic core cross-sectional area, the number of secondary winding turns, and the level of induction attained during the first phase.

The optional second voltage (second-phase method b) will also usually last less than a half-cycle. The voltage magnitude and time period of the second voltage should be controlled such that the integral of the voltage magnitude over the time period minimizes the coercive force error. This integral is normally small when compared to the similar integral for the first voltage of the second phase. When the second voltage is included, it is usually beneficial for the first voltage to cause the induction level to go somewhat past zero, with the second voltage then operating to return the induction level to zero.

Of course, many variations of the first phase and second phase are possible. The above description has only included some preferred methods. As with the previous general discussion (not limited to current transformers), the voltages and time periods required to optimize the operation of the demagnetizing mode for a current transformer may be determined experimentally, by trial and adjustment, or automatically.

During the current-sensing mode (the "third phase") the burden should be minimized for best accuracy. In the case of unsymmetrical currents, the induction level will drift toward saturation if the induced voltage of the secondary winding is not somehow made to have an average value of zero. When an adjustable impedance is utilized with unsymmetrical currents, the induced voltage may be made to have an average value close to zero by causing the adjustable impedance to vary in such a way as to balance average magnitudes of positive and negative induced voltages. This will extend the length of time that secondary current is an accurate representation of primary current before another demagnetizing sequence is required. This may be done by causing the adjustable impedance to have an average value that is greater for current flowing in one direction than the other. The direction of current with lowest average value should pass through an impedance that has a higher average value in order to produce in induced voltage with an average value that matches the average value of induced voltage caused by current with opposite polarity. Pulse-width modulating techniques may be used to adjust the average value of a fixed switchable impedance element (similar to the control method described later for FIGS. 16C and 16D between times T11 and T13).

When an active energy source is used to generate variable voltages, the voltage generated during the current-sensing mode may be controlled in a similar way so that the induced voltage of the secondary winding has an average value of zero. Better yet, an active energy source may be controlled in a manner that causes the effective burden of the entire secondary circuit to be very close to zero, effectively making the induced voltage of the secondary winding near zero, thereby preventing the induction level from changing quickly. FIGS. 30 to 35 illustrate the principles involved and some methods to maintain a current transformer at an induction level near zero. Similar methods may be used to maintain a preferred induction level other than zero.

Detailed Description of the Drawings

FIG. 1 illustrates the general concept by showing a magnetic body 60, a winding 61 wrapped around the magnetic body, and a controllable voltage device 63 with a suitable control circuit 62. Magnetic body 60 and winding 61 are shown in a typical current transformer configuration with the magnetic body around an electric power system conductor 64 with an insulating covering 65. Power system conductor 64 functions as a primary winding with only one turn, with a primary current J1 flowing. Though shown with one end disconnected, power system conductor 64 is normally connected as part of an electric power system.

Controllable voltage device 63 may be an active voltage or current source (or, more generally, a controllable electric energy source), in which case a primary winding is not required. In this case, power system conductor 64 (acting as a primary winding) is not required. Resistor R1 may be omitted, or it may represent the source resistance or may be a current-limiting resistor.

As shown in FIG. 1, winding 61, voltage device 63, and resistor R1 are connected in series, so that current J2 flows through each of them.

If another source of magnetic excitation is available (such as current flowing in a primary winding), then controllable voltage device 63 may be an adjustable impedance. In the case of a current transformer in service, resistor R1 is usually included as a current-sensing resistor with a low value of resistance, and controllable voltage device 63 may be an adjustable impedance rather than an active voltage source. Often, current is sensed by a larger monitoring system as voltage V3 across resistor R1, since this voltage is proportional to current J2.

Winding 61 is shown with ten turns around magnetic body 60. The actual number of turns may vary widely depending on the application. Magnetic body 60 is shown as a toroid, though wide variation in magnetic body configurations is possible and the illustration is not intended to limit the breadth of application of the invention.

Control circuit 62 is shown with three high-impedance voltage-sensing inputs (connected to conductors 66, 67, and 68) to enable sensing of voltage V1, voltage V2, and voltage V3. Voltage V3 across resistor R1 is proportional to current J2 (which flows through resistor R1, winding 61, and controllable voltage device 63). Voltage V2 is the voltage across winding 61, which is the induced voltage generated by changing flux in magnetic body 60 (any voltage resulting from current J2 flowing through resistance associated with the winding is assumed to be negligible). Voltage V1 is the voltage across controllable voltage device 63.

Voltage-sensing conductors 66, 67 and 68 are not required for the simplest embodiments of the invention, but are included to clarify the general concept. Alternatively, other means of sensing current and/or voltages may be utilized, as may be preferred for different embodiments.

Several control conductors 69 act as an interface between control circuit 62 and controllable voltage device 63. The actual interface between control circuit 62 and controllable voltage device 63 may vary widely depending on the particular design. Control circuit 62 may be constructed utilizing prior art, with the control sequences being in accordance with the present invention. In the case that controllable voltage device 63 is an active voltage source or current source, it also may be constructed utilizing prior art, with the control sequences being in accordance with the present invention.

In the example of FIG. 1, magnetic body 60 provides a closed magnetic path with no need for other magnetic components.

Figure 2:
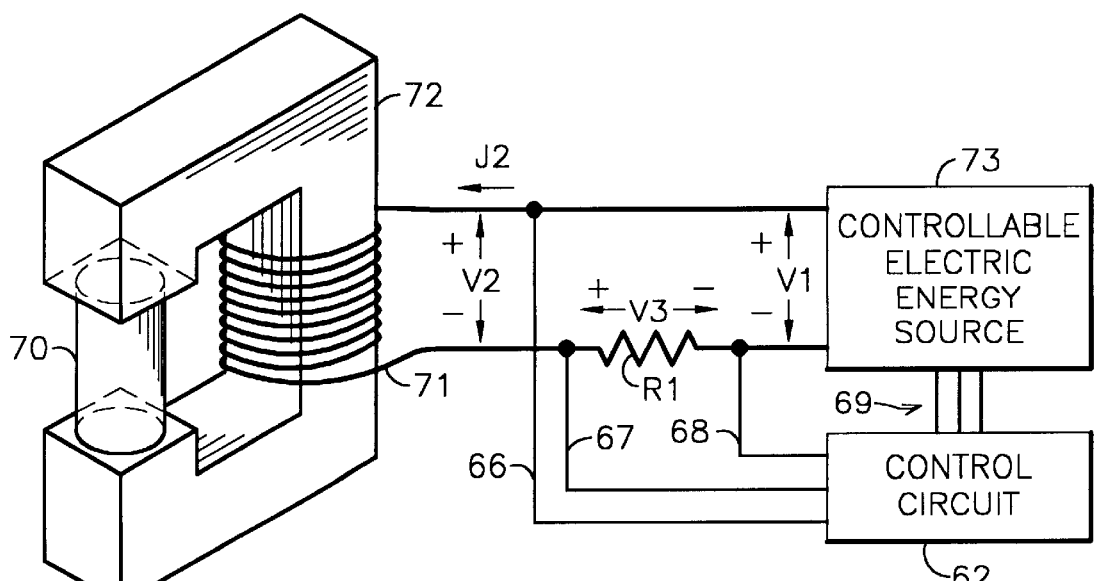
FIG. 2 illustrates an alternate configuration in which magnetic material 72 is used to provide a closed magnetic path for a magnetic body 70. An electric energy source 73 is shown in place of the more general controllable voltage device 63 of FIG. 1.

FIG. 2 shows an alternate configuration, in which a cylindrical magnetic body 70 does not provide a closed magnetic path by itself. Instead, a closed magnetic path is provided by additional magnetic material 72. For best operation, magnetic material 72 should be configured to have greater saturation flux capacity than magnetic body 70, so that the saturation characteristics of magnetic body 70 dominate the resulting magnetic circuit characteristics. One way this may be done is by configuring magnetic material 72 to have a greater cross-sectional area than magnetic body 70.

Since the configuration shown in FIG. 2 does not have a primary winding (or other source of magnetic excitation), controllable voltage device 63 is now shown as a controllable electric energy source 73. A winding 71 is wrapped around magnetic material 72. Resistor R1 represents a current limiting resistor, or a small shunt resistor that may be used to sense current. In many applications resistor R1 may be omitted.

It should be noted that an additional winding (connected to a power source able to provide a suitable alternating current) could be added to either magnetic material 72 or magnetic body 70, in which case an adjustable impedance could be substituted for energy source 73, similar to the configuration of FIG. 1.

FIGS. 3 and 4A to 4D illustrate "first-phase method a" and "second-phase method b."

FIG. 3 is a hysteresis curve that clarifies one way that the induction level of a magnetic body is changed by the invention. These changes correlate to the waveforms shown in FIGS. 4A to 4D. The horizontal axis X of FIG. 3 is proportional to magnetomotive force (ampere-turns), and the vertical axis Y is proportional to the induction level (magnetic flux density) of the magnetic body. Magnetization of the magnetic body increases as the operating point moves away from axis X. A magnetic material with a relatively square hysteresis curve has purposely been chosen, as this simplifies the demagnetizing operation.

The induction level of a magnetic body begins at a random magnetized state shown as point A of FIG. 3. The "first phase" moves the induction level to saturation near point B. The "second phase" shown includes two steps. A "first step" moves the induction level somewhat passed an induction level of zero to point C. A "second step" moves the induction level to near zero at point D.

FIGS. 4A to 4D show one method of controlling voltages and currents to demagnetize a magnetic body by using the sequence shown in FIG. 3. The waveforms shown in FIGS. 4A to 4D are applicable to the configuration shown in FIG. 2, or to FIG. 1 when controllable voltage device 63 is an active voltage source and primary conductor 64 is either disconnected or omitted. The waveforms shown in FIGS. 4A to 4D correlate to the sequential changes of induction level shown in FIG. 3.

FIG. 4D shows how the induction level varies with time. The vertical axis represents induction level, and is scaled similar to the vertical axis of the hysteresis curve shown in FIG. 3.

Referring to FIGS. 1, 3 and 4A to 4D, at time T41 the "first phase" of the demagnetizing cycle begins when voltage V1 is driven from zero volts to a positive value by controllable voltage device 63 as controlled by control circuit 62. This positive voltage causes the induction level of magnetic body 60 to transition from point A of FIG. 3 to saturation at point B. Saturation begins at about time T42 when current J2 suddenly increases as shown in FIG. 4C. The transition point is also marked by voltage V2 suddenly decreasing, as shown by FIG. 4B. At time T43 the "first step" of the second phase begins when the polarity of voltage V1 is reversed and the induction level of magnetic body 60 begins a transition from point B of FIG. 3 to point C. In the example shown, control circuit 62 controls the time period of the first step in order to change the induction level by an amount somewhat greater than change Y1, stopping at point C at time T44. At time T44 an optional "second step" begins when the polarity of voltage V1 is reversed again and the induction level of magnetic body 60 begins a transition from point C of FIG. 3 to point D. At time T45 the second step ends when voltage V1 is changed to zero volts, and magnetic body 60 is left in a demagnetized state at point D (at an induction level near zero). Change Y1 correlates to the "volt-time constant" previously discussed.

If the optional "second step" of the second phase was not included between times T44 and T45 of FIGS. 4A to 4D, a small d-c current would continue flowing after time T44, with a natural decay rate determined mostly by inductance associated with magnetic body 60 and the resistance of winding 61 and resistor R1. The final state of magnetic body 60 after this decay will also be an induction level near zero (at or near point D) as long as point C is close to an induction level of zero. Ideally, with or without the second step, point C of FIG. 3 should be at a point from which the natural decay of d-c current (without the second-step voltage) will leave the magnetic body at an induction level of zero. This naturally decaying d-c current flowing through resistance provides an uncontrolled second-step voltage that should be considered in volt-time calculations for the first step.

As indicated previously regarding the second phase, the voltage and time periods associated with the first step and second step should be controlled such that the volt-time integral of voltage V2 is the same as the "volt-time constant" of magnetic body 60 and winding 61. Referring to FIG. 4B, the volt time constant (of magnetic body 60 and winding 61) is related to areas A1 and A2 (with the hatched areas calculated in units of volt-time). More specifically, area A1 minus area A2 should be the same as the volt time constant. For the sequence shown in FIG. 3 and FIGS. 4A to 4D), the appropriate value of the volt-time constant is predetermined, and control circuit 62 is configured beforehand to control voltage device 63 in the manner illustrated to effectively demagnetize magnetic body 60.

FIGS. 5 and 6A to 6D also illustrate "first-phase method a" and "second-phase method b." The waveforms shown in FIGS. 6A to 6D are applicable to the configuration shown in FIG. 2, or to FIG. 1 when controllable voltage device 63 is an active voltage source and primary conductor 64 is either disconnected or omitted. The waveforms shown in FIGS. 6A to 6D correlate to the sequential changes of induction level shown in FIG. 5.

FIG. 5 and FIGS. 6A to 6D illustrate the same sequences as FIG. 3 and FIGS. 4A to 4D, except that the preferred induction level is not zero. In the example shown in FIG. 5 and FIGS. 6A to 6D the preferred induction level is 50% of saturation on the positive side of the hysteresis curve. The intent of these figures is to illustrate how the invention can be used to change the induction level from an unknown induction level to a preferred induction level (other than zero). With this type of sequence utilized, the invention functions as a means to magnetize a magnetic body to a preferred level of induction (rather than as a demagnetizing means).

Figure 5:
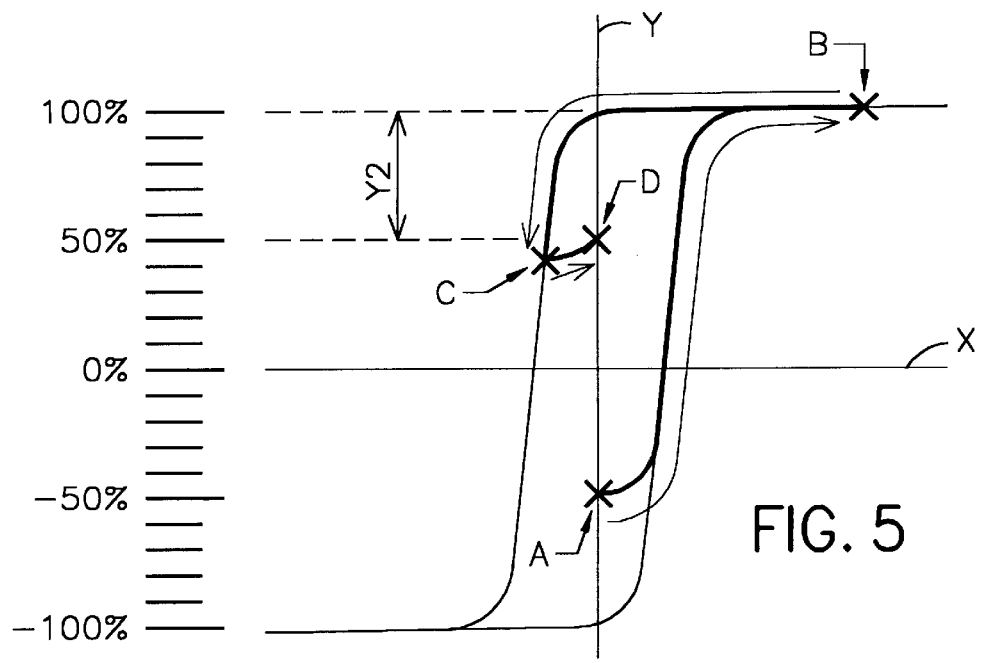
FIG. 5 shows a hysteresis curve sequence similar to FIG. 3, except now showing how the induction level of a magnetic body may be quickly changed from an unknown level to a preferred induction level (other than zero).

The sequence shown in FIG. 5 is the same as FIG. 3, except that in FIG. 5 the transition to sequence step C only changes the induction level by an amount slightly greater than change Y2. This change moves the induction level somewhat past +50%, and the transition to sequence step D then leaves the final induction level at about 50% of saturation. The smaller change in FIG. 5 corresponds to a smaller area A4 in FIG. 6B (compared to area A1 of FIG. 4B). Change Y2 corresponds to the volt-time value of a change in induction level from +100% to +50%.

Similar to the previous description for FIG. 3, in FIG. 5 the first phase includes the transition from sequence point A to point B. The second phase includes the transitions from sequence point B to point C, then to point D. The first phase of FIG. 5 and FIGS. 6A to 6D (between times T41 and T43) is the same as the first phase of FIG. 3 and FIGS. 4A to 4D.

Figure 6A:
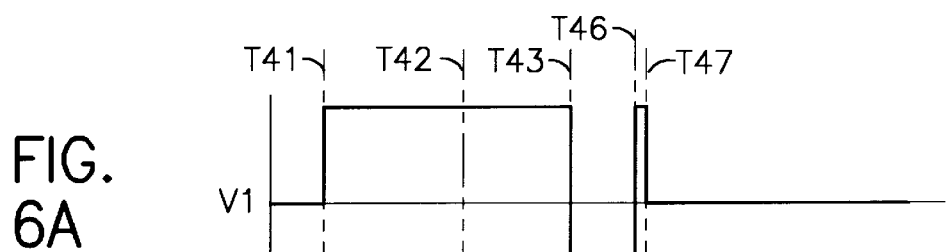
FIGS. 6A to 6D show one method of controlling voltages and currents to establish a preferred induction level in a magnetic body utilizing the hysteresis curve sequence shown in FIG. 5. The waveforms shown are applicable to the configurations shown in FIGS. 1 and 2 (with voltage device 63 in FIG. 1 being an active voltage source, and conductor 64 omitted or disconnected).
Figure 6B:
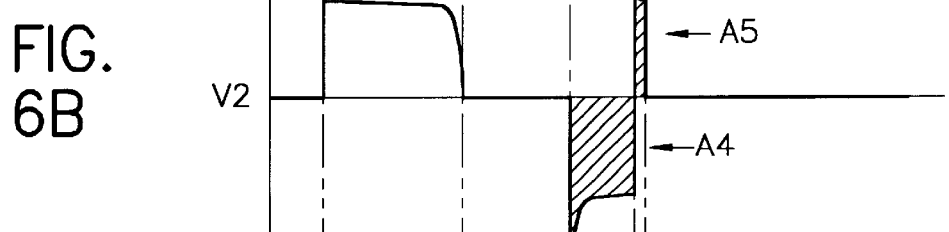
Figure 6C:
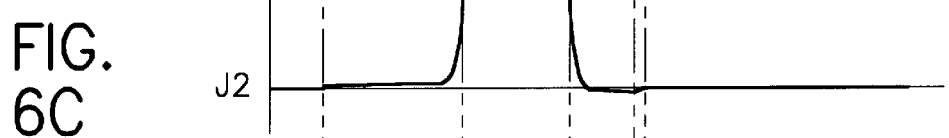
Figure 6D:
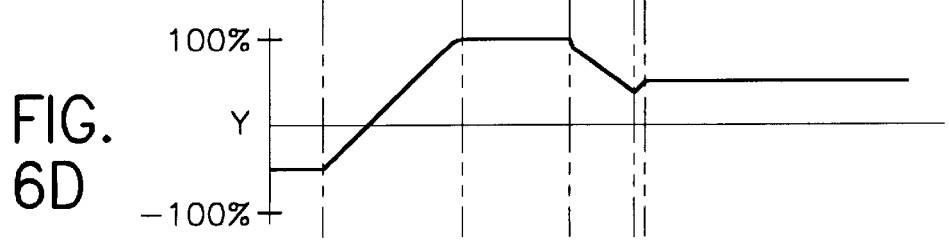

The second phase begins at time T43 of FIGS. 6A to 6D. The "first step" lasts until time T46, at which time the "second step" begins and lasts until time T47. The voltage and time periods associated with the first step and second step are controlled such that the volt-time integral of voltage V2 is the same as the "volt-time value" associated with a change of induction level of magnetic body 60 from saturation to the preferred induction level of 50%. Referring to FIG. 6B, the volt time value is related to areas A4 and A5. More specifically, area A4 minus area A5 should be the same as the volt time value. For the sequence shown in FIG. 5 and FIGS. 6A to 6D, the appropriate volt-time value is predetermined, and control circuit 62 is configured beforehand to control voltage device 63 in the manner illustrated to establish an induction level of about +50% of the saturation induction level.

While the subsequent figures and description focus mostly on the demagnetizing function of the invention, it should be noted that the sequences required to establish a non-zero preferred induction level are almost the same as the sequences utilized to establish an induction level near zero. The principles and embodiments discussed below are not intended to be limited only to the demagnetizing function of the invention.

Simple embodiments of control circuit 62 (FIGS. 1 and 2) can be configured to apply predetermined voltages for predetermined time periods without provision to monitor voltages or current (in this case voltage-sensing conductors 66, 67, and 68 are not used). The control sequence shown in FIGS. 4A to 4D and FIGS. 6A to 6D may be easily implemented in this manner. In more complex embodiments of control circuit 60, voltages and currents may be sensed to verify proper operation and determine optimum voltage and timing parameters. For example, voltage V2 may be numerically integrated over time to determine optimum transitional times. FIG. 7 and FIGS. 8A to 8D illustrate one way of utilizing voltage-sensing or current-sensing to automatically determine the "volt-time constant" of a particular magnetic body and winding at the beginning of a demagnetizing sequence.

FIGS. 7 and 8A to 8D illustrate "first-phase method c" and "second-phase method b." The waveforms shown in FIGS. 8A to 8D are applicable to the configuration shown in FIG. 2, or to FIG. 1 when controllable voltage device 63 is an active voltage source and primary conductor 64 is either disconnected or omitted. The waveforms shown in FIGS. 8A to 8D correlate to the sequential changes of induction level shown in FIG. 7.

FIG. 7 shows a hysteresis curve sequence that can be used to automatically determine the volt-time constant of a magnetic body and winding and then demagnetize the magnetic body. FIGS. 8A to 8D show waveforms that may be used to implement the sequence shown in FIG. 7.

In FIG. 8A, voltage V1 (generated by controllable voltage device 63) between times T53 and T57 is the same as in FIG. 4A between times T41 and T45. In FIG. 8A, however, voltage V1 begins the demagnetizing cycle with a negative polarity between times T51 and T53. This initial negative voltage moves the induction level from an unknown level shown as point A on the hysteresis curve of FIG. 7 to saturation at point B of FIG. 7. Saturation near point B is reached at about time T52. At time T53 of FIG. 8A voltage V1 changes to positive polarity and drives the induction level toward point C of FIG. 7. Starting at time T53, control circuit 62 monitors either voltage V2 or current J2 to determine when saturation is reached. Saturation is reached at time T54, which corresponds to saturation near point C of FIG. 7. The volt time constant of the magnetic body may be determined by calculating the volt-time integral of voltage V2 between times T53 and T54 (this calculation determines the volt-time area shown as crosshatched area A3) and dividing the result by two. During the second phase (the transition from point C to point D and point E of FIG. 7) voltage V2 is then controlled so that the volt-time integral from time T55 to time T57 has the same magnitude as the calculated volt-time constant. Another way of saying this is that voltage V2 is controlled during the second phase so that area A1 minus area A2 is half of area A3.

For exceptional accuracy, the effect of winding resistance and current on voltage V2 may be automatically compensated for by the control circuit automatically determining winding resistance and calculating the volt-time integrals using corrected voltage. The winding resistance may be calculated as voltage V2 divided by current J2 between times T52 and T53 while the magnetic body is in saturation. Corrected voltage is then calculated as voltage V2 minus (current J2 multiplied by winding resistance).

Still referring to FIGS. 8A to 8D, a simplified approach would be to consider voltage V2 to be relatively constant between time T53 and T54 (roughly equal to voltage V1). Let the elapsed time between time T53 and time T54 be called "delta time." Then the volt-time constant can be calculated approximately as the magnitude of voltage V1 multiplied by "delta time" and divided by two. If the first-phase voltage is relatively constant, and the second-phase voltages are relatively constant and have the same magnitude as the first-phase voltage (but not necessarily the same polarity), then the volt-time constant does not need to be calculated directly. Since voltage magnitudes are the same, only the time periods of the second-phase first and second steps need to be calculated. In this case, the first-step voltage (between times T55 and T56) should be applied for a time period that is slightly more than half of "delta time" (example: 53% as long as "delta time"). The second-step voltage (between times T56 and T57) should last for a relatively short period of time as required to compensate for the time period of the first-step voltage that was in excess of half of "delta time" (example: 53%–50%=3% as long as "delta time").

FIGS. 8A to 8D illustrate one way that an alternating current and an associated alternating voltage can be used to determine induction level and related demagnetizing parameters. The sequence shown utilizes a current sufficiently large to drive the magnetic body to saturation, so only one cycle of alternating current is required. The first half cycle of current (time T51 to T53) takes the magnetic body to saturation, and then the volt-time integral of one half-cycle of alternating voltage is calculated (from time T53 to time T54 or T55) as the current transitions from the first peak to a peak of opposite polarity. The volt-time constant is determined by dividing the value of this volt-time integral by two. Peak induction level may then be calculated using equation no. 7 (above).

As previously discussed under "sequences," a similar alternating-current and alternating-voltage method may be used in the event that peak current magnitudes are not sufficient to drive the magnetic body to saturation. However, instead of calculating the "volt-time constant," a "volt-time value" is calculated that is related to peak induction level by equation no. 7. See the description for FIGS. 10, 11 and 12 for an example.

Figure 9:
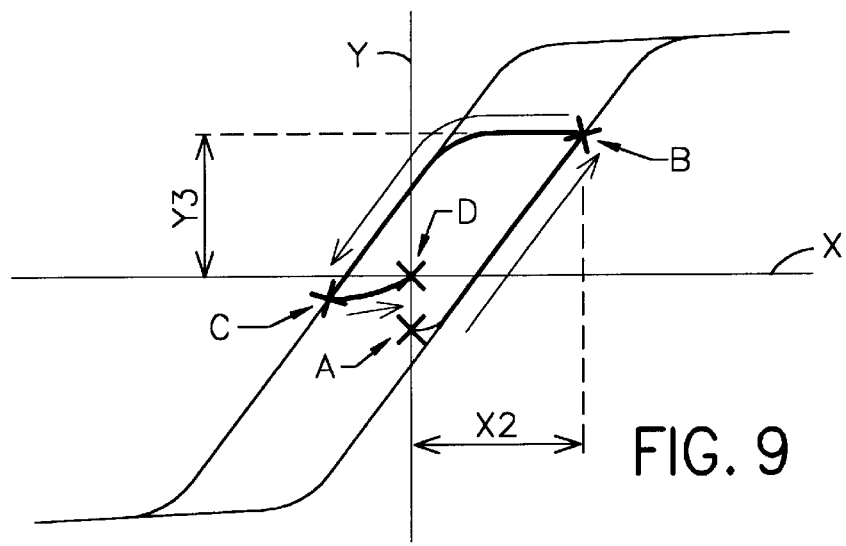
FIG. 9 shows a hysteresis curve sequence that illustrates how a magnetic body may be demagnetized when current is not adequate to drive the magnetic body into saturation. This method is dependent on knowing some properties of a magnetic body beforehand.

FIG. 9 illustrates "first-phase method b" and "second-phase method b."

FIG. 9 shows operation with a not-so-square hysteresis curve assumed for a magnetic body. Operation shown is similar to that described for FIG. 3 except that now current may not be large enough to drive the magnetic body to saturation. Similar to FIG. 3, horizontal axis X is proportional to magnetomotive force (ampere-turns), and vertical axis Y is proportional to the induction level (magnetic flux density) of the magnetic body. Magnetization of the magnetic body increases as the operating point moves away from axis X.

Referring to FIG. 9, when the demagnetizing mode begins, the induction level of a magnetic body generally is not known. This corresponds to a randomly chosen point A on the hysteresis curve of FIG. 9. The "first phase" of the demagnetizing cycle causes a current to flow with peak magnitude corresponding to magnetomotive force X2. This causes a transition to point B, with an induction level of Y3 (which is not at saturation). Induction level Y3 may be calculated based on peak current and known characteristics of the magnetic body (in accordance with the "first principle"). During the "second phase," a first voltage is applied to the magnetic body winding for a time period such that the induction level of the magnetic body transitions from point B to point C (in accordance with the "second principle"). A second voltage of the opposite polarity is then applied for a time period such that the induction level of the magnetic body, transitions to point D. At point D, the magnetic body is demagnetized.

FIGS. 10, 11 and 12A to 12C illustrate "first-phase method c" and "second-phase method b."

Figure 10:
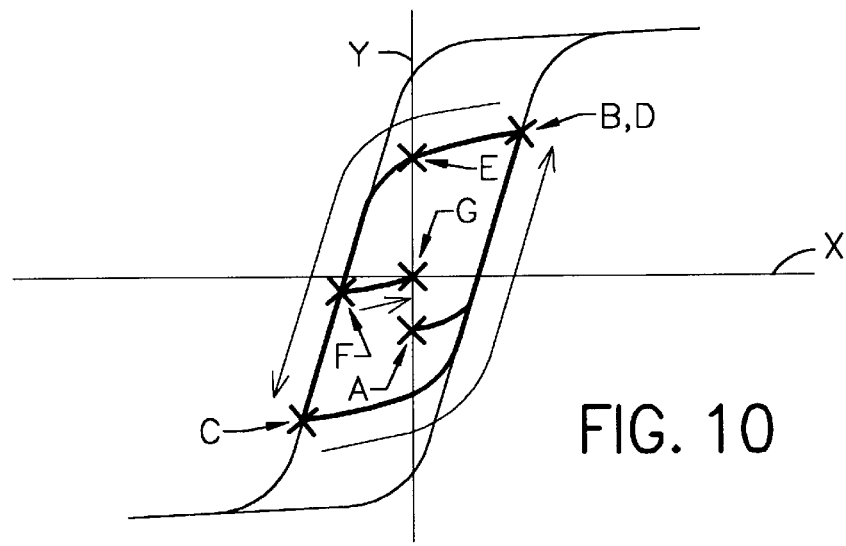
FIG. 10 shows a hysteresis curve sequence that illustrates how a magnetic body may be demagnetized without driving the magnetic body into saturation. This method is not dependent on knowing properties of a magnetic body beforehand.

FIG. 10 shows a method to demagnetize a magnetic body regardless of whether current is adequate to drive the magnetic body to saturation. Again, sequence point A is assumed for a starting point. In order to be certain that the magnetic core is not originally magnetized to a level higher than the induction level attainable during the "first phase," at least one complete cycle of an alternating current is first applied. This forces the magnetic core first to point B, then down to point C, cycling (almost) once around its hysteresis loop, thereby removing the previous induction level. Then, the current is made to alternate again to drive the induction level back to point D, but this time the induced voltage of the winding is integrated over the time required for the transition, and a "volt-time value" is calculated from this to determine the magnitude and duration of a voltage pulse that will move the induction level from point D to point F. The following "second phase" uses the "volt-time value" just calculated to move the induction level from point D (through point E) to point F and then to point G, which is close to an induction level of zero. Point E is included for later reference, and indicates the zero-crossing point of current.

Figure 11:
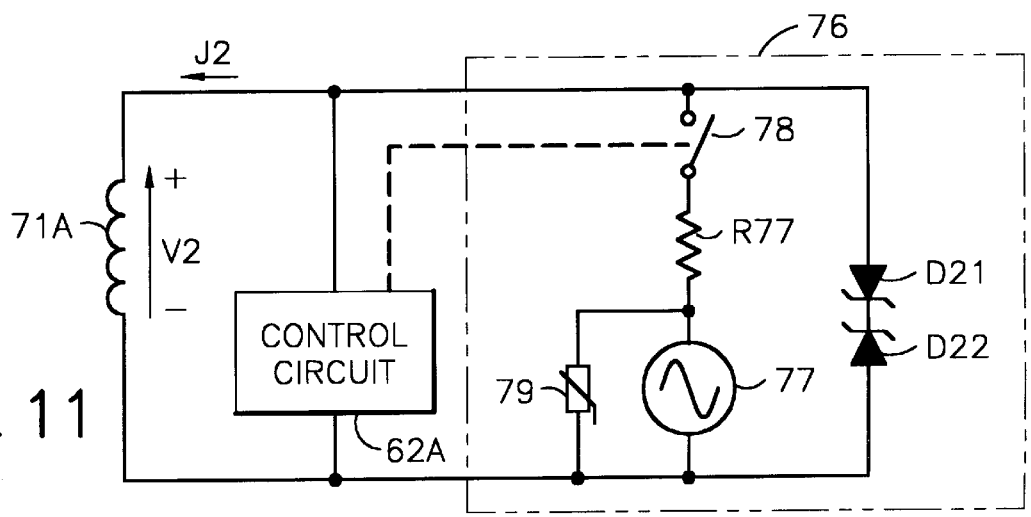
FIG. 11 shows a very simple embodiment of a controllable electric energy source that can be used to carry out the hysteresis curve sequence shown in FIG. 10.

FIG. 11 shows a relatively simple embodiment of the invention utilizing a controllable electric energy source 76. A winding 71A conducts current J2 and interacts with a magnetic body (not shown). The winding may be similar to windings 61 and 71 of FIGS. 1 and 2. A switch 78 is used to connect and disconnect an alternating voltage source 77 to winding 71A. Switch 78 will preferably be a solid-state electronic switch able to stop current flow mid-cycle. Alternating voltage source 77 may simply be a source of 60 Hertz electric power with suitable voltage magnitude. An optional resistor R77 may be included to limit peak current levels. An optional varistor 79, or other transient voltage suppression device may be included to limit transient voltages when switch 78 is opened. A control circuit 62A senses voltage V2 and controls switch 78. Zener diodes D21 and D22 have breakover voltages somewhat higher than the peak voltage of alternating voltage source 77. Zener diodes D21 and D22 may be omitted, in which case switch 78 should be configured to be to able to absorb the high momentary voltage associated with stopping current J2 very quickly. Alternatively, almost any kind of surge suppressor or impedance could be used in place of the zener diodes, but zener diodes are shown for ease of illustration and explanation. One simple method of operation is illustrated by FIGS. 12A to 12C.

FIGS. 12A to 12C show one way that the configuration shown in FIG. 11 may utilize an alternating voltage and current to implement a sequence similar to the hysteresis curve sequence of FIG. 10. FIG. 12A shows voltage V2, which (prior to time T74) is merely the sinusoidal voltage generated by alternating voltage source 77 (less any voltage drop across resistor R77). FIG. 12B shows current J2, which is not quite sinusoidal due to hysteresis characteristics of the magnetic body. FIG. 12C shows induction level. Switch 78 (FIG. 11) is closed prior to time T71, and any transient d-c offset currents that may be associated with closing switch 78 have already decayed prior to time T71.

Refer now to FIGS. 10, 11, and 12A to 12C. Between times T71 and T72 the operation is in a steady-state alternating cycle. At time T72 the induction level is at a positive peak (FIG. 12C), corresponding to sequence point D of FIG. 10. The induction level then declines to an induction level corresponding to point F at time T74, at which time switch 78 is opened by control circuit 62A. A small negative current is flowing at time T74, and this current is forced to flow through zener diodes D21 and D22 after switch 78 opens (the current keeps flowing due to the inductive nature of winding 71A). This causes a positive voltage pulse between times T74 and T75 with area A8 (FIG. 12A), which is associated with a transition from point F to point G of FIG. 10, at which point current J2 has declined to zero and the induction level is near zero.

Similar to area A3 of FIG. 8B being twice the volt-time constant, area A6 of FIG. 12A is twice the volt-time value associated with a change in induction level from the peak induction level to an induction level near zero. The actual peak induction level may be calculated from the volt-time value using equation no. 7 (above). For optimum demagnetizing operation, the timing of the opening of switch 78 should be such that area A7 minus area A8 equals half of area A6.

Referring to FIG. 12A, time T74 (the time that switch 78 is opened) should be somewhat past the geometric middle of the half-cycle for best results. However, the demagnetizing operation will be satisfactory for many applications if the switch is simply opened near the geometric middle of the half-cycle. "Geometric middle of the half-cycle" is intended to mean the point of time at which the volt-time integral of the half-cycle would be divided into two equal parts (visually this would be the time at which area A7 would be exactly half of area A6).

Referring to FIGS. 10, 11 and 12A to 12C, preferred induction levels other than zero may be obtained by changing the time that switch 78 is opened. For example, if switch 78 is opened any time between T72 and T73, the final induction level will be at sequence point E of FIG. 10, which is close to the peak induction level reached at point D. Using this method (turning an alternating voltage source off within a window of time approximately between the end of a half-cycle alternating voltage and the end of a corresponding half-cycle of alternating current), almost any induction level may be established by merely varying the magnitude of the output voltage of the alternating voltage source so that the peak induction level is equal to, or somewhat greater than, the preferred induction level. A simple variable transformer connected to a standard 50 or 60 Hertz a-c power system may be used for the voltage source in many applications. A simple switching means may be implemented with silicon-controlled rectifiers controlled by a manual switch. The silicon-controlled rectifiers can be easily configured to automatically disconnect the power supply at the first natural current-zero (such as at time T73 of FIG. 12B) after the manual switch is opened. If polarity of induction is significant to the application, then the silicon-controlled rectifiers should be configured to open at the first current-zero point after a half-cycle having the appropriate polarity.

Preferred induction levels other than zero may also be established by opening switch 78 at other points of time during the same half-cycle. Opening switch 78 between times T73 and T74 will result in induction levels between point E and an induction level of zero, depending on the specific point of time that switch 78 is opened. Opening switch 78 after T74, but still during the same half-cycle, will result in induction levels with opposite polarity.

The waveforms shown in FIGS. 12A to 12C are waveforms typically associated with peak induction levels being less than saturation induction levels. In the case that the voltage magnitude of alternating voltage source 77 is sufficient to drive the magnetic body to saturation, the alternating waveforms shown prior to T74 may be considerably different than those shown, but the principles of operation are similar.

It should be noted that operation may be somewhat improved if energy source 76 were modified to use an alternating current source rather than an alternating voltage source, since using the "first principle" without reaching saturation induction levels requires positive and negative current peaks that are approximately equal. Using a current source instead of a voltage source would virtually eliminate the need to wait for transient d-c offset currents to decay (one cycle around the hysteresis loop with equal and opposite current peaks should eliminate the effects of any previous magnetization). However, since voltage sources are more commonly available (and less expensive), and are usually easier to control, a voltage source is presently preferred. Transient d-c offset currents decay more quickly as the voltage magnitude of alternating voltage source 77 increases to levels sufficient to saturate the magnetic body. In the case that the voltage magnitude of alternating voltage source 77 is sufficient to drive the magnetic body to saturation (at both ends of its hysteresis curve), then transient d-c offset currents are no longer a problem, since peak current becomes dependent mostly on the total resistance of the circuit (resistor R77 plus stray resistances) rather than magnetic effects.

Even though alternating voltage sources are very easy to implement, some applications will find the benefits of an alternating current source to be worth the extra cost. If a true current source is used in place of alternating voltage source 77, then the switching configuration will need to be modified somewhat from that shown in FIG. 11, but the principles of operation will be similar. Alternatively, alternating voltage source 77 and resistor R77 may be configured to act like a current source by configuring alternating voltage source 77 to have a relatively high voltage magnitude (several times the magnitude required for voltage V2) and by configuring resistor R77 to have relatively high resistance so that the voltage drop across resistor R77 is large compared to typical magnitudes of voltage V2. Of course the actual parameters used are dependent on the particular application.

In the case that alternating voltage source 77 and resistor R77 are configured to operate similar to a current source (as just described), then current J2 would be approximately sinusoidal prior to time T74 (rather than a distorted sine wave as shown in FIG. 12B), and the waveforms of voltage V2 (FIG. 12A) and induction level (FIG. 12C) would be distorted instead, the level of distortion being dependent on the hysteresis properties of the magnetic body and peak magnitude of current J2.

FIG. 13 shows a functional schematic illustrating how an adjustable impedance 2 may be used as part of a current transformer demagnetizing circuit 1. Demagnetizing circuit 1 includes a control circuit 3 and an adjustable impedance 2 comprising electronic switches S1, S2 and S3 and zener diodes D1 and D2. Electronic switches S1, S2 and S3 are controlled by control circuit 3 as indicated by the dashed lines between switches S1, S2 and S3 and control circuit 3.

The configuration shown for adjustable impedance 2 is for illustration purposes only, and is not intended to define all possible configurations of the present invention. It may be noted that switch S1 is optional, since closing switches S2 and S3 at the same time approximates the effect of closing switch S1.

FIG. 13 shows a current transformer CT1 which may have a magnetic core similar to magnetic body 60 of FIG. 1 and a secondary winding similar to winding 61 of FIG. 1. Conductor 64 is a primary conductor conducting a primary current J1, also similar to FIG. 1. Current J1 is an alternating electric current flowing as part of a larger system. Current J1 causes secondary current J2 to flow by the transformer action of current transformer CT1. Current J2 is normally proportionally smaller than current J1 by the turns ratio of current transformer CT1. Under ideal conditions, the waveform of current J2 is virtually the same as the waveform of current J1.

Resistor R1 is a current-sensing resistor, connected in series with current J2, thereby producing a voltage signal across resistor R1 that is proportional to current J2. This voltage signal, conducted by conductor 15, is usually used as an input to some kind of current monitoring system as provided for by terminal 16. This voltage signal may also be used as an input to control circuit 3 as is presently shown. Other kinds of current-sensing means may be used in place of resistor R1.

A power supply 4 is configured to derive power from input current J2 whenever switch S4 is closed and switches S1, S2 and S3 are open. Power supply 4 and switch S4 are optional (switch S4 may be optional even if power supply 4 is included, depending on the configuration of power supply 4). If power is not derived from current J2, a separate source of power will usually be required to provide operating power to control circuit 3. Power is supplied to control circuit 3 via one or more conductors 13 and common conductor 11, the total number of power conductors being dependent on the specific design of control circuit 3 and power supply 4. Terminals 12 and 14 are included to provide for the possibility of power being transferred to or from other circuits.

Conductor 17 and terminal 18 provide for a control signal to or from a larger system to coordinate current-sensing and demagnetizing modes. A demagnetizing mode may be initiated by either control circuit 3 or the larger system. The specific function of this control interface will depend on the specific design of the overall system. It may be practical to omit this control interface in some applications. If power supply circuit 4 is included, the control interface may additionally provide for coordination of the power supply charging mode. More conductors and terminals may be provided for additional control signals depending on the specific design.

Voltage V2 is now the voltage across the secondary winding of current transformer CT1. This voltage is shown connected as an input to control circuit 3 via conductor 15 and conductor 19.

Optional ground connection 10 provides a stable signal reference potential for common conductor 11.

FIGS. 14A to 14E illustrate the preferred operation of FIG. 13. The magnetic sequence utilized is similar to the sequence shown by the hysteresis curve of FIG. 3, utilizing "first-phase method a" and "second-phase method b." Three different operating modes are shown. First, from time T1 to time T2 the power supply charging mode is active. Second, from time T2 to time T10 the demagnetizing mode is active. Third, after time T10 the current-sensing mode is active. Actual test waveforms may vary somewhat from those shown depending on the specific power supply configuration, current transformer characteristics, and current magnitudes.

FIG. 14A shows current transformer CT1 primary current J1 as a simple sine wave for simplicity of illustration, though in many applications it may be considerably distorted.

FIG. 14B shows secondary current J2. Current magnitudes hive been normalized for simplicity of illustration. Current J2 is normally many times smaller than current J1, as influenced by the turns ratio of current transformer CT1.

FIG. 14C shows operation of electronic switches S1, S2, S3 and S4 as controlled by control circuit 3. Dark lines indicate time periods during which each switch is closed. Blank spaces indicate time periods during which each switch is open.

FIG. 14D shows secondary voltage V2. The voltage across resistor R1 is normally small compared to voltage V2, and no attempt has been made to show its minor influence on V2.

FIG. 14E shows induction level with a scale similar to the hysteresis curve shown in FIG. 3.

The operating cycle illustrated begins with the functional schematic of FIG. 13 being in the power supply charging mode. Between times T1 and T2 of FIGS. 14A to 14E, only switch S4 is closed, and power supply 4 is charging. The waveforms shown between time T1 and T2 are based on the assumption that power supply 4 has some kind of full-wave rectifier, a charging capacitor, and a voltage-limiting means. Actual test waveforms may vary depending on the power supply configuration, current transformer characteristics, and current magnitudes. The waveforms shown in FIGS. 14B and 14D between times T1 and T2 are discussed in more detail in U.S. Pat. No. 6,018,700.

At time T2 of FIGS. 14A to 14E, the operating mode changes to the demagnetizing mode. The entire demagnetizing mode continues until time T10. The "first phase" of the demagnetizing mode lasts from time T2 to time T7, during which time control circuit 3 sets adjustable impedance 2 to drive the magnetic core of current transformer CT1 to a known state of magnetization, preferably near saturation.

Time T2 may be a somewhat random time, here shown to be at the zero crossing of current J1 for ease of illustration. At time T2, the magnetic induction level of current transformer CT1 generally is not known. This corresponds to a randomly chosen point A on the hysteresis curve of FIG. 3. At time T2, switch S2 closes and switch S4 opens to set adjustable impedance 2 to the nonlinear characteristics of zener diode D1. This causes voltage V2 to be large and positive for current J2 with positive polarity, and small and negative for current J2 with negative polarity. The large positive voltage causes the magnetic core of current transformer CT1 to transition to saturation, as indicated by point B of FIG. 3.

Switch S2 is kept closed for a time period that is long enough (until time T7) to ensure that the magnetic core reaches saturation, which is a known level of induction.

At time T3 of FIGS. 14A to 14E, current J2 begins a negative half-cycle with voltage V2 then primarily being the forward voltage drop of zener diode D1. This small voltage drop is not desirable, since it drives the current transformer core away from saturation. Though it is not necessary to do so, it is preferable to reduce this negative voltage by closing switch S1 for the duration of the negative half-cycle (as shown in FIGS. 14C and 14D).

At time T4 of FIGS. 14A to 14E, current J2 ends its negative half-cycle and switch S1 is again turned off so that zener diode D1 will again be active and continue to drive the current transformer toward saturation.

At time T5 of FIGS. 14A to 14E, the magnetic core of current transformer CT1 approaches saturation, and voltage V2 and current J2 quickly drop to zero as current transformer CT1 can no longer generate secondary voltage to maintain current J2. When control circuit 3 senses current J2 turning negative again, switch S1 is again turned on to minimize the negative voltage.

At time T6 of FIGS. 14A to 14E, control circuit 3 senses current J2 starting to turn positive and turns switch S1 off again. Since the magnetic core is still very near saturation, voltage V2 cannot be sustained and current J2 remains near zero.

The predetermined minimum time required for the first phase ends some time between times T5 and T7. After this time period ends, control circuit 3 looks for the beginning of a negative half-cycle of current J2.

The "second phase" begins at time T7 of FIGS. 14A to 14E when control circuit 3 senses current J2 going negative. At time T7, switch S3 closes and switch S2 opens. This sets adjustable impedance 2 to the nonlinear characteristics of zener diode D2. This causes voltage V2 to be large and negative for current J2 with negative polarity, and small and positive for current J2 with positive polarity. At time T7 a first-step voltage pulse begins, the magnitude of which is the breakover voltage of zener diode D2. Control circuit 3 keeps switch S3 closed for a predetermined time period that correlates with the volt-time value associated with a transition from point B to point C of FIG. 3.

At time T8 of FIGS. 14A to 14E, the predetermined time limit is reached and control circuit 3 closes switch S1 to cause voltage V2 to drop to almost zero, thereby stopping the first-step voltage pulse.

An optional second-step voltage begins at time T9 of FIGS. 14A to 14E when control circuit 3 senses J2 starting to turn positive. Switch S2 is closed briefly and switch S1 is opened to cause a second-step voltage pulse of opposite polarity to the first. This brings the final operating point of the magnetic core even closer to the origin of FIG. 3. This will normally be a very brief voltage pulse, stopping at time T10. Point D of FIG. 3 indicates the final operating point of the magnetic core.

At time T10 of FIGS. 14A to 14E, switch S1 is closed again to allow current to flow freely. Current J2 through resistor R1 is now an accurate representation of primary current J1 and the system now enters the current-sensing mode. After current J2 is sensed for one or more cycles (as the voltage across resistor R1) the power supply charging mode may be initiated again to recharge power supply 4, and the entire cycle may be repeated.

Operation without power supply 4 is similar, except that the initial power supply charging cycle will not be part of the sequence.

In FIG. 14D, voltage pulses between times T7 and T8 and between times T9 and T10 cause the induction level to transition from saturation to an induction level near zero. Area A9 minus area A10 should correspond to the volt-time constant of current transformer CT1. It is important that control circuit 3 be able to control adjustable impedance 2 so that the integral of voltage over time for each second-phase voltage pulse is a particular value for each particular type of current transformer. To facilitate this, it may be preferable to configure control circuit 3 to directly monitor voltage V2 via conductors 15 and 19 (as shown in FIG. 13). However, it will usually suffice to monitor only current J2 (via the voltage signal on conductor 15, the voltage, across resistor R1), with the magnitude of voltage V2 known to be the applicable zener diode voltage drop, as determined by the status of the electronic switches (S1, S2, S3, S4) and the direction of current J2. With this type of operation, the conductor 19 input connection to control circuit 3 may be eliminated, and voltage V2 is not an input to control circuit 3. The magnitude of current J2 is then the only feedback signal to control circuit 3 used to accurately time voltage V2 reset pulses within particular half-cycles.

While it is preferable for control circuit 3 to have current J2 and/or voltage V2 as a feedback signal, it is possible for control circuit 3 to operate without any feedback signal. This could be accomplished by modifying the first-step voltage pulse of the second phase (between times T7 and T8 of FIG. 14D) in either of the following ways:

(a) The time period that zener diode D2 is active could be extended to one or more complete cycles, with the zener diode breakover voltage adjusted so that the net integral of voltage over time is the same value as previously. Lengthening duration to one or more complete cycles in this way allows the switching to occur without regard to actual half-cycle time intervals. This method has the drawback that each kind of current transformer utilized may require different voltage magnitudes for the reset pulses. This method of operation is illustrated by FIGS. 15A to 15E.

(b) The negative voltage pulse could be split into several shorter intervals divided over one or more complete cycles. Spreading out the time that zener diode D2 is active over one or more complete cycles in this way allows the switching to occur without regard to actual half-cycle time intervals. This method of operation is illustrated by FIGS. 16A to 16E.

In both cases "A" and "B," control circuit 3 operates without feedback signals related to secondary voltage V2 or secondary current J2.

For both FIGS. 15A to 15E and FIGS. 16A to 16E, from time T1 to T6, operation is similar to FIGS. 14A to 14E. FIGS. 15A to 15E illustrate "first-phase method a" and "second-phase method a," while FIGS. 16A to 16E illustrate "first-phase method a" and "second-phase method b."

Referring now to FIGS. 15A to 15E, at time T11 the second phase begins at a random time in the middle of a half-cycle when the first phase times out. The second phase lasts for a whole cycle, but the zener diode reverse voltage occurs for only about half of the total time. The breakover voltage of zener diode D2 is set so that the integral of the voltage over the time period between times T11 and T12 is approximately equal to the volt-time constant. The demagnetizing effect of the voltage waveform shown in FIG. 15D (between times T11 and T12) is similar to the voltage pulse shown in FIG. 14D (between times T7 and T8).

At time T12 of FIGS. 15A to 15E, the current-sensing mode begins. The optional second-step voltage is not intentionally included in the operation shown in FIGS. 15A to 15D, though a similar effect is seen due to the random timing nature of the cycle shown. An intentional second step could be included by adding circuitry to generate a small voltage (with a positive average magnitude) over the one-cycle time period following time T12 (the current-sensing mode being delayed for this additional time).

Referring now to FIGS. 16A to 16E, at time T11, the second phase again begins at a random time in the middle of a half-cycle when the first phase times out (similar to FIGS. 15A to 15D). Zener diode D2 is activated briefly several times over one cycle (between times T11 and T12) to generate a voltage V2 waveform (FIG. 16D) such that the integral of the voltage over the time period between times T11 and T12 is approximately equal to that of FIG. 14D between times T7 and T8. Stated another way, zener diode D2 is made active with a pulse-width-modulated type of control (controlling switches S1 and S3) to cause voltage V2 to have an average negative value suitable for the first step of the second phase (between times T11 and T12). The demagnetizing effect of the multiple pulses shown in FIG. 16D (between times T11 and T12) is similar to the single voltage pulse shown in FIG. 14D (between times T7 and T8).

At time T12 of FIGS. 16A to 16E, the optional second-step voltage begins. Similar to the first-step voltage between times T11 and T12, zener diode D1 is made active with a pulse-width-modulated type of control (controlling switches S1 and S2) to cause voltage V2 to have an average positive value suitable for the second step (between times T12 and T13). The effect of the multiple pulses shown in FIG. 16D (between times T12 and T13) is similar to the single voltage pulse shown in FIG. 14D (between times T9 and T10).

At time T13 of FIGS. 16A to 16E, the current-sensing mode begins.

Figure 17:
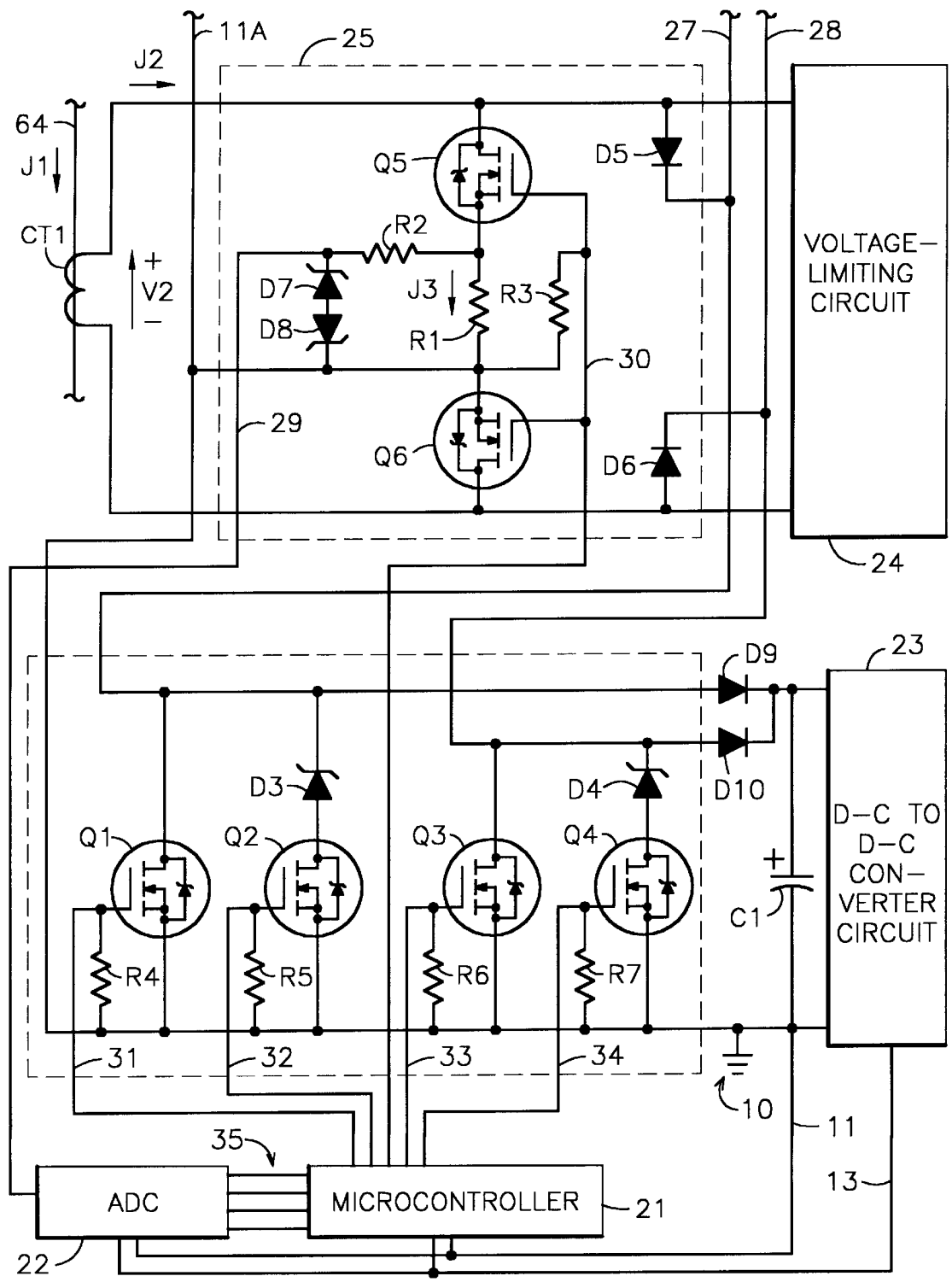

FIG. 17 shows one possible embodiment of a current transformer demagnetizing circuit based on the functional schematic of FIG. 13. Components that are common to FIG. 13 function in the manner previously described. The demagnetizing circuit shown is incorporated into a current monitoring circuit that derives power from current transformer CT1 secondary current J2. The electronic switches previously shown in the functional schematic of FIG. 13 are now implemented with field-effect transistors. The preferred embodiment utilizes N-channel enhancement mode devices with low drain-source on resistance and sensitive gates for operation at logic voltage levels.

The power supply circuit includes a full wave bridge rectifier circuit consisting of diodes D5 and D6 and the drain-source diodes within field-effect transistors Q5 and Q6. The rectified current charges capacitor C1, which provides an unregulated voltage for use by a d-c to d-c converter circuit 23. A voltage-limiting circuit 24 limits the voltage on capacitor C1 to a safe level. These power supply circuits are discussed in more detail in U.S. Pat. No. 6,018,700.

The function of field-effect transistors Q5 and Q6 is similar to electronic switch S1 of FIG. 13 Resistor R1 is still a current-sensing resistor, but in this configuration current J2 flows through resistor R1 only when field-effect transistors Q5 and Q6 are actuated. Since the current through resistor R1 is not always the same as J2, it is shown as current J3. Conductor 29 conducts a voltage signal that is proportional to the current through resistor R1. Resistor R2 and zener diodes D7 and D8 form an optional surge suppression network to protect an analog-to-digital converter circuit 22. The resistance of resistor R2 must be small compared to the input resistance of analog-to-digital converter circuit 22 so that accuracy of the voltage signal will not be adversely affected. Analog-to-digital converter circuit 22 and a microcontroller 21 function in a manner similar to control circuit 3 of FIG. 13. Data is communicated between analog-to-digital converter circuit 22 and microcontroller 21 via serial or parallel communication utilizing several conductors 35.

The function of field-effect transistors Q2, Q3 and zener diode D3 is similar to electronic switch S2 and zener diode D1 of FIG. 13. The function of field-effect transistors Q1, Q4 and zener diode D4 is similar to electronic switch S3 and zener diode D2 of FIG. 13. Though separate control conductors 31, 32, 33, and 34 are shown to each of these transistors, control conductors 32 and 33 to field-effect transistors Q2 and Q3 could be combined into one conductor for most applications (since the control signals are usually identical). Likewise, control conductors 31 and 34 to field-effect transistors Q1 and Q4 could be combined into one conductor for most applications.

Capacitor C1 is normally charged to a higher voltage than the breakover voltage of zener diodes D3 and D4. Diodes D9 and D10 prevent capacitor C1 from discharging while the demagnetizing mode is active. The function of switch S4 in FIG. 13 is not required in the embodiment of FIG. 17, since the power supply is configured to automatically charge whenever the current-sensing mode and demagnetizing mode are not active.

Resistors R3, R4, R5, R6, and R7 provide a discharge path for gate charge on the associated field-effect transistors. These may be optional depending on the configuration of microcontroller 21.

More than one current transformer (each having a unique primary current) may be connected to the configuration of FIG. 17 by duplicating the components within box 25 and voltage-limiting circuit 24 for each current transformer. These components may be connected to conductors 11A, 27, and 28 similar to the configuration shown for current transformer CT1. Additional connections to analog-to-digital converter circuit 22 and microcontroller 21 will also be needed for each current transformer, similar to conductors 29 and 30 for current transformer CT1. With additional current transformers configured similar to current transformer CT1, each current transformer may contribute power to the power supply. Each current transformer may be demagnetized, one at a time, with the other current transformers set to current-sensing mode (by actuating the equivalent of field-effect transistors Q5 and Q6 for the other current transformers).

FIGS. 18A to 18E illustrate preferred operation of the embodiment shown in FIG. 17. The operation shown is similar to the operation described in FIGS. 14A to 14E, utilizing "first-phase method a" and "second-phase method b." The embodiment shown in FIG. 17 may also be operated in a manner similar to that described for FIGS. 15A to 15E or FIGS. 16A to 16E.

Figure 18:
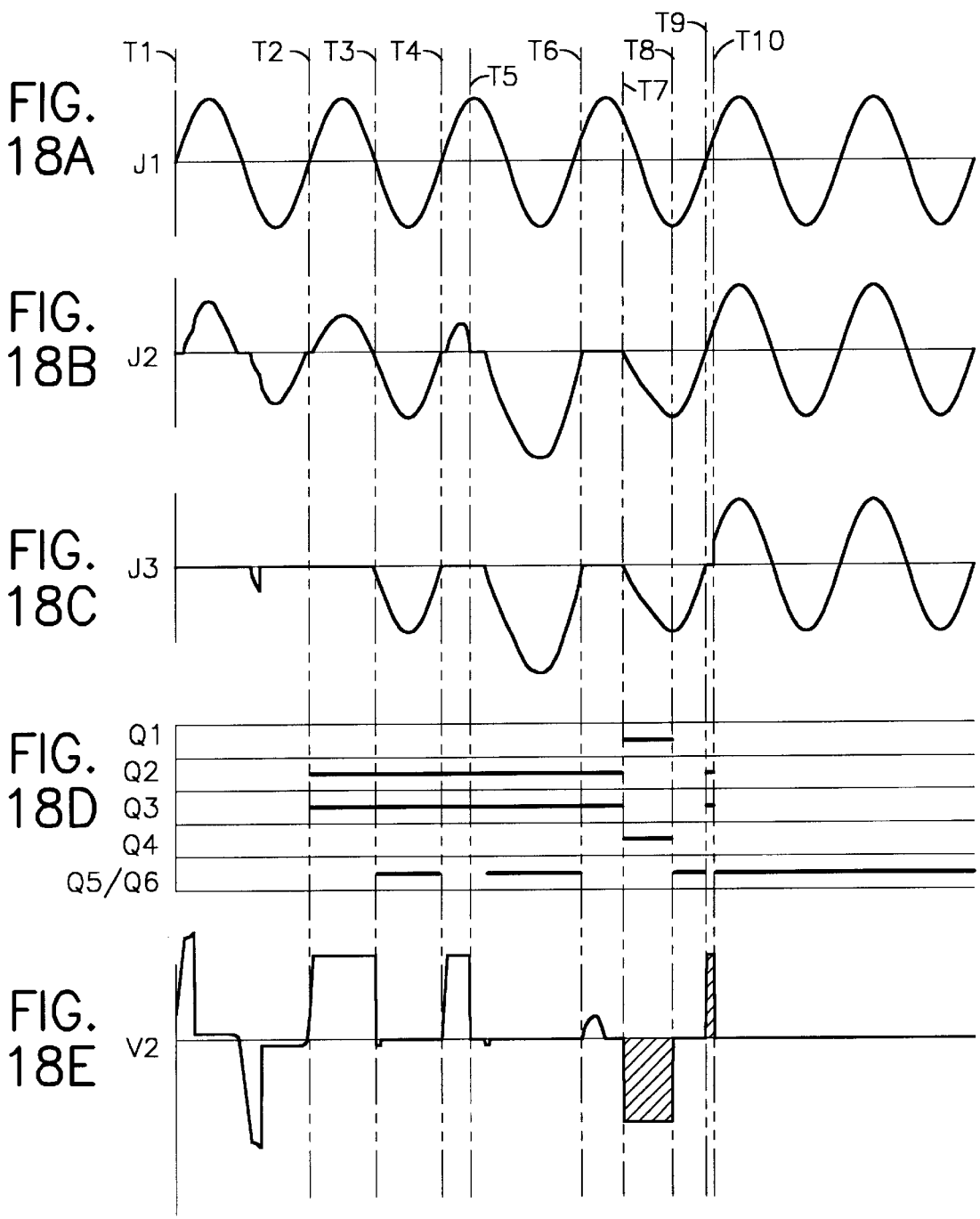

FIG. 18A shows alternating electric current J1, similar to FIG. 14A.

FIG. 18B shows secondary current J2, similar to FIG. 14B.

FIG. 18C shows current J3 through current-sensing resistor R1. Current J3 is seen to be equal to current J2 whenever field-effect transistors Q5 and Q6 are actuated.

FIG. 18D shows the time periods that the field-effect transistors are actuated. A solid line indicates a high gate voltage, whereas a blank space indicates a low gate voltage. The switching sequence shown is functionally similar to FIG. 14C.

FIG. 18E shows secondary voltage V2, similar to FIG. 14D.

Figure 19:
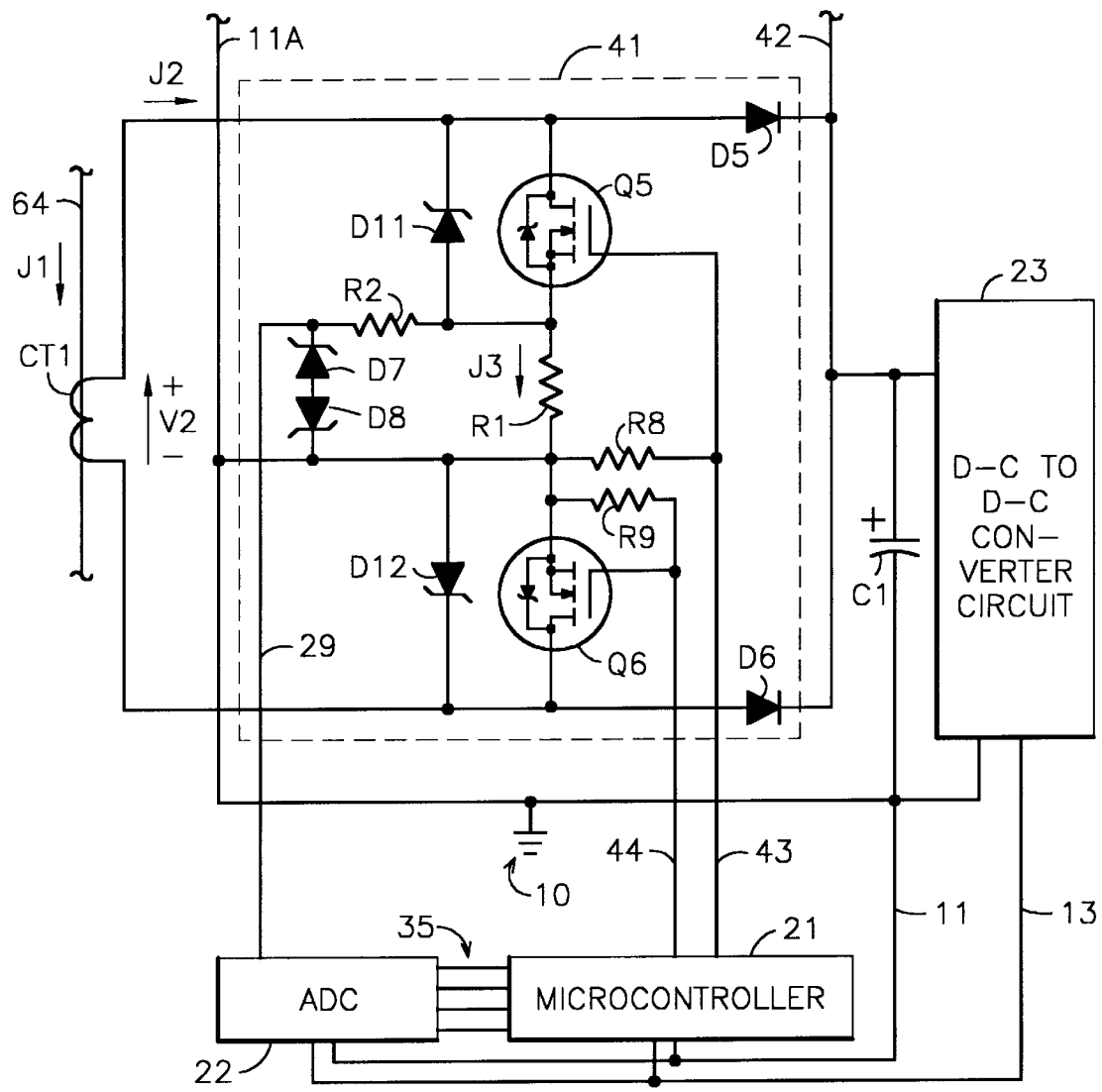

FIG. 19 shows another embodiment of a current transformer demagnetizing circuit. This is simpler than the embodiment of FIG. 17, and most of the components are common to FIG. 17. These common components function in the manner previously described.

Zener diodes D11 and D12 are new, and these function in a manner similar to zener diodes D1 and D2 of FIG. 13. Zener diodes D11 and D12 also act as voltage-limiting devices to limit the charge on power supply capacitor C1. These diodes may dissipate a significant amount of power in their voltage-limiting mode, and that is one of the weaknesses of this embodiment relative to the embodiment of FIG. 17 (this weakness only applies to self-powered applications).

Field-effect transistors Q5 and Q6 are now the only transistors required, and these perform the switching functions of switches S1, S2, and S3 of FIG. 13. Field-effect transistors Q5 and Q6 are now individually controlled, with resistors R8 and R9 providing a discharge path for gate charge (these resistors may be optional depending on the configuration of microcontroller 21). Activating field-effect transistor Q6 is similar to closing switch S2 of FIG. 13. Activating field-effect transistor Q5 is similar to closing switch S3 of FIG. 13. Activating both field-effect transistors Q5 and Q6 is similar to closing switch S1 of FIG. 13. When both field-effect transistors Q5 and Q6 are deactivated the system is in the power supply charging mode and zener diodes D11 and D12 limit the voltage on capacitor C1.

The power supply may be easily eliminated if an alternate power source is available for control power. This may be done by removing diodes D5 and D6, Capacitor C1, and d-c to d-c converter circuit 23.

More than one current transformer (each normally having a unique primary current) may be connected to the configuration of FIG. 19 by duplicating the components within box 41 for each current transformer. These components may be connected to conductors 11A and 42, similar to the configuration shown for current transformer CT1. Additional connections to analog-to-digital converter circuit 22 and microcontroller 21 will also be needed for each current transformer, similar to conductors 29, 43, and 44 for current transformer CT1. With additional current transformers configured similar to current transformer CT1, each current transformer may contribute power to the power supply. More than one current transformer may be demagnetized at a time, assuming analog-to-digital converter circuit 22 and microcontroller 21 are capable of the faster processing and communication required for this (unique control signals are preferred for each current transformer in order to implement feedback control similar to FIGS. 14A to 14D). If a non-feedback type of control is utilized (similar to FIGS. 16A to 16E), then only two control conductors (43 and 44) may be used to simultaneously demagnetize all current transformers at once with little demand on the microcontroller.

FIGS. 20A to 20D illustrate the operation of the embodiment shown in FIG. 19. The operation shown is similar to the operation described in FIGS. 14A to 14E, utilizing "first-phase method a" and "second-phase method b." The embodiment shown in FIG. 19 may also be operated in a manner similar to that described for FIGS. 16A to 16E. Since zener diodes D11 and D12 must have similar characteristics in order for the power supply to function properly, non-feedback operation similar to FIGS. 15A to 15E is only practical if both zener diodes have a breakover voltage corresponding to the specific voltage required for operation during the second phase (between time T11 and T12).

FIG. 20A shows alternating electric current J1, similar to FIG. 14A.

FIG. 20B shows secondary current J2, similar to FIG. 14B.

FIG. 20C shows the time periods that the field-effect transistors are actuated. A solid line indicates a high gate voltage, whereas a blank space indicates a low gate voltage. The switching sequence shown is functionally similar to FIG. 14C.

FIG. 20D shows secondary voltage V2, similar to FIG. 14D. However, now the voltage-limiting circuit is comprised of zener diodes D11 and D12, so the waveforms associated with the power supply charging cycle (between times T1 and T2) are different than in FIG. 14D. Also, the effect of capacitor C1 charging is evident at the beginning of each voltage pulse.

Figure 21:
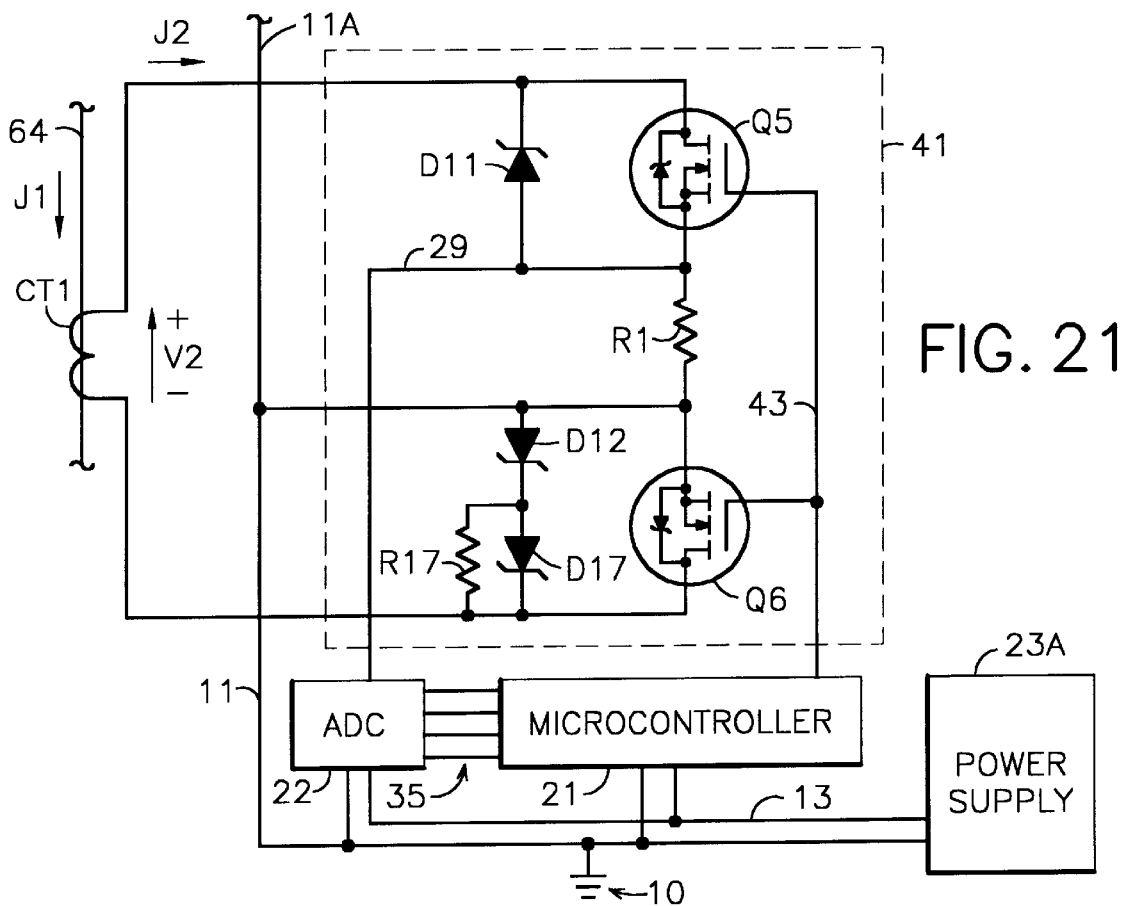

FIG. 21 shows an embodiment of a current transformer demagnetizing circuit similar to FIG. 19, but without provision for self-powered applications, and with transistors Q5 and Q6 now controlled in unison. All of the components shown are common to FIG. 19 and function in a similar manner as described for FIG. 19. All components required only for self-powered applications have been removed, so a separate source of operating power is required. A power supply 23A is now included, which provides regulated d-c operating power from a separate power source. To emphasize the simplicity of the present invention, surge suppression devices have been removed as well as gate resistors R8 and R9 (all of which may be considered optional, depending of the particular application and microcontroller configuration).

Since zener diodes D11 and D12 no longer affect power supply operation, they may now each have unique breakover voltages. The primary advantage in this is to be able to give one zener diode a relatively high voltage rating so that the first phase of the demagnetizing sequence may be completed in only a half-cycle, regardless of current transformer construction. The other zener diode may then be rated to optimize the second phase of the demagnetizing cycle. It may also be advantageous to add additional impedance components to customize the adjustable impedance to have nonlinear characteristics that complement the nonlinear hysteresis characteristics of a particular magnetic body or type of magnetic material. FIG. 21 illustrates this concept by adding zener diode D17 and resistor R17 in parallel with each other and in series with zener diode D12. This particular impedance structure is intended to provide a second phase first-step voltage that increases somewhat with current level. This can facilitate using constant time periods for the first-step voltage with magnetic bodies that don't have square hysteresis curves. Higher primary currents will drive the magnetic body further into saturation, and this will be compensated for by the impedance intrinsically providing a first-step voltage of greater magnitude (due to secondary currents having greater magnitude also). This method can free the control circuit from needing to estimate or calculate peak induction levels associated with the first phase.

It should be noted that the adjustable impedance can be configured to have widely varying impedance characteristics by utilizing various types of components as impedance elements. The preferred configurations disclosed herein are not intended to limit the types of devices or the configurations that may be utilized by various embodiments of the invention.

FIGS. 23A to 23E illustrate a simple method of operation for the configuration shown in FIG. 21. FIGS. 23A to 23E will be described below after the description of FIG. 22.

Figure 22:
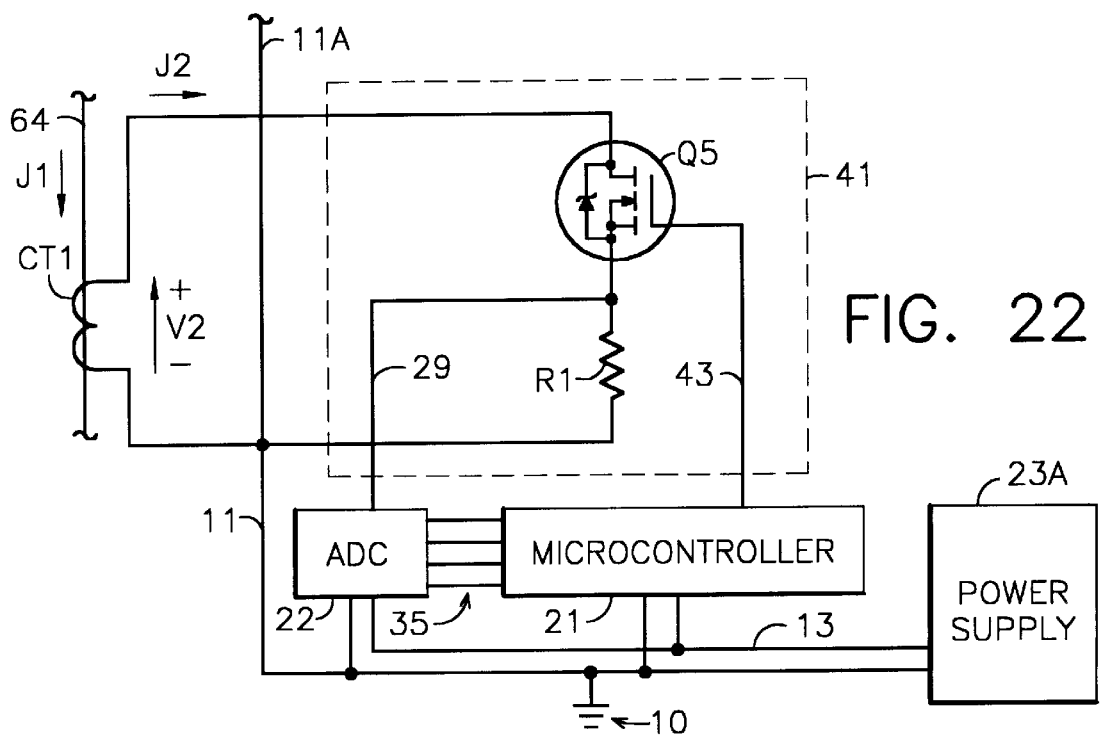

FIG. 22 shows an embodiment of a current transformer demagnetizing circuit similar to FIG. 21, but utilizing only one MOSFET transistor for an adjustable impedance. Operation is similar to FIG. 21, but now the breakover voltage of the internal body diode transistor Q5 is utilized for voltage control during the first phase, and the forward voltage drop of the body diode is used for the voltage required by the second phase. This configuration also has the advantage of the current transformer being directly connected to grounded conductor 11, which is a requirement of some safety codes for some applications. A simple method of operation for the configuration shown in FIG. 22 will be described below along with FIG. 24.

Though somewhat limited by the low voltage available for implementing the second phase (only about one volt), FIG. 22 illustrates a very simple method of implementing an adjustable impedance, and illustrates the use of a single three-terminal device as an adjustable impedance.

The main drawback to the configuration shown in FIG. 22 is that the low voltage available for the second phase will often require that the second phase be spread over several cycles. One way of increasing this voltage (and thereby reducing the time required) is to use two transistors in series with a common gate connection. This will double the second phase voltage to about 2 volts (the forward voltage drop of two diodes). Of course additional transistors could be added in series to increase the voltage still further. It should be noted from this that it is possible to make a single three-terminal semiconductor device (utilizing prior-art MOSFET technology) that has on/off parameters well suited for use as an adjustable impedance in this type of circuit.

FIGS. 24A to 24E illustrate a simple method of operation for the configuration shown in FIG. 22. FIGS. 24A to 24E will be described below after the description of FIGS. 23A to 23E.

FIGS. 23A to 23E show typical operating waveforms and control signals associated with the embodiment shown in FIG. 21. The sequence shown utilizes "first-phase method a" and "second-phase method a."

Referring to FIGS. 21 and 23A to 23E, the sequence shown starts with the system in a current-sensing mode at time T61 with both transistors Q5 and Q6 turned on to let current flow freely. To start a demagnetizing cycle, microcontroller 21 monitors current J2 (via analog-to-digital converter 22) to determine the beginning of a positive half-cycle, which occurs at time T62. At time T62 transistors Q5 and Q6 are turned off, to start the first phase. The current transformer magnetic core is quickly driven to saturation as secondary voltage rises to the breakover voltage zener diode D11. The core reaches saturation at time T63, as indicated by current J2 and voltage V2 declining quickly to zero. At time T64 the second phase begins when current J2 starts a negative half-cycle and voltage V2 changes to the voltage caused by current J2 flowing through the combination of zener diodes D12 and D17 and resistor R17. The time period from T64 to T65 is timed by the microcontroller so that the volt-time integral of voltage (area A11) is approximately the volt-time constant of current transformer CT1 (the volt-time constant is predetermined). At time T65 the induction level of the core is near zero, and transistors Q5 and Q6 are turned back on to allow current to flow freely. A "second step" voltage (for the second phase) is not implemented in this sequence, though a second step could be implemented beginning at the next transition of current J2 to a positive value. The shape of the second phase voltage (see area A11 of FIG. 23D) is no longer rectangular due to the addition of zener diode D17 and resistor R17 to the adjustable impedance.

FIGS. 24A to 24E show typical operating waveforms and control signals associated with the embodiment shown in FIG. 22. The sequence shown utilizes "first-phase method a" and "second-phase method c."

Referring to FIGS. 22 and 24A to 24E, operation is similar to that just described for FIGS. 21 and 23A to 23E, with the clarification that second phase voltage is merely the forward voltage drop of the body diode of transistor Q5. For the example shown, this voltage is not sufficient to complete the second phase transition (from saturation to an induction level near zero) in a single half-cycle of current J2. For this reason transistor Q5 must be turned on during the following positive half-cycle (from time T66 to time T67, to avoid going back to saturation), and turned off again at the beginning of the next negative half-cycle to continue moving the induction level toward zero. This type of cycling continues until time T68, at which time the induction level is near zero. The combined area of area A12, area A13, and area A14 should equal the volt-time constant.

Figure 25:
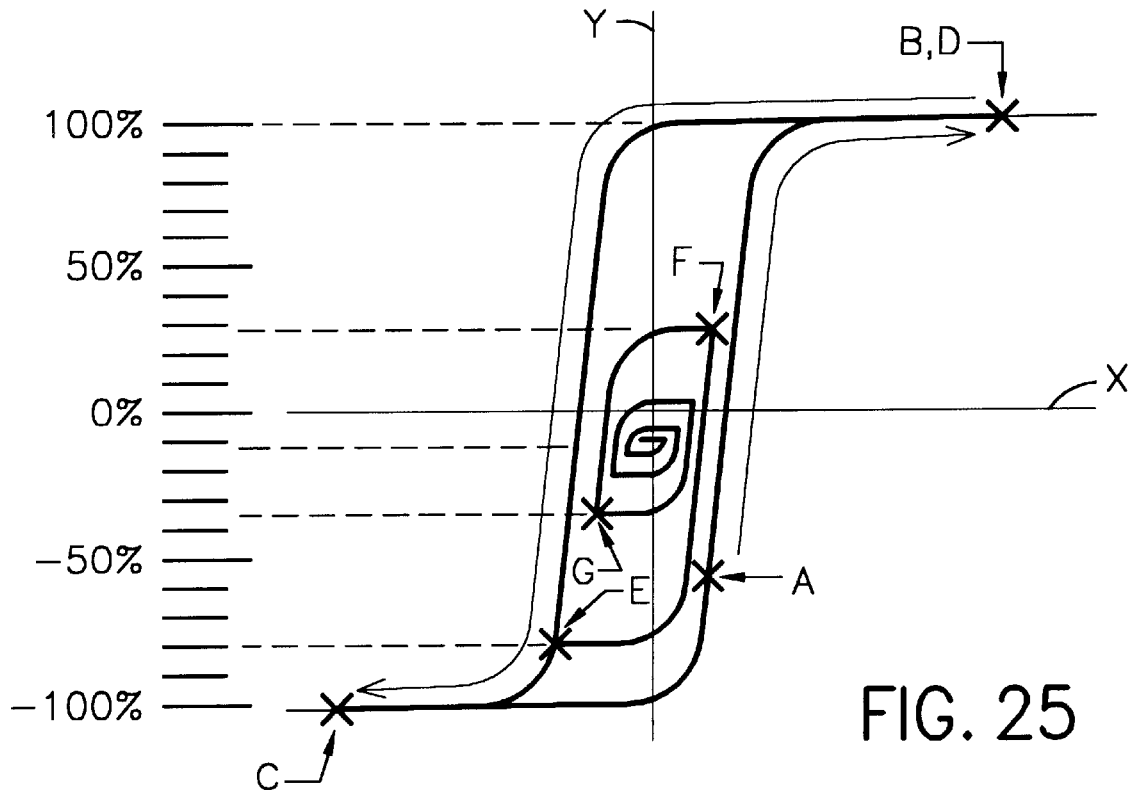
FIG. 25 shows a hysteresis curve sequence that illustrates how a diminishing alternating voltage reduces the level of induction, and some of the limitations of this method.

FIG. 25 shows a hysteresis curve that illustrates how a magnetic body may be demagnetized by using an alternating and diminishing voltage. Similar to FIGS. 4A, 6A and 8A, the sequence shown may be caused by a voltage with relatively constant magnitude and alternating polarity. In the case of FIG. 25, each successive voltage pulse of opposite polarity has a time duration about 60% as long as the previous pulse. The magnetic body starts with an unknown induction level assumed to be at sequence point A. In the case shown, the first three voltage pulses are all long enough to drive the magnetic body to saturation, so the induction level moves first to saturation at point B, than to saturation at point C, then to saturation at point D. The fourth voltage pulse is not long enough for the induction level to reach saturation, and only point E is reached, at about –80%. The fifth pulse is only able to change the induction level about 60% as much as the fourth pulse, thereby arriving at point F at about 28%. The sixth pulse moves back to point G (at about –37%), and the process continues until a final induction level of about –12% is reached.

The final induction level reached in FIG. 25 (with each pulse 60% as long the previous) is largely dependent on the induction level arrived at by the first non-saturating pulse. In this example this was the fourth pulse. With the width of the first pulse being somewhat random and not directly related to the saturation level, the first nonsaturating pulse could have ended up at an induction level anywhere between –20% and –100% or between 20% and 100%. The final induction level could have varied anywhere from about –25% to +25%.

Still considering FIG. 25, if the width of each successive pulse is changed from 60% to 90% of the previous pulse, the first nonsaturating pulse would then end up at an induction level somewhere between –80% and –100% or between 80% and 100%. The final induction level would vary from about –5% to +5%. This shows that a rapidly declining alternating voltage will probably not demagnetize a magnetic body as well as a slowly declining alternating voltage. Greater accuracy is obtained by reducing the alternating voltage more slowly.

The primary advantage of the method shown in FIG. 25 is simplicity, there being no need to determine peak induction levels. The primary disadvantage is the excessive time required to obtain good accuracy.

As with all the figures that show a hysteresis curve, the sequence shown in FIG. 25 may be implemented either with an active voltage source, or with an adjustable impedance in the secondary circuit of a transformer configuration.

Figure 26:
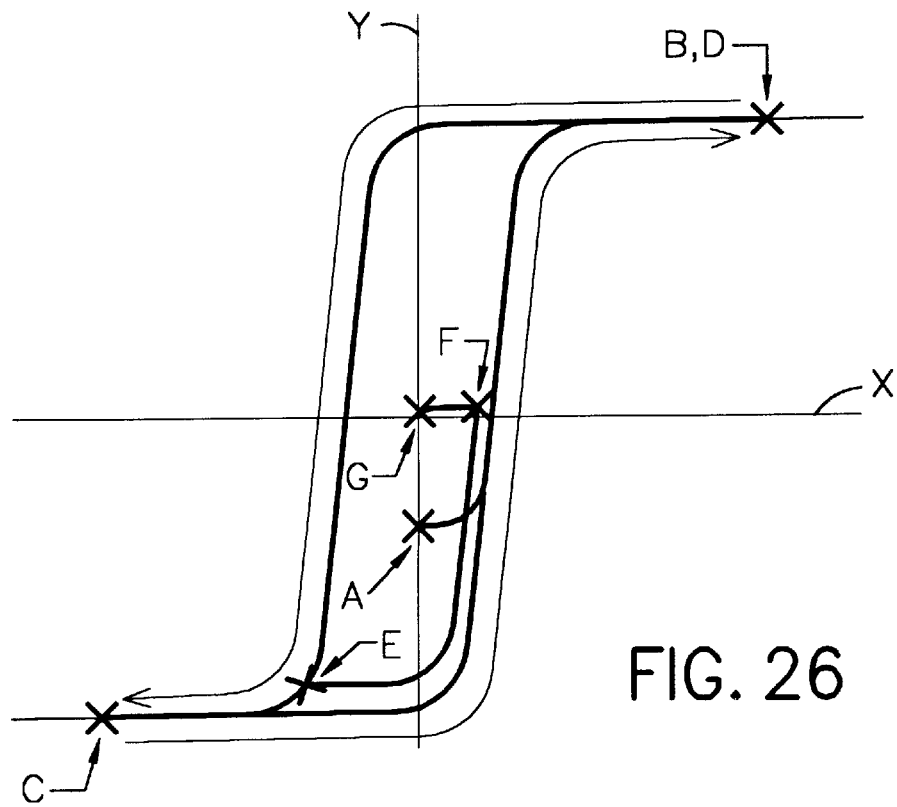
FIG. 26 shows a hysteresis curve sequence that illustrates how a diminishing alternating voltage can be combined with a "second phase" to accurately demagnetize a magnetic body.

FIG. 26 shows a hysteresis curve that illustrates another method of demagnetizing a magnetic body when the magnetic properties are not accurately known beforehand. The method begins similar to FIG. 25, but ends with a sequence similar to FIG. 3.

Referring to FIG. 26, the magnetic body begins with unknown induction level shown as sequence point A. A first phase in includes several voltage pulses, each with the same magnitude as the previous but with opposite polarity as the previous, and each successive voltage pulse being about 90% as long as the previous voltage pulse. The first voltage pulse (with polarity one) moves the induction level from point A to saturation near point B. The second voltage pulse (with polarity two) is shorter than the previous pulse by 10%, but is still long enough to drive the magnet c body to saturation at point C. The third voltage pulse (with polarity one) is shorter than the previous pulse by 10%, but is still long enough to drive the magnetic body back to saturation at point D. The fourth voltage pulse (with polarity two) is shorter than the previous pulse by 10%, but this time is not quite long enough to drive the magnetic body back to saturation. Instead it can only drive the magnetic body to point E, just short of saturation. (The control circuit senses whether saturation is reached at the end of each pulse by measuring the current at the end of each pulse). The approximate induction level at the end of the fourth pulse is now "known" due to knowing the time duration of the fourth pulse that was slightly too short to transition to saturation. The control circuit then may determine an appropriate duration for a second-phase first voltage (with polarity one in this case) simply by dividing the length of the previous pulse by two. This first-step voltage pulse, 50% as long as the fourth pulse, moves the induction level from point E to point F. Finally, a second-step voltage pulse moves the induction level from point F to point G.

The demagnetizing sequence illustrated by FIG. 26 is well suited to being implemented by an adjustable impedance in a current transformer secondary circuit, especially if the current transformer and adjustable impedance parameters are such that the magnetic core can be easily driven to saturation in less than a half-cycle of time. This case is illustrated by FIGS. 27A to 27E, which show how the adjustable impedance configuration of FIG. 13 may be utilized to implement the method shown in FIG. 26.

FIGS. 27A to 27E illustrate a variation of "first-phase method c" and "second-phase method b."

Referring to FIGS. 27A to 27E, between times T21 and T22 typical power supply charging currents and voltages are shown. Between times T22 and T24 the adjustable impedance is set to cause the first voltage pulse (of polarity one). Saturation is reached at time T23 when current J2 and voltage V2 collapse to zero. Between times T24 and T25 the adjustable impedance is set to cause the second voltage pulse (of polarity two). Saturation is reached prior to time T25 when current J2 and voltage V2 collapse to zero. The time between times T24 and T25 is about 10% less than the time set for the first voltage pulse (between times T22 and T24). Between times T26 and T27 the adjustable impedance is set to cause the third voltage pulse (of polarity one). Saturation is reached prior to time T27 when current J2 and voltage V2 collapse to zero. As before, the time interval allowed for this voltage pulse is about 10% less than the previous voltage pulse. Between times T28 and T29 the adjustable impedance is set to cause the fourth voltage pulse (of polarity two). Saturation is not quite reached at time T29 as indicated by current J2 still flowing. As before, the time interval allowed for this voltage pulse is about 10% less than the previous voltage pulse. The adjustable impedance is then set for a second phase first-step voltage pulse (of polarity 1) between times T30 and T31, the length of which is about half of the fourth voltage pulse. Finally, the adjustable impedance is set for a second-step voltage pulse between times T32 and T33. In the example shown, this voltage pulse magnitude is just the forward voltage drop of zener diode D1 (FIG. 13) for a relatively long time period. At time T33 the current transformer is in a demagnetized state and the sequence enters the current-sensing mode.

The accuracy of the method shown in FIG. 26 and FIGS. 27A to 27E is largely dependent on the percentage that the duration of each successive saturating voltage pulse is reduced (in the case of the example, ten percent). At ten percent reduction, the final induction level is controllable to less than about five percent of the saturation induction level. If this rate of reduction were reduced from ten percent to five percent, the final induction level is controllable to less than about two and a half percent of the saturation induction level. However, the increased accuracy comes at the cost of additional time being required to complete the demagnetizing cycle.

Figure 27:
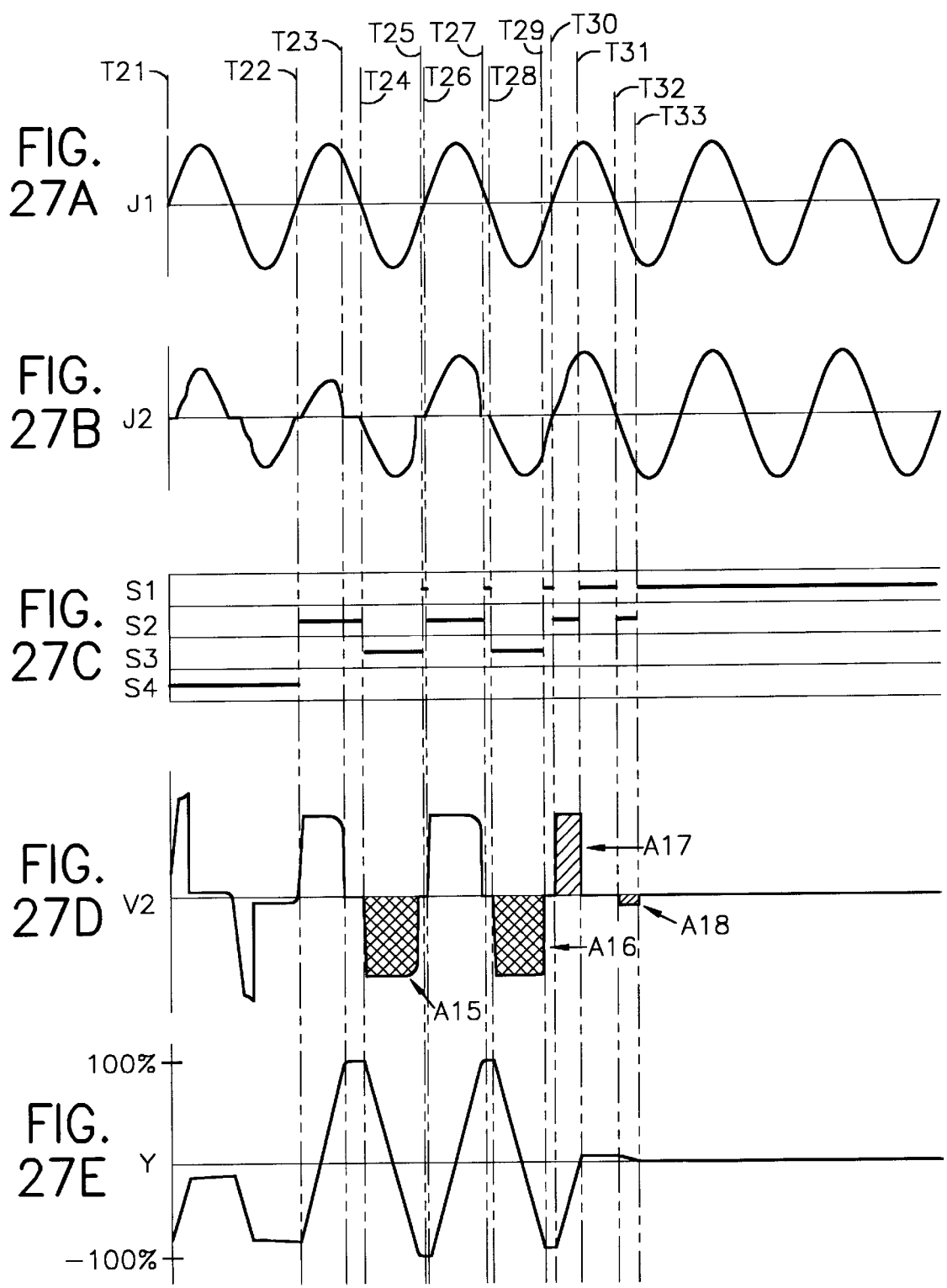

Similar to previous examples, FIG. 27D illustrates how a volt-time constant may be calculated based on the volt-time integral of a half-cycle of alternating voltage over the time required to transition between opposite saturation levels. In this example, the volt-time constant equals the area of area A15 divided by two. The method shown by FIG. 26, however, estimates the value of the volt-time constant as area A16 divided by two, rather than area A15 divided by two. Since area A16 is somewhat smaller than area A15, this introduces some error into the volt-time value used by second phase. However, this is somewhat compensated for by the induction level at time T30 (the end of the first phase) being somewhat less than saturation. As in previous examples, the value of the volt-time integral of the second phase (area A17 minus area A18) should be close to the volt-time constant. This inaccuracy caused by basing calculations on area A15 could obviously be avoided by using an alternate sequence that utilizes area A15 rather than area A16, and starting the second phase at time T26 rather than at T30. This alternate sequence is conceptually simpler and requires less time, so it may be preferred for many applications. It should be noted, however, that this alternate sequence requires more intensive monitoring by the control circuit in order to determine when saturation is reached (somewhat before time T25).

Figure 28:
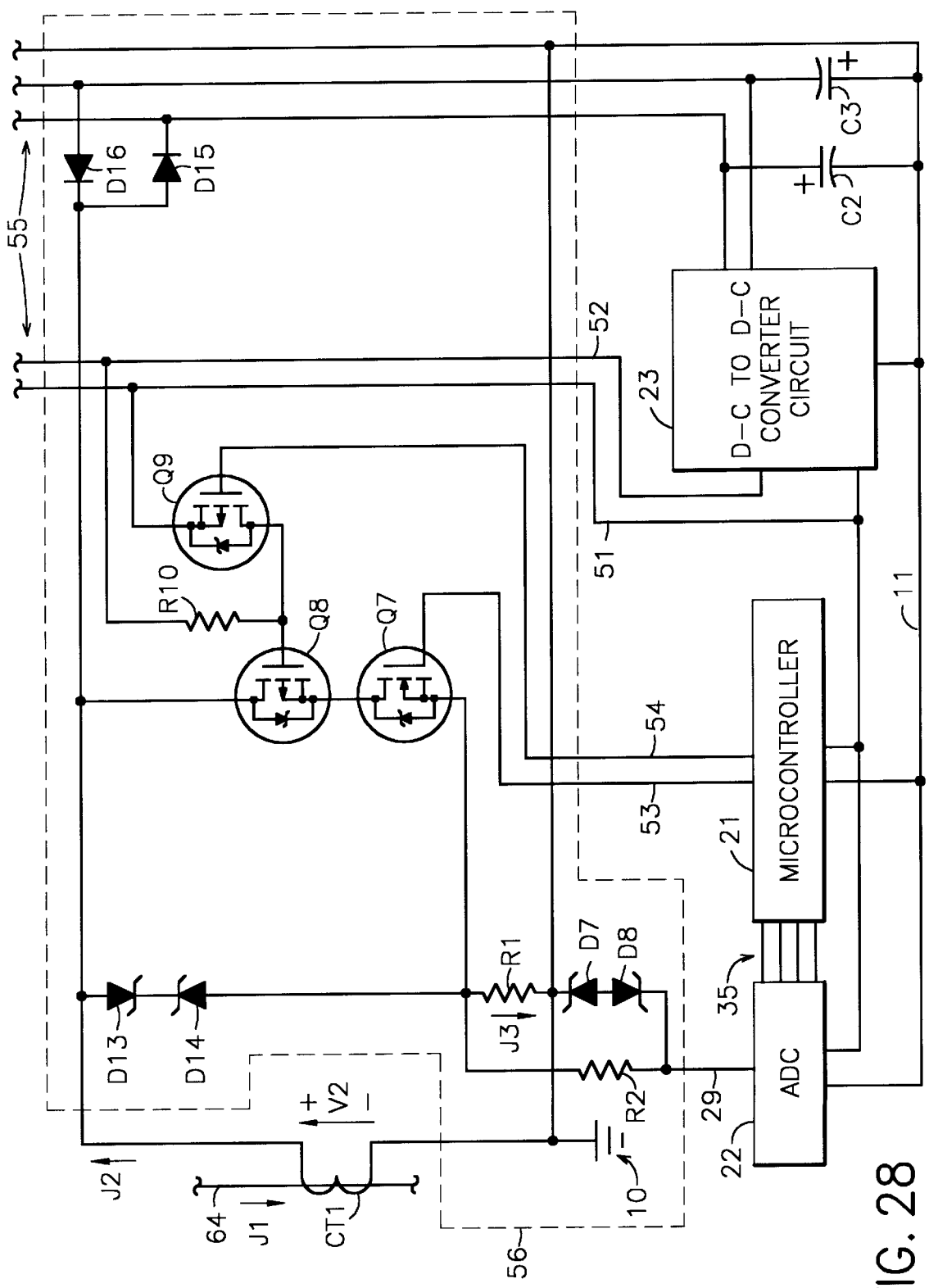

FIG. 28 shows an alternate embodiment of a current transformer demagnetizing circuit configured to allow one side of current transformer CT1 to be directly connected to ground, as indicated by ground symbol 10. This configuration satisfies the requirement of some safety codes that current transformer secondary windings be grounded.

Many of the components shown in FIG. 28 are common to FIGS. 17 and 19, and these common components function in the manner previously described. As in previous configurations, resistor R1 is a current-sensing resistor, and an optional surge suppression circuit is formed by resistor R2 and zener diodes D7 and D8.

Field-effect transistors Q7, Q8, and Q9 are enhancement-mode MOSFETs with sensitive gates for operation at logic voltage levels (of course, MOSFETs requiring higher gate voltages could be utilized along with appropriate gate driver circuitry). Transistors Q8 and Q9 are P-channel type, while transistor Q7 is N-channel type. Transistors Q7 and Q8 are chosen to have very low drain-source on resistance.

It should be noted that the voltage across resistor R1 affects the gate-source voltage of transistors Q7 and Q8. The resistance of resistor R1 should be selected so that the voltage drop across it does not adversely affect the operation of the transistors. The voltage drop across transistor Q7 also affects the gate-source voltage of transistor Q8, and this should be taken into consideration in the selection of transistor Q8 and the magnitude of its gate driving voltage.

Transistor Q9 and resistor R10 are included merely to provide proper gate-driving voltages for transistor Q8. Conductor 51 conducts the positive supply voltage (typically +5 volts), while conductor 52 conducts the negative supply voltage (typically −5 volts). Conductor 11 is at ground potential (zero volts). When microcontroller 21 drives conductor 54 high, transistor Q9 turns OFF, and resistor R10 pulls the gate voltage on transistor Q8 negative to turn transistor Q8 ON. Transistor Q7 is turned ON simply by microcontroller 21 driving conductor 53 high.

With both transistors Q7 and Q8 OFF, capacitors C2 and C3 charge until the charging voltage is clamped by zener diodes D13 and D14. This is similar to the operation of FIG. 13 with only switch S4 closed, with zener diodes D13 and D14 acting as voltage limiting circuits within power supply circuit 4.

With both transistors Q7 and Q8 ON, input current J2 is routed through transistors Q7 and Q8 and resistor R1. This is similar to the operation of FIG. 13 with only switch S1 closed.

Operation with transistor Q7 OFF and transistor Q8 ON is similar to the operation of FIG. 13 with just switch S2 closed. Current J2 in the negative direction passes through the body diode of transistor Q7 and through activated transistor Q8, thereby bypassing zener diode D13 and the power supply, thereby maintaining relatively low voltage across current transformer CT1. However, current J2 in the positive direction is blocked by transistor Q7, and is thereby forced through either the power supply (capacitor C2 and diode D15) or zener diode D14, either route resulting in a relatively high positive voltage across current transformer CT1.

Operation with transistor Q7 ON and transistor Q8 OFF is similar to the operation of FIG. 13 with just switch S3 closed. Current J2 in the positive direction passes through the body diode of transistor Q8 and through activated transistor Q7, thereby bypassing zener diode D14 and the power supply, thereby maintaining relatively low voltage across current transformer CT1. However, current J2 in the negative direction is blocked by transistor Q8, and is thereby forced through either the power supply (capacitor C3 and diode D16) or zener diode D13, either route resulting in a relatively high negative voltage across current transformer CT1.

Unlike previous configurations, a conventional full-wave rectifier circuit that charges a single capacitor is no longer practical with the configuration of FIG. 28. Instead, diodes D15 and D16 act as half-wave rectifiers that charge capacitors C2 and C3, providing positive and negative unregulated voltages for use by d-c to d-c converter circuit 23. This may complicate the design of d-c to d-c converter 23 when operation at very low input current levels is desired, in which case it is advantageous for d-c to d-c converter 23 to draw power equally from capacitors C2 and C3 to maximize the available operating power.

Of course, if a particular application utilizes a separate source of operating power, then the power supply components shown in FIG. 28 are not required. Components that may be deleted in this case include diodes D15 and D16, charging capacitors C2 and C3, and d-c to d-c converter circuit 23.

Regardless of whether operating power is provided as shown in FIG. 28 or is provided by a separate source of power, conductors 11, 51, and 52 provide operating power from the power supply to various components. Conductor 11 is common (ground), while conductor 51 is the positive supply (typically +5 volts) and conductor 52 is the negative supply (typically −5 volts). Voltages required will vary depending on the requirements of the actual components utilized. For example, analog-to-digital converter 22 may require both positive and negative supply voltages, rather than just the positive supply voltage shown. Also, many field-effect transistors may require higher gate voltages for proper operation.

The waveforms of FIGS. 20A to 20D are applicable to FIG. 28 (as well as to FIG. 19) with the clarification that transistors Q7 and Q8 are to be substituted for transistors Q5 and Q6 respectively in FIG. 20C.

More than one current transformer (each having a unique primary current) may be connected to the configuration of FIG. 28 by duplicating the input circuit components within box 56 for each current transformer. Five conductors 55 are common to each input circuit. Each input circuit also requires two control conductors from microcontroller 21 (similar to conductors 53 and 54) and an input signal conductor to the analog-to-digital converter circuit 22 (similar to conductor 29). If non-feedback operation similar to FIGS. 16A to 16E is utilized, then all current transformers may be demagnetized simultaneously utilizing common control conductors 53 and 54.

The main weakness of the configuration shown in FIG. 28 is similar to that of FIG. 19. Zener diodes D13 and D14 act as the power supply voltage-limiting circuit. These diodes may dissipate a significant amount of power in their voltage-limiting mode. This may lead to heat dissipation problems, depending on the enclosure used and other environmental considerations. Heat dissipation should not be a problem if operating power is supplied by a separate power source, since the voltage-limiting function is not necessary in that case.

Figure 29:
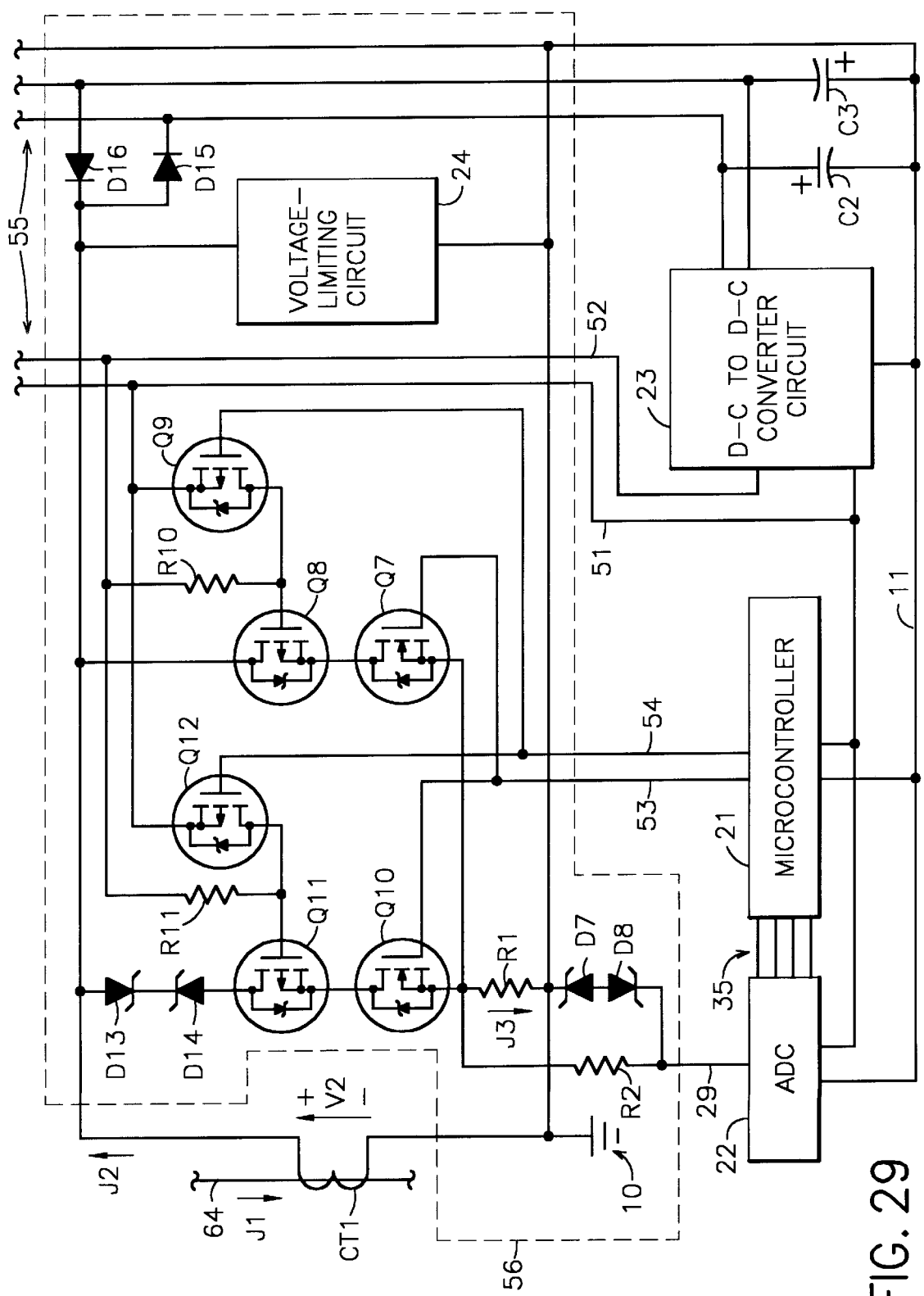
Figure 30A:
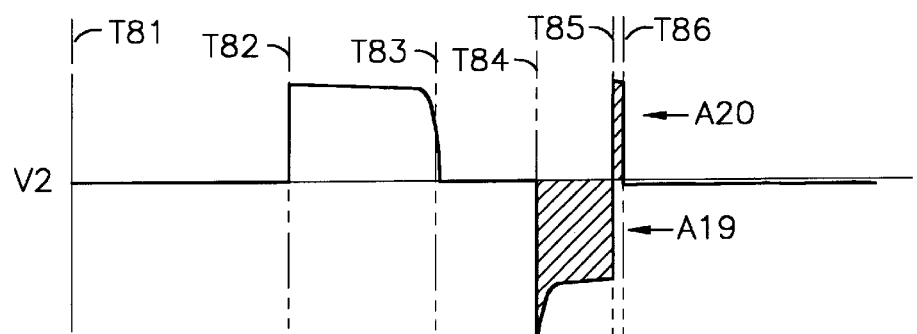
FIGS. 30A to 30D show how the configuration of FIG. 1 may be operated to measure d-c current. The waveforms shown are based on controllable voltage device 63 being a controllable voltage source and resistor R1 being a current-sensing, resistor with low resistance. After a demagnetizing cycle, the current through resistor R1 is proportional to the d-c primary current.
Figure 30B:
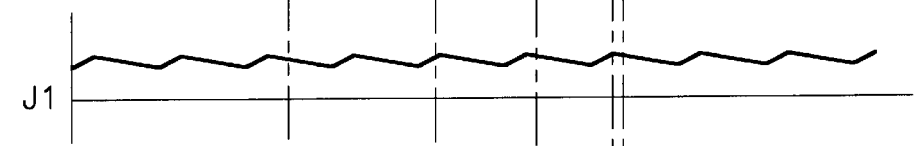
Figure 30C:
Figure 30D:
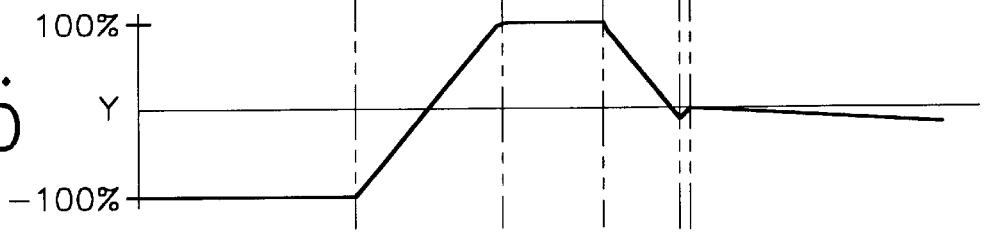

FIG. 29 shows another alternate embodiment of a current transformer demagnetizing circuit. The embodiment shown in FIG. 29 is very similar to the one shown in FIG. 28, except that FIG. 29 has additional components to separate the voltage-limiting function of the power supply from the demagnetizing function of zener diodes D13 and D14. Most of the components shown in FIG. 29 are common to FIG. 28, and these common components function in the manner previously described.

Transistors Q10, Q11, and Q12 function in a way that is similar to transistors Q7, Q8, and Q9. When transistors Q10 and Q11 are OFF, the current path through zener diodes D13 and D14 is blocked, and voltage is then limited by voltage-limiting circuit 24. Resistor R11 functions in a way that is similar to resistor R10, helping to provide appropriate gate-driving voltage to transistor Q11. Voltage-limiting circuit 24 is designed to limit voltage at levels somewhat greater than the breakdown voltages of zener diodes D13 and D14.

The embodiment shown in FIG. 29 no longer has the problem of excessive power dissipation in zener diodes D13 and D14, since these diodes are now only active during the demagnetizing mode. Voltage-limiting circuit 24 may be designed to shunt current with very little power dissipation, thereby minimizing heat dissipation problems. However, care should be taken to ensure that saturation problems do not adversely affect the ability of current transformer CT1 to provide power to capacitors C2 and C3. D-c to d-c converter circuit 23 should derive power equally from capacitors C2 and C3 to roughly balance the positive and negative charging voltages that current transformer CT1 experiences. If the voltages on capacitors C2 and C3 are not roughly balanced, saturation effects may seriously reduce the amount of operating power that current transformer CT1 is able to provide. D-c to d-c converter circuits that are able to derive power equally from opposite voltages like these are well within the scope of the prior art, however the increased complexity adds to the cost of the power supply circuit.

FIG. 30 shows how the configuration of FIG. 1 may be operated to measure electric current. The sequence shown utilizes "first-phase method a" and "second-phase method b," similar to the hysteresis curve of FIG. 3 and waveforms of FIGS. 4A to 4D (one difference being that the initial induction level of the present example is at −100% saturation instead of −50%). FIG. 30 assumes a varying d-c current for primary current J1, though the process shown is equally applicable to a-c current. The waveforms shown are based on controllable voltage device 63 being a controllable voltage source. Resistor R1 is a current-sensing resistor with low resistance. After a demagnetizing cycle, the current through resistor R1 is proportional to the d-c primary current.

At time T81 of FIG. 30 the magnetic core is saturated due to primary current J1 being a d-c current, with no recent demagnetizing cycle to prevent the magnetic core from being saturated. Current J2 is zero, since the magnetic core is unable to generate any voltage to drive a current of the same polarity as current J1. Though the induction level at time T81 may be considered "known" from the perspective of this description, it is not known from the perspective of a current monitoring device. The present example will drive the induction level to a "known" induction level of +100% during the first phase, since this will be more informative than driving it to −100% (the induction level it is already at).

The first-phase of a demagnetizing cycle begins at time T82 when control circuit 62 directs voltage device 63 to produce a large positive voltage. This voltage causes a transition from saturation at −100% to saturation at +100%. Saturation at +100% is reached at about time T83. During the transition, while the core is not in saturation between times T82 and T83, current J2 becomes somewhat proportional to current J1, with an error related hysteresis curve properties.

A second phase begins at time T84, when control circuit 62 directs voltage device 63 to produce a large negative first-step voltage, followed by a shorter positive second-step voltage beginning at time T85. At time T86 the second-step voltage is done, and control circuit 62 directs voltage device 63 to produce an output voltage near zero volts to allow secondary current to flow freely. As with previous examples, control circuit 62 controls the first-step and second-step voltages so that the magnitude of the volt-time integral of voltage V2 during the second phase equals the volt-time constant of the current transformer (area A19 minus area A20 should equal the volt-time constant).

At time T86 the current transformer is demagnetized, and secondary current J2 is proportional to primary current J1. However, since the current transformer must generate a small induced voltage to keep current J2 flowing through the loop resistance (resistor R1 plus winding resistance plus other stray resistances), the induction level starts to drift back toward saturation after time T86 (see FIG. 30D). This transition toward saturation will cause an increasing error in current J2 until saturation is reached, at which point current J2 will cease to flow (as at time T81). To maintain accuracy, the demagnetizing cycle must be repeated periodically (usually well before saturation is reached). For applications in which current flow is consistently one direction, it may be beneficial to move the initial operating point to an induction level other than zero to lengthen the time period between demagnetizing cycles. For example, in the example of FIGS. 30A to 30D, it may be preferable to shorten the first-step voltage (between times T84 and T85) so that the induction level is left initially at a positive level, say +25%. The magnetic core will still drift toward saturation at −100%, but it will take more time.

Another way to increase the time between demagnetizing cycles is by configuring control circuit 62 to control voltage device 63 in such a way that the average voltage generated by voltage device 63 counteracts the average voltage caused by current J2 flowing through loop resistance (during the current-sensing mode). The appropriate voltage level can be calculated by control circuit 62 based on measured current (the voltage across resistor R1 divided by the resistance of resistor R1) and constant loop resistance. If this methodology is accurately implemented, the average voltage induced by the secondary winding during the current-sensing mode will be near zero, and the magnetic core can be maintained in a demagnetized state for a considerable length of time before another demagnetizing cycle is necessary.

Figure 31:
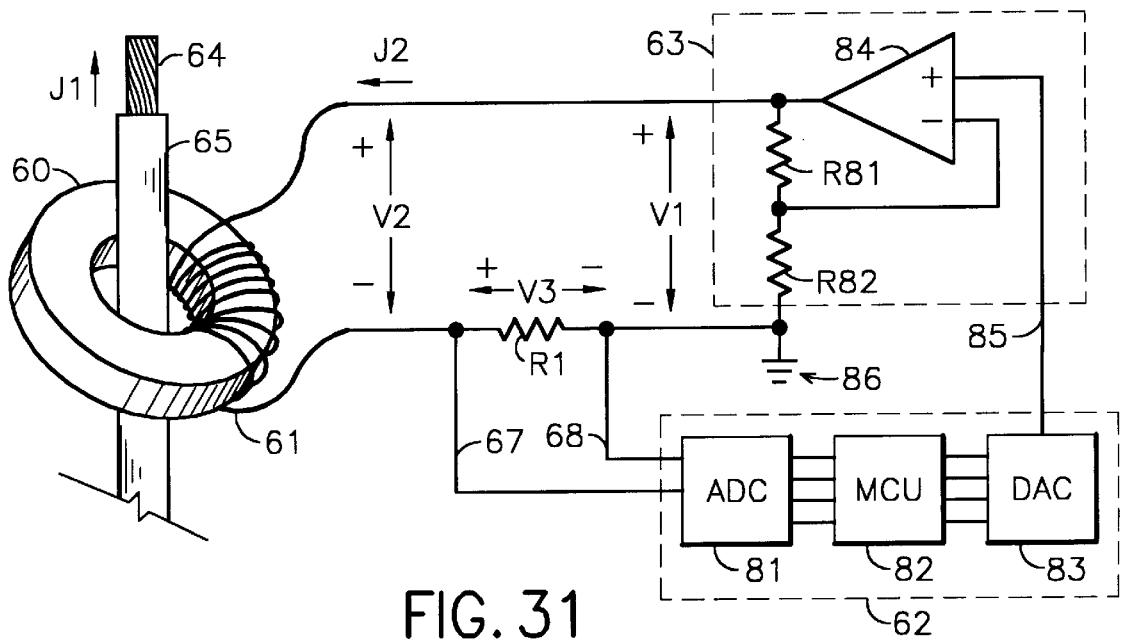
FIG. 31 shows one way control circuit 62 and voltage device 63 of FIG. 1 may be embodied to measure electric current, including d-c current. This configuration may be operated in a manner similar to the manner described for FIG. 30.

FIG. 31 shows one way that control circuit 62 and voltage device 63 of FIG. 1 may be embodied. The configuration shown is particularly suitable for measuring electric current, including d-c current. This configuration may be operated in a manner similar to the manner described for FIGS. 30A to 30D. Many components are the same as FIG. 1, and these components function in the manner previously described. Since voltage device 63 of FIG. 31 is a controllable electric energy source, the same embodiment may be utilized for electric energy source 73 of FIG. 2. Of course, control circuit 62 of FIG. 2 may also be embodied the same way as shown in FIG. 31.

Resistor R1 is a current-sensing resistor with low resistance. (Control circuit 62 has an analog-to-digital converter circuit 81 to sense current J2 (as voltage V3 across resistor R1), a microcontroller 82 for data processing and control functions, and a digital-to-analog converter circuit 83. Digital-to-analog converter circuit 83 provides an analog voltage signal on conductor 85 that controls the voltage output of voltage device 63. Analog-to-digital converter circuit 81 and microcontroller 82 communicate via an interface shown as four conductors, and this interface may vary considerably depending on the particular design. Likewise microcontroller 82 communicates with digital-to-analog converter circuit 83 via an interface that may vary considerably depending on the particular design. Voltage device 63 has an operational amplifier 84, with resistors R81 and R82 configured to set the gain of operational amplifier 84. A separate power source (not shown) provides operating power for analog-to-digital converter circuit 81, microcontroller 82, digital-to-analog converter circuit 83, and operational amplifier 84. Ground connection 86 provides a common reference potential for the various circuits and power supply.

Operational amplifier 84 must be able to produce voltage in a circuit with relatively large current driven by a current source (a current transformer acts like a current source). A "power operational amplifier" will usually be required, such as model OPA548 made by Burr-Brown Corporation. This device has an adjustable current-limit feature and is rated for up to 3 amps of continuous current (other models are available with higher ratings). Tests found that these devices worked very well in a current transformer secondary circuit, as long as a "snubber circuit" was connected to the output to improve stability. The "snubber circuit" that was successfully utilized was a ten Ohm resistor in series with a 0.1 microfarad capacitor, connected between the operational amplifier output and the grounded conductor (as recommended by the device's data sheet).

The type of control configuration shown in FIG. 31 (utilizing an analog-to-digital converter circuit to sense an input signal, a microcontroller to implement a control function based on the input signal, a digital-to-analog converter to produce an analog control signal, and an operational amplifier to produce a voltage proportional to the analog control signal) is well established in the prior art, so additional configuration details will not be described herein. Microcontroller 82 may be configured to implement the control sequence illustrated by FIGS. 30A to 30D.

FIGS. 32A to 32D illustrate four different ways that the configurations of FIG. 1 or FIG. 31 may be operated during a current-sensing mode after a demagnetizing sequence is completed. Conceptually, FIGS. 32B, 32C and 32D may be thought of as a continuation in time of FIGS. 30A, 30C and 30D respectfully. Times T85 and T86 are common to both sets of figures. However, the vertical scales of FIGS. 32A to 32D are magnified by a factor of about two to facilitate display of waveforms with relatively small magnitude.

Referring to FIG. 31, current J2 flows through winding 61, resistor R1, voltage device 63, and various conductors that connect these different components. The "loop resistance" of current J2 is the sum of the resistances of all the components that current J2 flows through. With the assumption that operational amplifier 84 has near ideal properties, the resistance of voltage device 63 will be considered negligible. Then the loop resistance for current J2 of FIG. 31 is the sum of the resistances of winding 61, resistor R1 and various conductors that connect these different components. In the present example the total loop resistance will be assumed to be about twice the resistance of resistor R1.

Referring now to FIGS. 31 and 32A to 32D, from time T86 to time T87 voltage device 63 is controlled by control circuit 62 to produce zero volts. This allows current J2 to flow freely, but since current J2 is not symmetrical the current transformer (magnetic core 60 and winding 61) must generate an induced voltage with an average negative value to keep current J2 flowing. The induced voltage is equal and opposite to the voltage drop of current J2 around the loop, which is approximately equal to the magnitude of current J2 multiplied by the loop resistance (neglecting stray inductances and capacitances of loop components). This induced voltage with an average negative value correlates with the induction level of magnetic core 60 drifting toward saturation as shown in FIG. 32D. To compensate for this drift toward saturation, voltage device 63 may be controlled to produce a voltage with an average value equal to voltage V3 across resistor R1. This is the case shown in FIGS. 32A to 32D between times T87 and T88. However, this is not enough voltage to counteract the voltage drop across the stray resistance in the loop (winding and conductor resistances), and the drift toward saturation continues at a slower rate (as shown by FIG. 32D). Between times T88 and T89 voltage device 63 is controlled to produce a voltage equal to twice the average value of voltage V3 (since the total loop resistance is twice the resistance of resistor R1), and this voltage is seen to stop the drift toward saturation (a larger voltage would cause the induction level to drift toward a positive direction). Between times T89 and T90 voltage device 63 is controlled to produce a voltage equal to twice the instantaneous value of voltage V3, and this voltage also stops the drift toward saturation.

Either control method utilized between times T88 and T90 in FIGS. 32A to 32D has the advantage of greatly lengthening the time after a demagnetizing sequence during which a magnetic core 60 operates within an acceptable induction level. The control method shown between times T89 and T90 has the added advantage of reducing the effective burden of the entire secondary circuit to near zero ohms. This is an improvement over the active load termination described in Reissued U.S. Pat. No. Re. 28,851 (previously referenced), since the configuration disclosed in that patent only reduces the burden of the sensing device to near zero (rather than the burden of the whole secondary circuit). A secondary circuit with a total effective burden of zero ohms can significantly increase the accuracy of secondary current as well as reduce the size of the magnetic core required to attain a particular level of accuracy.

In order to operate the configuration of FIG. 31 in either manner illustrated between times T88 and T90 of FIGS. 32A to 32D, it is necessary to determine the loop resistance for current J2. The loop resistance may be predetermined and microcontroller 82 may be preconfigured with the proper operating parameters. Alternatively, the loop resistance may be determined automatically by microcontroller 82 operating to drive the magnetic core to saturation with a known voltage V1 and then measuring current J2 after the magnetic core is saturated. The loop resistance is then simply the magnitude of voltage V1 divided by current J2.

The control method utilized between times T89 and T90 in FIGS. 32A to 32D may be used in a-c current-sensing systems to virtually eliminate the burden of current transformer secondary circuits (without necessarily utilizing the demagnetizing sequence shown in FIGS. 30A to 30D). A simple embodiment just for this purpose is illustrated in FIG. 33. The configuration of FIG. 33 is similar to FIG. 31 except that voltage device 63 is now controlled so that voltage V1 is always proportional to voltage V3. Adjustable resistor R83 and resistor R82 control the gain of operational amplifier 84. Conductor 87 conducts a voltage signal (voltage V3) which is proportional to current. Voltage V3 may also be communicated to a larger current-sensing system via terminals 88 and 89.

Still referring to FIG. 33, if adjustable resistor R83 is set to zero ohms, the voltage gain of voltage device 63 is one, and the circuit has a similar effect as the active load disclosed in Reissued U.S. Pat. No. Re. 28,851. With a gain of one, voltage V1 is equal to voltage V3, so that the combination of resistor R1 and voltage device 63 has a combined voltage near zero volts and therefore has a combined effective burden near zero ohms.

Similar to the discussion for FIGS. 32A to 32D, if the total loop resistance for current J2 is twice the resistance of resistor R1, and if voltage device 63 is controlled so that voltage V1 is twice as large as voltage V3, the voltage drop of the entire loop would be compensated for. This can be done by making the resistance of adjustable resistor R83 in FIG. 33 equal to the resistance of resistor R84. This causes the induced voltage of winding 61 to be very small, and the effective burden of the entire secondary circuit is reduced to almost zero ohms.

Adjustable resistor R83 may be adjusted to obtain any reasonable gain greater than one, in accordance with well-known design principles of operational amplifiers. By adjusting resistor R83 the gain is adjustable to match secondary circuit parameters for most secondary circuit configurations. Of course, resistor R83 may be a fixed resistor if the appropriate gain is predetermined. Care must be exercised, however, because if the gain is set to compensate for more than the total secondary circuit impedance, then the system becomes unstable and current will increase to the limit of the amplifier output circuit.

For secondary circuits with non-negligible inductance or capacitance, resistors R83 and R84 may be replaced with complex impedances to better match secondary circuit parameters, thereby facilitating a total secondary circuit burden near zero ohms.

Figure 34:
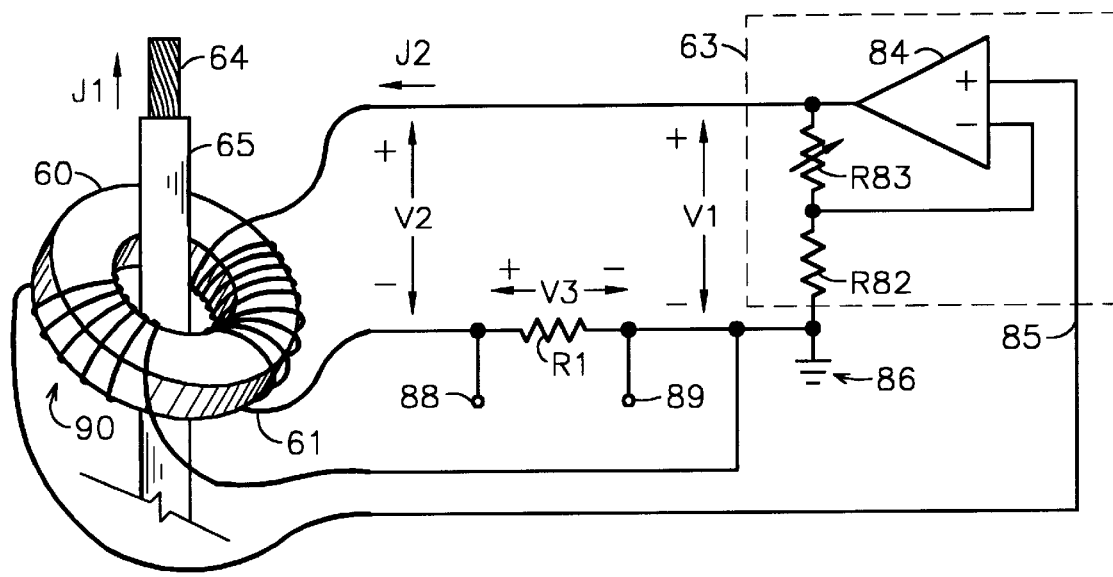
FIG. 34 illustrates how an additional winding may be used to sense induced voltage associated with changes in induction level, and how this way of directly sensing induced voltage may be used to virtually eliminate the burden of a current transformer secondary circuit.

FIG. 34 illustrates another way to reduce the effective burden of a secondary circuit to near zero ohms. An additional winding 90 is added to the current transformer core as a dedicated winding to sense changes in induction level. Though six winding turns are shown for simplicity of illustration, the number of turns will usually be larger and may vary widely depending on the application. Since the current in winding 90 is very near zero amps (due to the high impedance of the operational amplifier input), the voltage measured across winding 90 is not adversely affected by resistive voltage drop and is therefore virtually identical to the induced voltage of the winding. The induced voltage across winding 90 is proportional to the rate of change of the induction level of magnetic core 60.

As previously discussed, the gain of operational amplifier 84 in FIG. 34 is controlled by the resistances of resistors R82 and R83. While the amplifier gain for the configuration of FIG. 31 or FIG. 32 is usually set rather low (for example, between one and four), the amplifier gain is set relatively high for the configuration of FIG. 34 (for example, twenty or higher), limited only by noise and stability concerns. Higher gain is preferred for the configuration of FIG. 34, because, with this configuration, the effective burden of the secondary circuit is inversely related to the gain of voltage device 63.

The polarity of the output voltage of operational amplifier 84 in FIG. 34 is such that the output voltage facilitates the flow of secondary current (reversing the connections to winding 90 has the effect of reversing the output polarity and creating an unstable circuit). Similar to FIG. 33, operational amplifier 84 in FIG. 34 provides most of the voltage required to drive secondary current J2, thereby greatly reducing the induced voltage across winding 61. This significantly reduces the effective burden of the entire secondary circuit.

Compared to FIG. 33, the configuration shown in FIG. 34 has the advantage of requiring no calibration, as well as compensating for the effects of stray inductance and capacitance in the secondary circuit (in addition to compensating for loop resistance). The main disadvantage is the additional winding that is required.

Terminals 88 and 89 are included in FIG. 34 to show that the voltage across resistor R1 may be used as an input to a system that monitors current.

Any kind of load that is typically connected to current transformer secondary windings may be substituted for resistor R1 (or connected in series with resistor R1). This includes trip solenoids and other inductive or capacitive devices associated with protective relays and analog (mechanical) meters.

Figure 35:
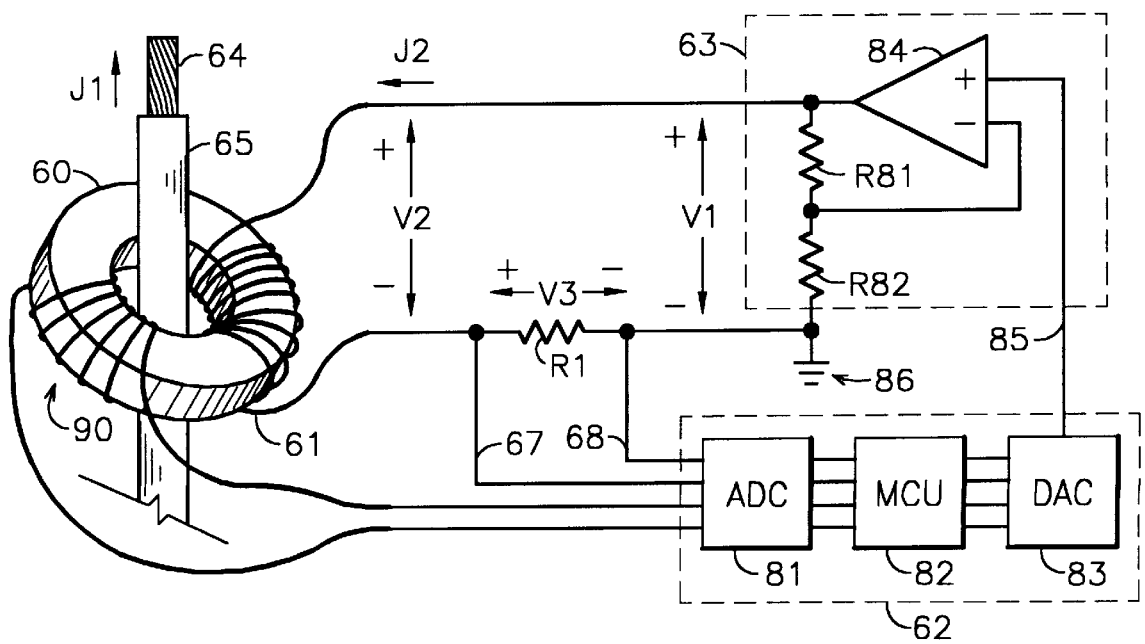
FIG. 35 shows a configuration that is similar to FIG. 31, but with an additional winding for directly sensing induced voltage (similar to FIG. 34). This configuration may be used to sense a-c and d-c currents (similar to FIG. 31) while providing a burden-reducing means that functions similar to FIG. 34.

FIG. 35 shows a configuration that combines the benefits of dedicated winding 90 (for sensing induced voltage, as shown in FIG. 34) with the versatility of the control circuit shown in FIG. 31. Similar to FIG. 31, the configuration shown in FIG. 35 may be utilized for sensing both a-c and d-c currents, since control circuit 62 is capable of demagnetizing the magnetic core. With the configuration shown in FIG. 35, microcontroller 82 may be programmed to implement a burden-reducing method similar to either FIG. 33 or FIG. 34.

Referring back to the demagnetizing sequence illustrated by FIGS. 7 and 8A to 8D, the volt-time integrals associated with the demagnetizing cycle (areas A1, A2, and A3) may be estimated from voltage V1 or calculated directly from voltage V2 with the assumption that the resistive voltage drop of current in the winding is negligible. Alternatively the actual induced voltage may be calculated by subtracting the resistive voltage drop of the winding from measured voltage V2. However, winding 90, shown in FIG. 35, allows the induced voltage to be measured directly, thereby facilitating a very accurate demagnetizing sequence. A demagnetizing sequence similar to the sequence shown in FIGS. 7 and 8A to 8D may be used with the configuration shown in FIG. 35, utilizing the voltage across winding 90 for induced voltage calculations rather than voltage V2. (The same demagnetizing sequence also may be implemented utilizing just current-sensing, as previously discussed).

To facilitate sensing d-c currents without the need for frequent demagnetizing cycles, microcontroller 82 in FIG. 35 may be configured to utilize a P.I.D. (Proportional plus Integral plus Derivative) type of control, utilizing the induced voltage of winding 90 as an input. Alternatively, an analog P.I.D. controller could be utilized to maintain the preferred induction level. Since changes in induction level are directly related to the integral of induced voltage, the integral feature of P.I.D. control is especially applicable in maintaining a preferred induction level. P.I.D. control methods are well known in the prior art, so they will not be discussed in detail herein.

Surge protection (not shown) for the configurations of FIGS. 31, 33, 34 and 35 may be provided by connecting a varistor, back-to-back zener diodes, or other voltage-limiting device between the output of operational amplifier 84 and the grounded conductor (thereby limiting voltage V1 to a safe level and still provide for sensing of surge currents).

Conclusions, Ramifications, and Scope

A new way to establish and maintain a preferred induction level in a magnetic body has been described and illustrated. A sequentially varying voltage is applied to a conductive winding that magnetically interacts with a magnetic body. During a first phase, the varying voltage changes the induction level of the magnetic body to a known induction level. This transition to a known induction level is primarily dependent on current magnitudes associated with the varying voltage. During a second phase, the varying voltage is sequenced to cause an induced voltage with waveform, magnitude and duration that causes the induction level to change from the known induction level to a preferred induction level. An optional third phase may also be utilized, during which the varying voltage may be controlled to keep the average value of induced voltage near zero in order to maintain the preferred induction level. Several different varying voltage sequences have been described and illustrated.

The invention is especially applicable to ordinary current transformers, which may be demagnetized automatically while remaining in service. Once demagnetized, ordinary current transformers are able to accurately sense non-symmetrical currents, including d-c currents and a-c currents that have d-c components. A current transformer demagnetizing circuit may utilize an active voltage source (for a-c or d-c currents) or an adjustable impedance (for a-c currents). An adjustable impedance included as part of a current transformer secondary circuit causes an induced voltage across the secondary winding of the current transformer. By sequentially adjusting the adjustable impedance, this induced voltage is made to vary in such a way that the magnetic core of the current transformer is demagnetized.

Several different embodiments have been described and illustrated. There are many other embodiments possible that will be apparent to those skilled in the art. It is not the intent of this disclosure to limit the invention to the embodiments that have been illustrated. The components and configurations utilized in this disclosure are intended to be illustrative only, and are not intended to limit the scope of the appended claims.

While only certain preferred features of the invention have been shown by way of illustration, many modifications and changes will occur to those skilled in the art. It is, therefore, to be understood that the appended claims are intended to cover all such modifications and changes as fall within the true spirit of the invention.

What is claimed is:

1. A method for establishing a preferred induction level in a magnetic body; said magnetic body being positioned relative to a conductive winding in such a way that said conductive winding magnetically interacts with said magnetic body; said conductive winding conducting a current; a change of induction level in said magnetic body being associated with an induced voltage across said conductive winding; said method comprising the steps of:
  (a) during a first phase, causing said current to have such waveform, magnitude and duration so as to cause the induction level of said magnetic body to transition to a determinate induction level;
  (b) during a second phase, causing said induced voltage to have such waveform, magnitude and duration so that the value of the integral of said induced voltage over time is approximately equal to a volt-time value corresponding to a change in the induction level of said magnetic body from said determinate induction level to said preferred induction level, thereby causing the induction level of said magnetic body to transition from said determinate induction level to said preferred induction level.

2. The method of claim 1 wherein said preferred induction level is an induction level near zero, and said method is thereby a method to demagnetize said magnetic body.

3. The method of claim 1 wherein said magnetic body comprises saturable magnetic material; said current during said first phase has sufficient magnitude to drive the induction level of said magnetic body to an induction level near saturation; and said determinate induction level is approximately the saturation induction level of said magnetic material.

4. The method of claim 1 wherein said determinate induction level is calculated from known characteristics of both said magnetic body and said current.

5. The method of claim 1 wherein during said first phase said current is an alternating current and said induced voltage is an alternating induced voltage; said alternating current and said alternating induced voltage having waveforms and magnitudes that are related by the properties of said magnetic body and said conductive winding; said alternating current and said alternating induced voltage each having various characteristics herein referred to in general as wave parameters; said alternating electric current causing the induction level of said magnetic body to transition between opposite peak induction levels that are approximately equal in magnitude; one or more of said wave parameters being utilized to determine said determinate induction level.

6. The method of claim 5 wherein said determinate induction level is the induction level at the end of a positive or negative half-cycle of said alternating induced voltage, said determinate induction level being determined by determining the magnitude of a second volt-time value; said second volt-time value being approximately equal to the value of the volt-time integral of a positive or negative half-cycle of said alternating induced voltage divided by two; said second phase further beginning at the end of a positive or negative half-cycle of said alternating induced voltage.

7. The method of claim 1 wherein said induced voltage during said second phase is entirely of one polarity.

8. The method of claim 1 wherein said induced voltage during said second phase sequentially comprises a first voltage and a second voltage of opposite polarities; said first voltage having such magnitude, duration and polarity so as to cause the induction level of said magnetic body to transition to and pass said preferred induction level; said second voltage having such magnitude, duration and polarity so as to cause the induction level of said magnetic body to transition to said preferred induction level.

9. The method of claim 1 wherein said induced voltage during said second phase comprises a plurality of sequential voltage pulses of varying form, magnitude, duration, and polarity; the integral of said induced voltage over a time period that includes all said voltage pulses being approximately equal to said volt-time value.

10. The method of claim 1 wherein said magnetic body further interacts with a second winding, herein referred to as a primary winding; said primary winding comprising one or more turns of conductive material; said primary winding being, positioned relative to said magnetic body in such a way that said primary winding magnetically interacts with said magnetic body; said primary winding conducting a primary current; said method further comprising a third phase during which said current is approximately proportional to said primary current.

11. The method of claim 10 wherein said primary current is not symmetrical, and said induced voltage during said third phase is controlled such that the average value of said induced voltage over time is near zero, thereby preventing the induction level of said magnetic body from quickly transitioning away from said preferred induction level.

12. The method of claim 10 wherein said induced voltage is controlled during said third phase to be near zero, thereby making said current a more accurate representation of said primary current during said third phase.

13. Apparatus for establishing a preferred induction level in a magnetic body;
  said apparatus comprising a primary winding, a secondary winding, and an adjustable impedance;
  said primary winding comprising one or more turns of conductive material; said primary winding conducting an alternating current; said primary winding being positioned relative to said magnetic body in such a way that said alternating current influences the induction level of said magnetic body;
  said secondary winding comprising one or more turns of conductive material; said secondary winding conducting a secondary current; said secondary winding being positioned relative to said magnetic body in such a way that said secondary current influences the induction level of said magnetic winding;
  said adjustable impedance having a suitable control means; said adjustable impedance being connected to said secondary winding; said control means controlling said adjustable impedance in such a manner so as to cause the induction level of said magnetic body to transition to said preferred induction level.

14. The apparatus of claim 13 wherein said magnetic body is the magnetic core of a current transformer; said secondary winding is the secondary winding of said current transformer; said preferred induction level is an induction level near zero;

said secondary winding conducts said secondary current in one of two directions at a time, herein called direction one and direction two; and said control means acts sequentially, first acting to cause said adjustable impedance to be a relatively high impedance for current flowing in direction one thereby causing said magnetic core to approach a known induction level;

said control means then acting to cause said adjustable impedance to be a relatively high impedance for current flowing in direction two thereby causing a voltage across the secondary winding of said current transformer for a time period such that said voltage applied over said time period causes said magnetic core to approach an induction level near zero.

15. The apparatus of claim 14 wherein said magnetic core is a saturable magnetic core, and said known induction level is at or near the saturation level of said magnetic core.

16. The apparatus of claim 14 wherein said known induction level is estimated from an estimate of the magnitude of said alternating current and known characteristics of said current transformer.

17. The apparatus of claim 13 wherein said magnetic body is the magnetic core of a current transformer; said secondary winding is the secondary winding of said current transformer; said preferred induction level is an induction level near zero;

said secondary winding conducts said secondary current in one of two directions at a time, herein called direction one and direction two; and said control means acts sequentially, first acting to cause said adjustable impedance to be a relatively high impedance for current flowing in said direction one thereby causing said magnetic core to approach a known induction level, said control means then acting to cause said adjustable impedance to be a relatively high impedance for current flowing in said direction two thereby causing a voltage across the secondary winding of said current transformer for a time period such that said voltage applied over said time period causes said magnetic core to approach and slightly pass an induction level of zero;

said control means then acting to cause said adjustable impedance to be a relatively high impedance for current flowing in said direction one thereby causing a voltage across the secondary winding of said current transformer for a time period such that said voltage applied over said time period causes said magnetic core to approach an induction level near zero.

18. The apparatus of claim 17 wherein said magnetic core is a saturable magnetic core, and said known induction level is at or near the saturation level of said magnetic core.

19. The apparatus of claim 17 wherein said known induction level is estimated from an estimate of the magnitude of said alternating current and known characteristics of said current transformer.

20. The apparatus of claim 13 wherein said preferred induction level is an induction level near zero, and said apparatus thereby functions to demagnetize said magnetic body.

21. The apparatus of claim 13 wherein one end of said secondary winding is connected to ground potential.

22. The apparatus of claim 13 wherein said preferred induction level is near zero; said secondary winding conducts secondary current in one of two directions at a time, herein called direction one and direction two; and said control means operates sequentially to alternately cause said adjustable impedance to be a relatively high impedance for current flowing in said direction one and said direction two so as to cause an alternating induced voltage across said secondary winding; said alternating induced voltage having positive and negative half-cycles herein referred to as voltage pulses; the value of the volt-time integral of each successive said voltage pulse declining in such a way as to reduce the induction level of said magnetic body to an acceptable level.

23. The apparatus of claim 13 wherein said control means further operates sequentially;

said control means operating during a first phase to cause said adjustable impedance to vary in such a manner as to cause the induction level of said magnetic body to transition to a determinate induction level;

said control means then operating during a second phase to cause said adjustable impedance to vary in such a manner as to cause the induction level of said magnetic body to transition from said determinate induction level to said preferred induction level.

24. The apparatus of claim 23 wherein said control means further operates during said second phase to cause said adjustable impedance to vary in such a manner as to cause induced voltage across said secondary winding of such waveform and magnitude that the value of the volt-time integral of said induced voltage over the duration of said second phase is approximately a volt-time value corresponding to a change in the induction level of said magnetic body from said determinate induction level to said preferred induction level.

25. The apparatus of claim 24 wherein said secondary winding conducts said secondary current in one of two directions at a time, herein called direction one and direction two; and said control means further operates during said first phase to cause said adjustable impedance to be a relatively high impedance for said secondary current flowing in said direction one thereby causing the induction level of said magnetic body to transition to said determinate induction level.

26. The apparatus of claim 25 wherein said magnetic body is a saturable magnetic body, and said determinate induction level is approximately the saturation level of said magnetic body.

27. The apparatus of claim 25 wherein said determinate induction level is calculated from the magnitude of said alternating current and known characteristics of said magnetic body.

28. The apparatus of claim 24 wherein said secondary winding conducts said secondary current in one of two directions at a time, herein called direction one and direction two; said control means further operates during said first phase to cause said adjustable impedance to be a relatively high impedance for said secondary current flowing in said direction one and said direction two so as to cause said induced voltage to be an alternating induced voltage; said secondary current and said alternating induced voltage each having various characteristics herein referred to in general as wave parameters; said control means further sensing one or more of said wave parameters and utilizing said wave parameters to determine said determinate induction level.

29. The apparatus of claim 28 wherein said determinate induction level is the induction level at the end of a positive or negative half-cycle of said alternating induced voltage, and said control means further operates during said first phase to determine said determinate induction level by determining the magnitude of a second volt-time value; said second volt-time value being equal to the value of the volt-time integral of a positive or negative half-cycle of said alternating induced voltage divided by two; said control means further operating to begin said second phase at the end of a positive or negative half-cycle of said alternating induced voltage.

30. The apparatus of claim 29 wherein said wave parameters that said control means senses comprise one or more characteristics of said alternating induced voltage, thereby enabling determination of said volt-time integral and said second volt-time value.

31. The apparatus of claim 29 wherein said wave parameters that said control means senses comprise one or more characteristics of said secondary current; said control means utilizing said characteristics of said secondary current and known characteristics of said adjustable impedance to determine characteristics of said alternating induced voltage, thereby enabling determination of said volt-time integral and said second volt-time value.

32. The apparatus of claim 24 wherein said induced voltage during said second phase is entirely of one polarity.

33. The apparatus of claim 24 wherein said induced voltage during said second phase sequentially comprises a first voltage and a second voltage of opposite polarities; said first voltage having such magnitude, duration and polarity so as to cause the induction level of said magnetic body to transition to and pass said preferred induction level; said second voltage having such magnitude, duration and polarity so as to cause said magnetic body to transition to said preferred induction level.

34. The apparatus of claim 24 wherein said induced voltage during said second phase comprises a plurality of sequential voltage pulses of varying form, magnitude, duration, and polarity; the integral of said induced voltage over a time period that includes all said voltage pulses being approximately equal to said volt-time value.

35. The apparatus of claim 24 wherein said alternating current is not symmetrical, and said control means further operates during a third phase to control said adjustable impedance so as to cause the average value of the induced voltage of said secondary winding to be near zero, thereby preventing the induction level of said magnetic body from quickly transitioning away from said preferred induction level.

36. Apparatus for establishing a preferred induction level in a magnetic body;
said apparatus comprising an electric energy source connected to a winding; said winding comprising one or more turns of conductive material; said winding being positioned relative to said magnetic body in such a way that said winding magnetically interacts with said magnetic body; said winding conducting a current; a change of induction level in said magnetic body being associated with an induced voltage across said winding; said electric energy source having suitable control means;
said control means operating during a first phase to cause said electric energy source to cause said current to have such waveform, magnitude and duration so as to cause the induction level of said magnetic body to transition to a determinate induction level;
said control means then operating during a second phase to cause said electric energy source to cause said induced voltage to have such waveform, magnitude and duration so that the value of the integral of said induced voltage over time is approximately equal to a volt-time value corresponding to a change in the induction level of said magnetic body from said determinate induction level to said preferred induction level, thereby causing the induction level of said magnetic body to transition from said determinate induction level to said preferred induction level.

37. The apparatus of claim 36 wherein said preferred induction level is an induction level near zero, and said apparatus thereby functions to demagnetize said magnetic body.

38. The apparatus of claim 36 wherein said magnetic body comprises saturable magnetic material; said current has sufficient magnitude during said first phase to drive the induction level of said magnetic body to an induction level near saturation; and said determinate induction level is approximately the saturation induction level of said magnetic material.

39. The apparatus of claim 36 wherein said determinate induction level is calculated from known characteristics of both said magnetic body and said current.

40. The apparatus of claim 36 wherein said control means further operates during said first phase to cause said current to be an alternating current and said induced voltage to be an alternating induced voltage; said alternating current and said alternating induced voltage having waveforms and magnitudes that are related by the properties of said magnetic body and said winding; said alternating current and said alternating induced voltage each having various characteristics herein referred to in general as wave parameters; said alternating current causing the induction level of said magnetic body to transition between opposite peak induction levels that are approximately equal in magnitude; said control means further sensing one or more of said wave parameters and utilizing said wave parameters to determine said determinate induction level.

41. The apparatus of claim 40 wherein said determinate induction level is the induction level at the end of a positive or negative half-cycle of said alternating induced voltage, and said control means further operates during said first phase to determine said determinate induction level by determining the magnitude of a second volt-time value; said second volt-time value being approximately equal to the value of the volt-time integral of a positive or negative half-cycle of said alternating induced voltage divided by two; said control means further operating to begin said second phase at the end of a positive or negative half-cycle of said alternating induced voltage.

42. The apparatus of claim 36 wherein said induced voltage during said second phase is entirely of one polarity.

43. The apparatus of claim 36 wherein said induced voltage during said second phase sequentially comprises a first voltage and a second voltage of opposite polarities; said first voltage having such magnitude, duration and polarity so as to cause the induction level of said magnetic body to transition to and pass said preferred induction level; said second voltage having such magnitude, duration and polarity so as to cause the induction level of said magnetic body to transition to said preferred induction level.

44. The apparatus of claim 36 wherein said induced voltage during said second phase comprises a plurality of sequential voltage pulses of varying form, magnitude, duration, and polarity; the integral of said induced voltage over a time period that includes all said voltage pulses being approximately equal to said volt-time value.

45. The apparatus of claim 36 wherein said electric energy source comprises an alternating electric energy source and a switching means; said switching means and said alternating electric energy source and said winding being connected in such a way as to cause an alternating induced voltage across said winding when said switching means is closed; said alternating induced voltage comprising sequential positive and negative half-cycles; said control means further operating to keep said switching means closed during said first phase; the induction level of said magnetic body transitioning between opposite peak induction levels over the time period of a single half-cycle of said alternating induced voltage; said opposite peak induction levels having approximately equal magnitudes; said second phase starting at a point of time at the beginning of a half-cycle of said alternating induced voltage with said switching means still closed; said determinate induction level at the beginning of said second phase being an induction level corresponding to a volt-time value approximately equal to one-half of the volt-time integral of a half-cycle of said alternating induced voltage; said control means further operating to open said switching means during said second phase at such a point of time during a half-cycle of said alternating induced voltage that the volt-time integral of the half-cycle up to said point of time approximately equals the volt-time value corresponding to a change of induction level from said determinate induction level at the beginning of the half-cycle to said preferred induction level, thereby causing said magnetic body to have an induction level near said preferred induction level.

46. The apparatus of claim 36 wherein said magnetic body further interacts with a second winding, herein referred to as a primary winding; said primary winding comprising one or more turns of conductive material; said primary winding being positioned relative to said magnetic body in such a way that said primary winding magnetically interacts with said magnetic body; said primary winding conducting a primary current; said control means further operating during a third phase to control said electric energy source so as to allow said current to flow freely, said current being approximately proportional to said primary current during said third phase.

47. The apparatus of claim 46 wherein said primary current is not symmetrical, and said control means further operates during said third phase to control said electric energy source so as to cause the average value of said induced voltage over time to be near zero, thereby preventing the induction level of said magnetic body from quickly transitioning away from said preferred induction level.

48. The apparatus of claim 46 wherein during said third phase said energy source is controlled in such a way as to produce a voltage that counteracts the voltage drop caused by said current flowing through loop resistance, thereby reducing the magnitude of said induced voltage during said third phase, thereby making said current a more accurate representation of said primary current during said third phase.

49. Apparatus for establishing a preferred induction level in a magnetic body;
said apparatus comprising an electric energy source connected to a winding; said winding comprising one or more turns of conductive material; said winding being positioned relative to said magnetic body in such a way that said winding magnetically interacts with said magnetic body; said electric energy source having suitable control means;
said control means operating to cause said electric energy source to cause an alternating current to flow in said winding; said alternating current causing the induction level of said magnetic body to transition between opposite peak induction levels that are approximately equal in magnitude; said alternating current being associated with an alternating induced voltage across said winding; said alternating current and said alternating induced voltage having waveforms and magnitudes that are related by the properties of said magnetic body and said winding; the induction level of said magnetic body transitioning between opposite peak induction levels over the time period of a single half-cycle of said alternating induced voltage; the magnitude of said peak induction levels corresponding to a volt-time value approximately equal to one-half of the volt-time integral of a half-cycle of said alternating induced voltage; said control means operating to turn said electric energy source off at a point of time during a half-cycle of said alternating induced voltage such that the final induction level is near said preferred induction level.

50. The apparatus of claim 49 wherein said point of time is near the geometric middle of a half-cycle of said alternating induced voltage thereby establishing a preferred induction level near zero; said apparatus thereby functioning to demagnetize said magnetic body.

51. The apparatus of claim 49 wherein said control means further controls said alternating current and said alternating induced voltage in such a way that said peak induction levels have a magnitude approximately equal to, or somewhat greater than, the magnitude of said preferred induction level; said control means operating to turn said electric energy source off within a window of time approximately between the end of a half-cycle of said alternating induced voltage and the end of a corresponding half-cycle of said alternating current, thereby establishing an induction level in said magnetic body near said preferred induction level.

52. The apparatus of claim 51 wherein the polarity of said final induction level is determined by the polarity of the half-cycle of said alternating induced voltage just prior to said window of time.

53. Apparatus for providing a secondary current that is approximately proportional to a primary current;
said apparatus comprising a current transformer and an electric energy source; said primary current flowing in a conductor configured as a primary winding of said current transformer; said electric energy source having suitable control means; said current transformer comprising a magnetic core and a secondary winding; said secondary current flowing in said secondary winding; a change of induction level in said magnetic core being associated with an induced voltage across said secondary winding; said electric energy source being connected to said secondary winding;
said control means operating during a first mode to cause said electric energy source to produce an output having such waveform, magnitude and duration so as to cause the induction level of said magnetic core to transition to a preferred induction level;
said control means then operating during a second mode to cause said electric energy source to provide a voltage that allows said secondary current to flow freely; said secondary current being approximately proportional to said primary current during said second mode.

54. The apparatus of claim 53 wherein said primary current is a d-c current.

55. The apparatus of claim 53 further comprising a means to sense secondary current connected in series with said secondary winding and said electric energy source; said means to sense secondary current providing an information signal to a system that monitors said primary current.

56. The apparatus of claim 55 wherein said means to sense said secondary current is a resistor connected in series with said secondary current; the voltage across said resistor being approximately proportional to said primary current during said second mode; said voltage across said resistor further being said information signal to said system that monitors said primary current.

57. The apparatus of claim 53 wherein said first mode comprises two sequential phases, herein referred to as a first phase and a second phase;

said control means operating during said first phase to cause said electric energy source to cause said secondary current to have such waveform, magnitude and duration so as to cause the induction level of said magnetic core to transition to a determinate induction level;

said control means then operating during said second phase to cause said electric energy source to cause said induced voltage to have such waveform, magnitude and duration so that the value of the integral of said induced voltage over time is approximately equal to a volt-time value corresponding to a change in the induction level of said magnetic core from said determinate induction level to said preferred induction level, thereby causing the induction level of said magnetic core to transition from said determinate induction level to said preferred induction level.

58. The apparatus of claim 53 wherein said primary current is not symmetrical, and said control means further operates during said second mode to control said electric energy source so as to cause the average value of said induced voltage to be near zero, thereby preventing the induction level of said magnetic core from quickly transitioning away from said preferred induction level.

59. The apparatus of claim 53 wherein during said second mode said voltage produced by said electric energy source is controlled in such a way as to counteract the voltage drop caused by said secondary current flowing through loop resistance, thereby reducing the magnitude of said induced voltage, thereby making said secondary current a more accurate representation of said primary current during said second mode.

60. A burden-reducing circuit for reducing the effective burden of a current transformer secondary circuit; said current transformer comprising a magnetic core and a secondary winding; a primary current flowing in a conductor configured as a primary winding of said current transformer; said secondary winding conducting a secondary current that is approximately proportional to said primary current; said secondary circuit comprising said secondary winding and any components connected to said secondary winding in such a way that said secondary current flows through said components; the flow of said secondary current being associated with an induced voltage across said secondary winding; said effective burden being approximately proportional to the magnitude of said induced voltage divided by the magnitude of said secondary current; said burden-reducing circuit comprising a voltage source connected in series with said secondary circuit; said voltage source having suitable control means; said control means operating to cause said voltage source to produce voltage that causes the magnitude of said induced voltage to be reduced, thereby reducing the effective burden of said secondary circuit.

61. The burden-reducing circuit of claim 60 wherein said control means receives an information signal from a current-sensing means; said current-sensing means being connected so as to sense said secondary current; said control means operating to cause said voltage source to produce voltage with magnitude approximately equal to the magnitude of said secondary current multiplied by the loop resistance of said secondary circuit, and with polarity so as to facilitate the flow of said secondary current, thereby reducing the effective burden of said secondary circuit.

62. The burden-reducing circuit of claim 60 further comprising a third winding; said third winding being positioned in such a way as to magnetically interact with said magnetic core; a second induced voltage being present across said third winding; said second induced voltage being proportional to said induced voltage; said third winding being connected to said control means; said control means sensing said second induced voltage and operating to cause said voltage source to produce voltage that causes the magnitudes of said induced voltage and said second induced voltage to be reduced, thereby reducing the effective burden of said secondary circuit.

* * * * *

UNITED STATES PATENT AND TRADEMARK OFFICE
CERTIFICATE OF CORRECTION

PATENT NO. : 6,160,697
DATED : December 12, 2000
INVENTOR(S) : Thomas G. Edel

It is certified that error appears in the above-identified patent and that said Letters Patent is hereby corrected as shown below:

Column 5,
Line 24, change "demagnetizing" to -- demagnetize --.

Column 13,
Line 55, change "also may also" to -- also may --.

Column 14,
Line 26, change "is the not" to -- is not --.

Column 16,
Line 28, change "a, current" to -- a current --.

Column 17,
Line 61, change "noted, that" to -- noted that --.

Column 24,
Line 32, change "control circuit 60" to -- control circuit 62 --.

Column 25,
Line 56, change "sequences," to -- Preferred Sequences, --.

Column 27,
Line 62, change "half-cycle alternating" to -- half-cycle of alternating --.

Column 30,
Line 22, change "hive" to -- have --.

Column 31,
Line 29, change "some time" to -- sometime --.

Column 33,
Line 57, change "FIG. 13 Resistor" to -- FIG. 13. Resistor --.

Column 39,
Line 6, change "phase in includes" to -- phase includes --.
Line 13, change "magnet c" to -- magnetic --.

UNITED STATES PATENT AND TRADEMARK OFFICE
CERTIFICATE OF CORRECTION

PATENT NO.    : 6,160,697
DATED         : December 12, 2000
INVENTOR(S)   : Thomas G. Edel It is certified that error appears in the above-identified patent and that said Letters Patent is hereby corrected as shown below:

Column 43,
Line 40, change "related hysteresis" to -- related to hysteresis --.

Column 44,
Line 35, change "(Control circuit" to -- Control circuit --.

Column 46,
Line 53, change "R84" to -- R82 --.

Column 47,
Line 2, change "R84" to -- R82 --.

Column 50,
Line 59, within claim 13, change "said magnetic winding" to -- said magnetic body --.

Signed and Sealed this

Twenty-fifth Day of June, 2002

Attest:

JAMES E. ROGAN
Attesting Officer    Director of the United States Patent and Trademark Office